(12) United States Patent
Park et al.

(10) Patent No.: US 9,287,265 B2
(45) Date of Patent: Mar. 15, 2016

(54) SEMICONDUCTOR DEVICE AND METHOD FOR FABRICATING THE SAME

(71) Applicant: Samsung Electronics Co., Ltd., Suwon-si (KR)

(72) Inventors: Jong-Kook Park, Seoul (KR); Hongsoo Kim, Seongnam-si (KR); Won-Chul Jang, Yongin-si (KR)

(73) Assignee: SAMSUNG ELECTRONICS CO., LTD., Yeongtong-gu, Suwon-si Gyeonggi-do (KR)

( * ) Notice: Subject to any disclaimer, the term of this patent is extended or adjusted under 35 U.S.C. 154(b) by 0 days.

(21) Appl. No.: 14/295,333

(22) Filed: Jun. 4, 2014

(65) Prior Publication Data
US 2015/0035065 A1 Feb. 5, 2015

(30) Foreign Application Priority Data
Aug. 30, 2013 (KR) ........................ 10-2013-0104375

(51) Int. Cl.
*H01L 27/105* (2006.01)
*H01L 27/06* (2006.01)
*H01L 23/485* (2006.01)

(52) U.S. Cl.
CPC ............. *H01L 27/105* (2013.01); *H01L 23/485* (2013.01); *H01L 2924/0002* (2013.01)

(58) Field of Classification Search
CPC . H01L 27/105; H01L 23/485; H01L 27/0688; H01L 27/1052; H01L 27/11582; H01L 27/11578; H01L 23/481; H01L 21/76895; H01L 27/11519; H01L 27/11529; H01L 27/11534; H01L 27/11565; H01L 27/1157; H01L 27/11573
See application file for complete search history.

(56) References Cited

U.S. PATENT DOCUMENTS

| 8,115,259 | B2 | 2/2012 | Shim et al. |
| 8,288,816 | B2 | 10/2012 | Komori et al. |
| 8,378,406 | B2 | 2/2013 | Katsumata et al. |
| 2005/0141262 | A1* | 6/2005 | Yamada ................. H01L 21/84 365/149 |
| 2007/0252201 | A1* | 11/2007 | Kito et al. ....................... 257/331 |
| 2008/0073635 | A1* | 3/2008 | Kiyotoshi et al. ................ 257/2 |
| 2008/0173932 | A1* | 7/2008 | Kidoh et al. ................... 257/324 |
| 2009/0212350 | A1* | 8/2009 | Kidoh et al. ................... 257/324 |
| 2009/0224309 | A1* | 9/2009 | Kidoh et al. ................... 257/326 |
| 2009/0267128 | A1* | 10/2009 | Maejima ....................... 257/314 |
| 2010/0207195 | A1* | 8/2010 | Fukuzumi et al. ............ 257/326 |
| 2011/0001178 | A1* | 1/2011 | Iwase et al. .................... 257/315 |
| 2011/0069531 | A1 | 3/2011 | Aburada et al. |
| 2011/0204420 | A1 | 8/2011 | Kim et al. |
| 2012/0007167 | A1 | 1/2012 | Hung et al. |

(Continued)

FOREIGN PATENT DOCUMENTS
KR 10-2011-0095697 A 8/2011

*Primary Examiner* — Jarrett Stark
*Assistant Examiner* — Bitew Dinke
(74) *Attorney, Agent, or Firm* — Muir Patent Law, PLLC

(57) ABSTRACT

A semiconductor device includes a substrate with an active region defined by a device isolation layer. A word line extends over the active region in a first direction, and a plurality of interconnections extends over the word line in a second direction perpendicular to the first direction. A contact pad is disposed between and spaced apart from the word line and the plurality of interconnections, extending in the first direction to overlap the plurality of interconnections and the active region when viewed from a plan view. A lower contact plug electrically connects the contact pad to the active region. An upper contact plug electrically connects the contact pad to one of the plurality of interconnections.

19 Claims, 37 Drawing Sheets

(56) References Cited

U.S. PATENT DOCUMENTS

| | | | |
|---|---|---|---|
| 2012/0061744 A1* | 3/2012 | Hwang et al. | 257/324 |
| 2012/0070944 A1* | 3/2012 | Kim et al. | 438/128 |
| 2012/0108048 A1* | 5/2012 | Lim et al. | 438/586 |
| 2012/0199896 A1* | 8/2012 | Noguchi | H01L 27/11524 257/296 |
| 2012/0208347 A1* | 8/2012 | Hwang et al. | 438/430 |
| 2012/0241843 A1 | 9/2012 | Iino et al. | |
| 2012/0280304 A1 | 11/2012 | Lee et al. | |
| 2014/0021632 A1* | 1/2014 | Lee et al. | 257/774 |
| 2014/0029339 A1* | 1/2014 | Sakamoto | G11C 16/0483 365/185.05 |
| 2015/0084204 A1* | 3/2015 | Yun | H01L 23/481 257/773 |

* cited by examiner

SEMICONDUCTOR DEVICE AND METHOD FOR FABRICATING THE SAME

CROSS-REFERENCE TO RELATED APPLICATION

This application claims priority under 35 U.S.C. §119 to Korean Patent Application No. 10-2013-0104375, filed on Aug. 30, 2013, in the Korean Intellectual Property Office, the disclosure of which is hereby incorporated by reference in its entirety.

BACKGROUND

This disclosure relates to semiconductor devices and methods for fabricating the same and, more particularly, to three-dimensional semiconductor devices with improved reliability and degree (or density) of integration, and methods for fabricating the same.

Semiconductor devices generally are becoming more highly integrated in order to provide higher performance and lower costs. Integration density of semiconductor devices is a factor that influences the costs of the semiconductor devices. In general, a high integration density or degree of integration (integration degree) of semiconductor devices is demanded. The degree of integration of a conventional two-dimensional (2D) or planar memory device is mainly determined by the area a unit memory cell occupies. Therefore, the integration density of the conventional 2D memory device is greatly affected by the capability of techniques of forming fine patterns. Extremely high-priced equipment is needed in order to form fine patterns, and while the integration density of 2D memory devices continues to increase, there are technical and economic considerations.

SUMMARY

Embodiments disclosed herein provide for semiconductor devices with improved reliability and integration density.

Embodiments also provide a method for fabricating a semiconductor device having improved reliability and integration density.

In one aspect, a semiconductor device may include a substrate including an active region defined by a device isolation layer, a word line extending over the active in a first direction, a plurality of interconnections extending over the word line in a second direction perpendicular to the first direction a contact pad extending in the first direction, a contact pad, and upper and lower contact plugs. The contact pad is disposed between and spaced apart from the word line and the plurality of interconnections, and extends in the first direction to overlap the plurality of interconnections and the active region when viewed from a plan view. The lower contact plug electrically connects the contact pad to the active region. The upper contact plug electrically connects the contact pad to one of the plurality of interconnections.

In some embodiments, a length of the contact pad in the first direction may be greater than a width of the active region in the first direction.

In some embodiments, the upper contact plug may be laterally spaced apart from the lower contact plug when viewed from a plan view.

In some embodiments, the lower contact plug may be spaced apart from the device isolation layer and may be disposed in the active region when viewed from a plan view.

In some embodiments, a minimum width of the contact pad may be greater than a maximum width of the lower contact plug. A width of the contact pad in the second direction may be greater than a width of the lower contact plug in the second direction.

In some embodiments, each of the plurality of interconnections may overlap with the active region when viewed from a plan view. One of the plurality of interconnections may overlap an edge of the active region extending in the second direction when viewed from a plan view.

In some embodiments, a width of the active region may be greater than a pitch of the interconnections. The active region width may be greater than or less than twice the pitch of the interconnections in various embodiments.

In some embodiments, the semiconductor device may further include: a gate contact pad disposed between the height of the top surface of the word line and the height of the bottom surfaces of the interconnections in a vertical view, the gate contact pad extending in the first direction; a gate lower contact plug electrically connecting the word line to the gate contact pad; and a gate upper contact plug electrically connecting the gate contact pad to one of the plurality of interconnections.

In another aspect, a semiconductor device may include, a substrate including a cell array region with a cell array structure, a peripheral circuit region with a peripheral logic structure, a plurality of interconnections, a contact pad, a lower contact plug, and an upper contact plug. The cell array structure has a first height above the substrate and the peripheral logic structure has a second height smaller than the first height. The plurality of interconnections is disposed over the peripheral logic structure and extends over the cell array structure. The contact pad is disposed between a top surface of the peripheral logic structure and bottom surfaces of the plurality of interconnections, and it overlaps with portions of the plurality of interconnections when viewed from a plan view. The lower contact plug electrically connects the peripheral logic structure to the contact pad. The upper contact plug electrically connecting the contact pad to one of the plurality of interconnections.

In some embodiments, the cell array structure may include a stack structure including a plurality of stacked electrodes and a vertical structure penetrating the electrodes.

In some embodiments, a bottom surface of the contact pad may be disposed between a height of a top surface of the vertical structure and a height of a top surface of the peripheral logic structure. In some embodiments, a top surface of the contact pad may be substantially coplanar with a top surface of the vertical structure.

In some embodiments, the substrate may include a device isolation layer defining an active region in the peripheral circuit region. The peripheral circuit region may include: a transistor gate signal line extending in a first direction over the active region and source and drain regions on opposite sides of the peripheral word line. The lower contact plug may be connected to either the source or drain region.

In some embodiments, the plurality of interconnections may extend in a second direction perpendicular to the first direction, and the contact pad may extend in the first direction. A length of the contact pad may be greater than a width of the active region in the first direction.

In some embodiments, the plurality of interconnections may overlap with the active region when viewed from a plan view.

In some embodiments, the upper contact plug may be laterally spaced apart from the lower contact plug when viewed from a plan view.

In some embodiments, the lower contact plug may be spaced apart from the device isolation layer and may be disposed in the active region when viewed from a plan view.

In some embodiments, the cell array structure may include a first stack structure including a plurality of first electrodes vertically stacked on the substrate, a second stack structure including a plurality of second electrodes vertically stacked on the first stack structure, and a vertical structure penetrating the first and second stack structures.

In some embodiments, the semiconductor device may further include first plugs disposed in a first contact region between the cell array region and the peripheral circuit region, the first plugs connected to the first electrodes, and second plugs disposed in a second contact region between the cell array region and the first contact region, the second plugs connected to the second electrodes. A vertical height of the contact pad may be smaller than a vertical height of at least one of the plurality of second plugs and greater than a vertical height of at least one other of the plurality of second plugs.

In some embodiments, a top surface of the contact pad may be substantially coplanar with top surfaces of the first and second plugs.

In yet another aspect, a semiconductor device includes a substrate, a transistor structure formed on the substrate including source and drain regions on opposite sides of a transistor gate control signal line, a first insulating layer formed above the transistor structure, a first array of parallel contact pads formed above the insulating layer, and a lower contact plug. The transistor gate control signal line extends in a first direction parallel to the top surface of the substrate. Each contact pad in the first array has a length in the first direction, a width in a second direction perpendicular to the first direction, and a height in a vertical direction perpendicular to the first and second directions. The length is greater than the width and the height is greater than the vertical thickness of the transistor gate control signal line. The lower contact plug electrically connects one of the contact pads of the first array to the source region, the drain region or the transistor gate control signal line.

In some embodiments, the contact pad height may be greater than the thickness of an interconnection. In some embodiments, the contact pad may have a plate-like shape.

In some embodiments, the transistor structure is formed in a first active region in the substrate defined by a device isolation layer, the first active region having a width in the first direction, and the length of each of the contact pads in the array is greater than the width of the first active region.

In some embodiments, the device further includes a second active region in the substrate spaced apart from the first active region in the first direction by a first distance, and a second array of parallel contact pads formed above the second active region. The second array is spaced apart from the first array in the first direction by a second distance that is less than the first distance but otherwise is substantially the same as the first array.

In still another aspect, a method for fabricating a semiconductor device may include: providing a substrate including a cell array region and a peripheral circuit region; forming a peripheral logic structure on the substrate of the peripheral circuit region; forming a cell array structure including a first stack structure and a second stack structure on the substrate of the cell array region, the first stack structure including a plurality of first electrodes stacked on the substrate, and the second stack structure including a plurality of second electrodes stacked on the first stack structure; forming a filling insulating layer covering the peripheral logic structure and the cell array structure; performing a first patterning process on the filling insulating layer to form upper contact holes and a peripheral trench, the upper contact holes exposing portions of the second electrodes, and the peripheral trench having a bottom surface spaced apart from the peripheral logic structure; performing a second patterning process on the filling insulating layer to form lower contact holes and a peripheral contact hole, the lower contact holes exposing portions of the first electrodes, the peripheral contact hole connected to a bottom surface of the peripheral trench, and the peripheral contact hole exposing a portion of the peripheral logic structure; and filling the upper contact holes, the lower contact holes, the peripheral trench and the peripheral contact hole with a conductive material.

In some embodiments, forming the peripheral logic structure may include: forming a device isolation layer in or on the substrate of the peripheral circuit region to define an active region; forming a peripheral word line crossing over the active region and extending in a first direction; and forming a source dopant region and a drain dopant region in the active region at both sides of the peripheral word line. The peripheral contact hole may expose one of the source and drain dopant regions.

In some embodiments, the peripheral trench may extend in the first direction, and a length of the peripheral trench may be greater than a width of the active region in the first direction.

In some embodiments, filling the upper contact holes, the lower contact holes, the peripheral trench and the peripheral contact hole with the conductive material may include: forming first plugs in the lower contact holes, respectively; forming second plugs in the upper contact holes, respectively; forming a lower contact plug in the peripheral contact hole; and forming a contact pad in the peripheral trench. A top surface of the contact pad may be substantially coplanar with top surfaces of the first and second plugs.

In some embodiments, the method may further include: forming a plurality of interconnections disposed over the peripheral logic structure and extending onto the cell array structure after the formation of the lower contact plug and the contact pad. One of the interconnections may be electrically connected to the contact pad.

DETAILED DESCRIPTION OF THE EMBODIMENTS

Figure 1:
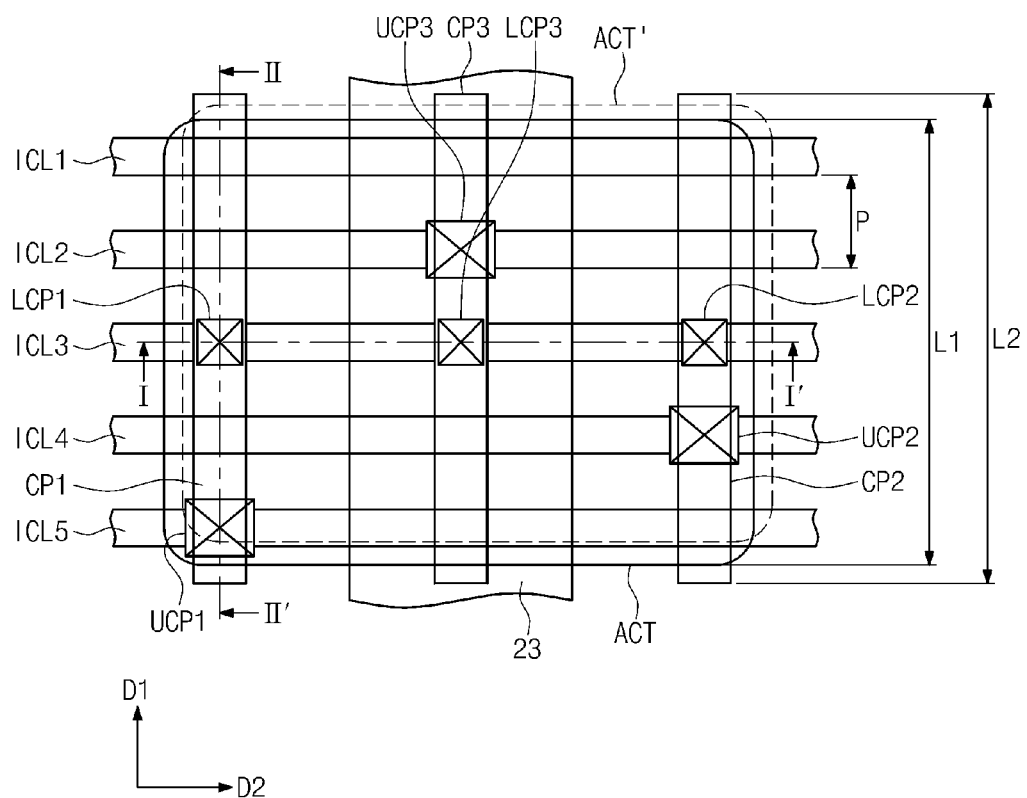
FIG. 1 is a plan view illustrating a portion of a semiconductor device according to some embodiments.

Embodiments will now be described more fully hereinafter with reference to the accompanying drawings, in which exemplary embodiments are shown. The advantages and features and methods of achieving them will be apparent from the following exemplary embodiments. It should be noted, however, that the inventions disclosed and claimed herein are not limited to the following exemplary embodiments, and may be implemented in various forms.

In order to provide a concise description of the embodiments, not all features of an actual implementation may be described in the specification. In the development of any such actual implementation, as in any engineering project, implementation-specific decisions may be made to achieve engineering or design goals, such as compliance with process-related, system-related and business-related constraints, which may vary between implementations. While development and implementation may be complex and time consuming, it nevertheless would be a routine undertaking of design, fabrication, and manufacture for those of ordinary skill having the benefit of this disclosure.

In the drawings, embodiments are not limited to the specific examples provided herein and may be exaggerated for clarity. For example, the size and relative sizes of layers and regions may be exaggerated for clarity. Like numbers refer to like elements throughout.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, any cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Additionally, the embodiments will be described with views that are idealized exemplary views. Accordingly, shapes of the exemplary views may be modified according to manufacturing techniques and/or tolerances. Implementations are not limited to the specific shape illustrated in the exemplary views, but may include other shapes that may be created according to manufacturing processes. Variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are typically schematic in nature and their shapes are not necessarily intended to illustrate the actual shape of a region of a device and are not intended to limit the scope of example embodiments.

It will be also understood that although the terms first, second, third, etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments explained and illustrated herein include their complementary counterparts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
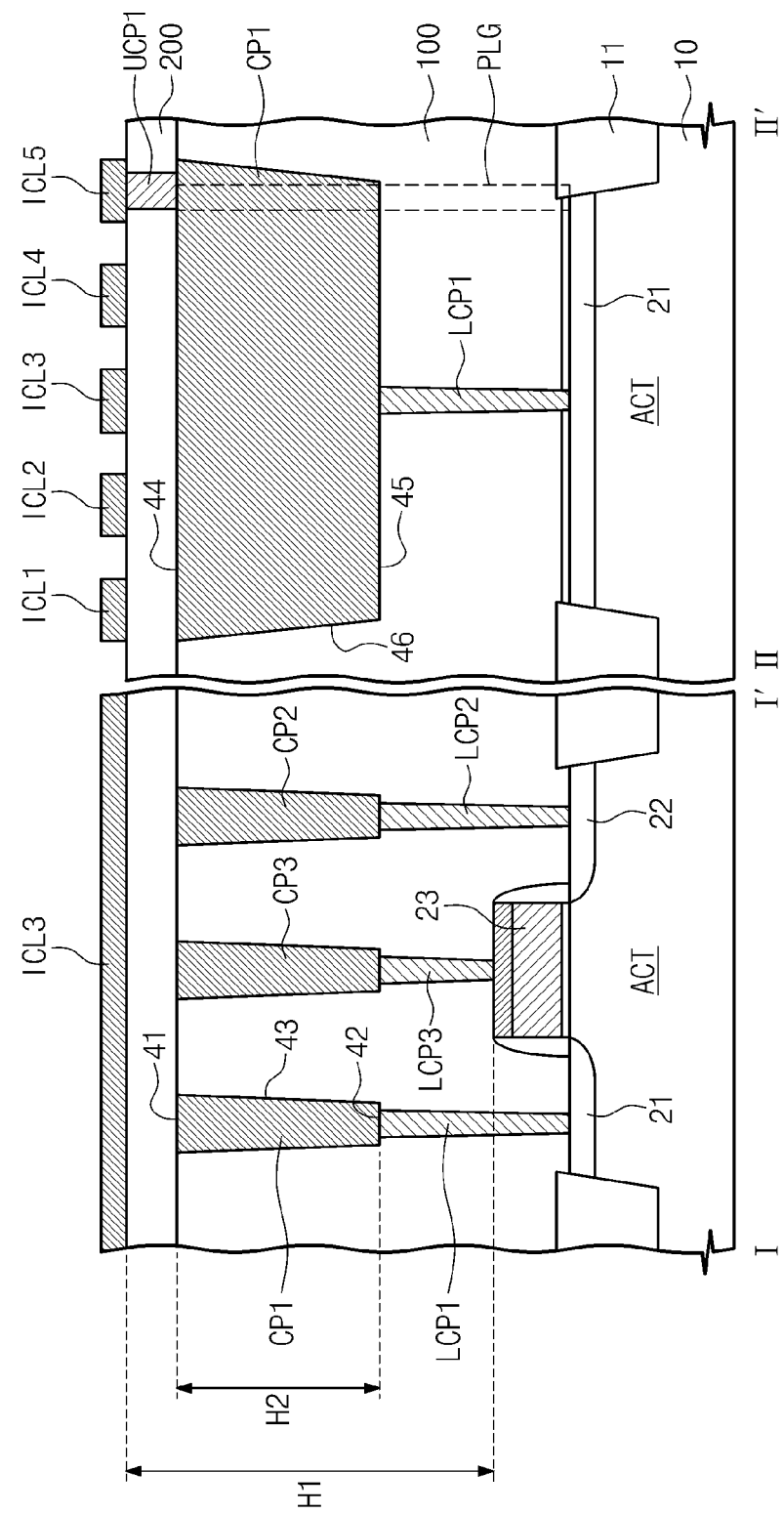
FIG. 2 is a cross-sectional view of the embodiment of FIG. 1 taken along lines I-I' and II-II'.

FIG. 1 is a plan view illustrating a portion of a semiconductor device according to some embodiments. FIG. 2 is a cross-sectional view taken along lines I-I' and II-II' of FIG. 1, and FIG. 3 is a perspective view.

Figure 3:
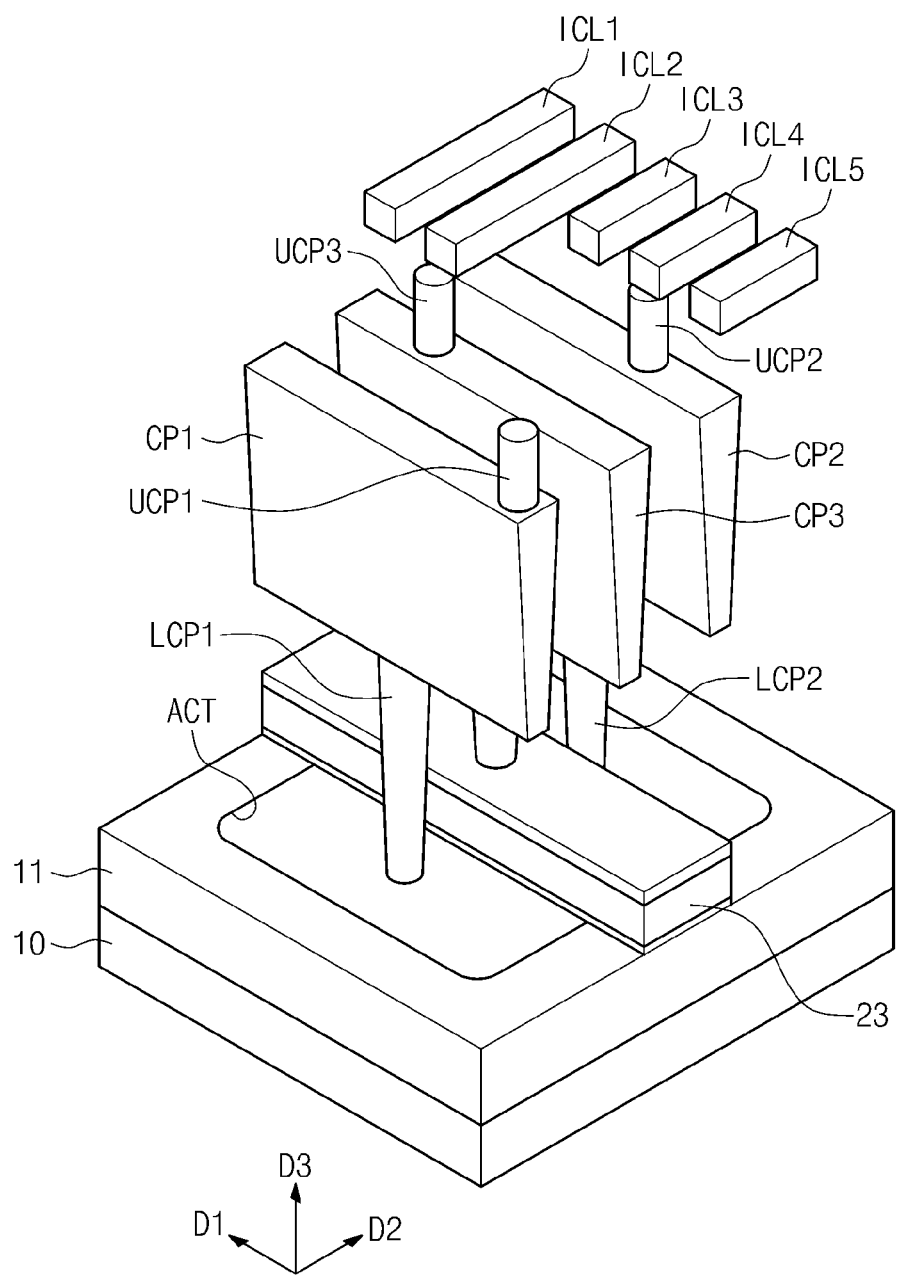
FIG. 3 is a perspective view illustrating portions of the embodiment shown in FIGS. 1 and 2.

Referring to FIGS. 1, 2 and 3, a gate electrode 23 may be disposed on a semiconductor substrate 10 including an active region ACT defined by a device isolation layer 11.

The semiconductor substrate 10 may, for example, be a bulk silicon substrate, a silicon-on-insulator (SOI) substrate, a germanium substrate, a germanium-on-insulator (GOI) substrate, a silicon-germanium substrate, or a substrate including an epitaxial layer obtained by performing a selective epitaxial growth (SEG) process.

A trench may be formed in the semiconductor substrate 10 and then may be filled with an insulating material, thereby forming the device isolation layer 11. The device isolation layer 11 may include materials such as an oxide, a nitride, and/or an oxynitride. The active region ACT may be a portion of the semiconductor substrate 10. The active region ACT may include a dopant well (not shown) doped with n-type or p-type dopants.

The gate electrode 23, which is an example of a transistor gate control signal line, and may form a word line, may be formed on the semiconductor substrate 10 with a gate insulating layer therebetween. The gate electrode 23 crosses over the active region ACT and extends in a first direction D1 parallel to the top surface of the substrate 10. The gate electrode 23 may include or be a doped poly-silicon line or formed from a conductive material, e.g., having a work function higher than that of doped poly-silicon. For example, a conductive material having a suitably high work function may include one or more of a metal (e.g., tungsten and/or molybdenum), a conductive metal nitride (e.g., titanium nitride, tantalum nitride, tungsten nitride, and/or titanium-aluminum nitride), and a metal silicide (e.g., tungsten silicide). The gate insulating layer may include an oxide, a nitride, an oxynitride, and/or a high-k dielectric material (e.g., an insulating metal oxide such as hafnium oxide and/or aluminum oxide).

Source and drain dopant regions 21 and 22 may be formed in the active region ACT at the sides of the gate electrode 23. The source and drain dopant regions 21 and 22 may be doped with dopants of a different conductivity type from dopants of the active region ACT.

A plurality of interconnections ICL1 to ICL5 may be disposed above the gate electrode 23. The plurality of interconnections ICL1 to ICL5 extend in parallel to each other in a second direction D2 perpendicular to the first direction D1. In some embodiments, portions of first to fifth interconnections ICL1 to ICL5 may be disposed to overlap with the active region ACT when viewed from a plan view. The first to fifth interconnections ICL1 to ICL5 may be disposed over the gate electrode 23 with the same interval. The pitch P (i.e., a sum of a width of one interconnection and a distance between two interconnections) of the first to fifth interconnections ICL1 to ICL5, which illustratively are equally spaced, is less than the width L1 of the active region ACT.

First, second and third contact pads CP1, CP2 and CP3 are disposed between a height above the substrate of the top surface of the gate electrode 23 and a height above the substrate of the bottom surfaces of the plurality of interconnections ICL1 to ICL5 as best seen in the vertical view of FIG. 2. The first to third contact pads CP1, CP2 and CP3 extend in the first direction D1 and are laterally spaced apart from each other in the second direction D2. The first to third contact pads CP1, CP2 and CP3 may be disposed at the same height from a top surface of the semiconductor substrate 10. Top surfaces of the first to third contact pads CP1, CP2 and CP3 may be substantially coplanar with each other. The first to third contact pads CP1, CP2 and CP3 are disposed over the active region ACT. The length L2 of the first to third contact pads CP1, CP2 and CP3 in the first direction D1 in the embodiment of FIGS. 1-3 is greater than the width L1 of the active region ACT in the first direction D1. Contact pads CP1, CP2 and CP3 may be thicker than signal routing lines such as gate electrode 23 or interconnections such as ICL1 or ICL5. Each of the first to third contact pads CP1, CP2 and CP3 illustratively has a plate-like shape and may have a lower width less than its upper width and/or a lower length less than its upper length, which may provide for sloped sidewalls as shown in FIGS. 2 and 3. To form the contact pads, peripheral trenches may be formed in the interlayer insulating layer 100 and then a conductive layer may be formed to fill the peripheral trenches. In various embodiments, the conductive layer is planarized until the interlayer insulating layer is exposed, thereby forming the first to third contact pads CP1, CP2 and CP3 in the peripheral trenches.

In some embodiments, the first contact pad CP1 may be electrically connected to a source dopant region 21 through a first lower contact plug LCP1. The second contact pad CP2 may be electrically connected to a drain dopant region 22 through a second lower contact plug LCP2. The third contact pad CP3 may be electrically connected to the gate electrode 23 through a third lower contact plug LCP3.

According to some embodiments, the first and second lower contact plugs LCP1 and LCP2 may be disposed in the active area ACT to be spaced apart from the device isolation layer 11. The first to third lower contact plugs LCP1, LCP2 and LCP3 may be disposed in the active region ACT regardless of positions of the first to fifth interconnections ICL1 to ICL5. The first to third lower contact plugs LCP1, LCP2 and LCP3 may be spaced apart from each other in the second direction D2. Maximum widths of the first to third lower contact plugs LCP1, LCP2 and LCP3, for example the widths shown in direction D2 in the I-I' region of FIG. 2, may be less than maximum widths of the first to third contact pads CP1, CP2 and CP3, respectively (as illustrated in FIGS. 2 and 3, the contact pads may have sloped sidewalls with the maximum width occurring at the top). Additionally, the maximum widths of the first to third lower contact plugs LCP1, LCP2 and LCP3 may also be less than minimum widths of the first to third contact pads CP1, CP2 and CP3, respectively.

According to some embodiments, the first contact pad CP1 may be electrically connected to at least one of the first to fifth interconnections ICL1 to ICL5 through a first upper contact plug UCP1. For example, the first upper contact plug UCP1 may be electrically connected to the fifth interconnection ICL5 and may be disposed in an overlapping region of the first contact pad CP1 and the fifth interconnection ICL5 when viewed from a plan view. Additionally, the first upper contact plug UCP1 may be laterally spaced apart from the first lower contact plug LCP1 when viewed from a plan view. In other words, from the plan view the first upper contact plug UCP1 may not overlap with the first lower contact plug LCP1. Thus, even though the overlapping region of the first contact pad CP1 and the fifth interconnection ICL5 does not fully overlap with the active region ACT', the fifth interconnection ICL5 may be electrically connected to the source dopant region 21 through the first upper contact plug UCP1, the first contact pad CP1 and the first lower contact plug LCP1. The contact pads can provide for improved electrical connection when an active region such as ACT' may be shifted or misaligned or otherwise different from an idealized active region ACT due to process margins or other factors. As illustrated in FIG. 1, with ACT' offset from ACT in both the D1 and D2 directions, connecting a signal from ICL5 through UCP1, then through CP1, and finally through LCP1 to ACT' compares favorably with the case of connecting directly down from ICL5 to ACT' (in which case there would be only partial overlap between the lower contact plug and the active area ACT').

The second contact pad CP2 may be electrically connected to at least one of the first to fifth interconnections ICL1 to ICL5 through a second upper contact plug UCP2. For example, the second upper contact plug UCP2 may be electrically connected to the fourth interconnection ICL4 and may be disposed in an overlapping region of the second contact pad CP2 and the fourth interconnection ICL4 when viewed from a plan view. Additionally, the second upper contact plug UCP2 may be laterally spaced apart from the second lower contact plug LCP2 when viewed from a plan view. In other words, the second upper contact plug UCP2 may not overlap with the second lower contact plug LCP2.

The third contact pad CP3 may be electrically connected to at least one of the first to fifth interconnections ICL1 to ICL5 through a third upper contact plug UCP3. For example, the third upper contact plug UCP3 may be electrically connected to the second interconnection ICL2 and may be disposed in an overlapping region of the third contact pad CP3 and the second interconnection ICL2 when viewed from a plan view. Additionally, the third upper contact plug UCP3 may be laterally spaced apart from the third lower contact plug LCP3 when viewed from a plan view. In other words, the third upper contact plug UCP3 may not overlap with the third lower contact plug LCP3.

In some embodiments, the first to third contact pads CP1, CP2 and CP3 and the first to third lower contact plugs LCP1, LCP2 and LCP3 may be disposed in a first interlayer insulating layer 100. The first interlayer insulating layer 100 may include an etch stop layer (not shown) disposed in a boundary region between the lower contact plugs LCP1, LCP2 and LCP3 and the contact pads CP1, CP2 and CP3. Bottom surfaces of the first to third contact pads CP1, CP2 and CP3 may be substantially coplanar with each other. The top surfaces of the first to third contact pads CP1, CP2 and CP3 may also be substantially coplanar with each other. The top surfaces of the first to third contact pads CP1, CP2 and CP3 may be covered by a second interlayer insulating layer 200. The first to third upper contact plugs UCP1, UCP2 and UCP3 may be disposed in the second interlayer insulating layer 200. The first to fifth interconnections ICL1 to ICL5 may be disposed on the second interlayer insulating layer 200.

If the first to third contact pads CP1, CP2 and CP3 are omitted, contact plugs may be disposed in overlapping regions of the active region ACT and the first and fifth interconnections ICL1 and ICL5 in order to electrically connect the source and drain dopant regions 21 and 22 to the first and fifth interconnections ICL1 and ICL5 disposed over edge portions of the active region ACT. In this case, the contact plug may be disposed on a boundary portion of the active region ACT and the device isolation layer 11 due to misalignment between the active region ACT and the contact plug. Additionally, a corner portion of the active region ACT may become rounded when the device isolation layer 11 defining the active region ACT is formed. Thus, the area of the active region ACT may be reduced, resulting in a decrease in a formation margin for the contact plug on the corner portion of the active region ACT.

On the contrary, according to embodiments as described herein, the first and second lower contact plugs LCP1 and LCP2 connected to the source and drain dopant regions 21 and 22 may be disposed in the active region ACT regardless of electrical connection relationship between the MOS transistor and the interconnections ICL1 to ICL5. Advantageously, the lower contact plugs LCP1, LCP2 and LCP3 may be placed optimally above their respective target connection locations in the active region ACT regardless of which interconnection ICL1, ICL2, ICL3, ICL4 or ICL5 the contact pads CP1, CP2, CP3 and upper contact plugs UCP1, UCP2 and UCP3 connect them to. Thus, formation process margins may be increased when the first to third lower contact plugs LCP1, LCP2 and LCP3 are formed. Additionally, the first to third upper contact plugs UCP1, UCP2 and UCP3 connected to the interconnections ICL1 to ICL5 may be disposed on the first to third contact pads CP1, CP2 and CP3 having the lengths greater than the width of the active region ACT. Thus, positions of the first to third upper contact plugs UCP1, UCP2 and UCP3 may be freely changed according to the electrical connection relationship between the MOS transistor and the interconnections ICL1 to ICL5. Embodiments therefore allow for minimizing the size of active regions ACT, resulting in increased density and lower costs for semiconductor devices.

Figure 4:
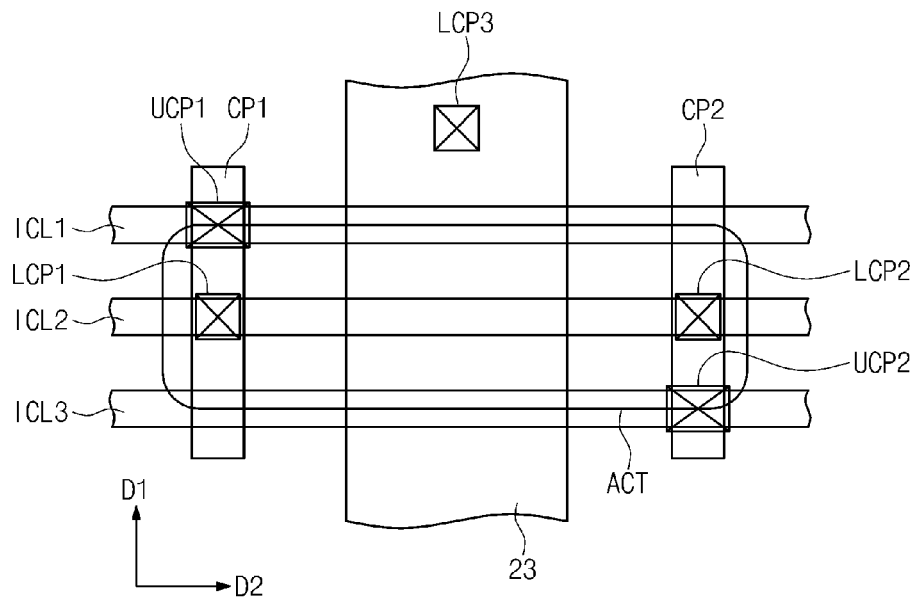
FIGS. 4 and 5 are plan views illustrating features of semiconductor devices according to other embodiments.
Figure 5:
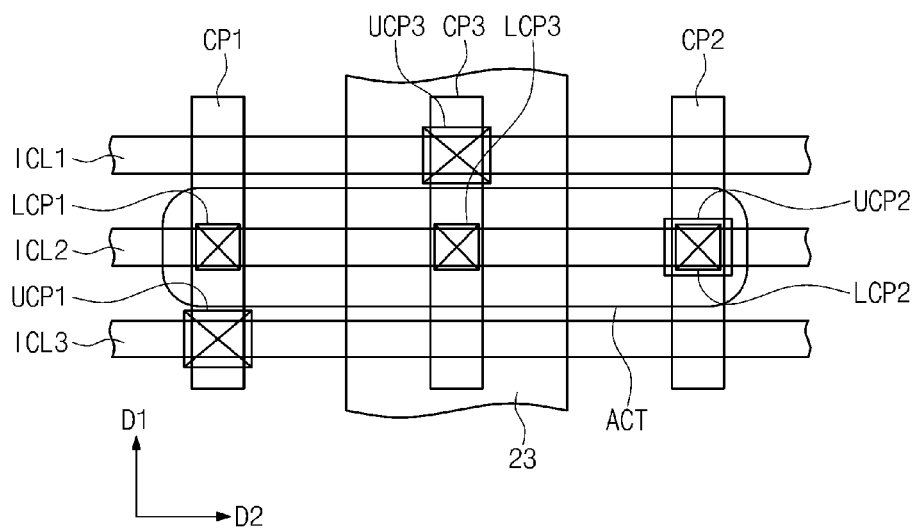

FIGS. 4 and 5 are plan views illustrating semiconductor devices according to other embodiments.

According to the embodiment illustrated in FIG. 4, a gate electrode 23 extending in a first direction D1 may be disposed to cross over an active region ACT of a semiconductor substrate 10. A first lower contact plug LCP1 may be connected to a source dopant region (see 21 of FIG. 2) at a side of the gate electrode 23, and a second lower contact plug LCP2 may be connected to a drain dopant region (see 22 of FIG. 2) at another side of the gate electrode 23. The first and second lower contact plugs LCP1 and LCP2 may be spaced apart from a device isolation layer 11 and may be disposed in the active region ACT when viewed from a plan view. A third lower contact plug LCP3 may be connected to the gate electrode 23. The third lower contact plug LCP3 may not overlap with the active region ACT when viewed from a plan view.

First to third interconnections ICL1 to ICL3 extending in the first direction D1 may be spaced apart from each other in the direction D2 with the same interval relative to the gate electrode 23. In the embodiment illustrated in FIG. 4, the first and third interconnections ICL1 and ICL3 may be disposed to overlap with a boundary portion between the device isolation layer 11 and the active region ACT when viewed from a plan view.

When viewed from a vertical view, first and second contact pads CP1 and CP2 may be disposed between a height of a top surface of the gate electrode 23 and a height of bottom surfaces of the first to third interconnections ICL1 to ICL3. The first and second contact pads CP1 and CP2 may extend in the first direction D1 with a length and placement so they extend under the first to third interconnections ICL1 to ICL3. A length in the first direction D1 of the first and second contact pads CP1 and CP2 may be greater than a width in the first direction D1 of the active region ACT. In some embodiments, the length in the first direction D1 of the first and second contact pads CP1 and CP2 may be greater than twice a pitch of the first to third interconnections ICL1 to ICL3. In other words, the first and second contact pads CP1 and CP2 may overlap with portions of the first to third interconnections ICL1 to ICL3.

The first contact pad CP1 and the first interconnection ICL1 may be electrically connected to each other through a first upper contact plug UCP1. The first upper contact plug UCP1 may be disposed in an overlapping region of the first contact pad CP1 and the first interconnection ICL1 regardless of a position of the first lower contact plug LCP1. The second contact pad CP2 and the third interconnection ICL3 may be electrically connected to each other through a second upper contact plug UCP2. The second upper contact plug UCP2 may be disposed in an overlapping region of the second contact pad CP2 and the third interconnection ICL3 regardless of a position of the second lower contact plug LCP2. Even though the first and second upper contact plugs UCP1 and UCP2 are disposed over the boundary portion of the active region ACT and the device isolation layer 11, the first and third interconnections ICL1 and ICL3 may be electrically connected to the source and drain dopant regions (see 21 and 22 of FIG. 2) through the first and second contact pads CP1 and CP2.

While FIG. 4 illustrates upper contact plugs UCP1 and UCP2 partially overlapping the active region ACT when viewed from a plan view, in alternative embodiments, such as FIG. 5 discussed below, the width of the active region ACT in direction D1 may be small enough that these upper contact plugs may not overlap the active region ACT when viewed from a plan view. FIG. 4 illustrates two contact plugs CP1 and CP2 over the active region ACT and a lower contact plug LCP3 connected to the gate electrode 23 outside of the active region ACT without a corresponding contact pad for lower contact plug LCP3. In various embodiments based on FIG. 4, LCP3 may connect to an interconnection other than ICL1, ICL2 or ICL3, either by extending directly to the interconnection or through a corresponding upper contact plug that connects directly to the lower contact plug LCP3, or a suitable contact pad can be provided between LCP3 and an upper contact plug, or alternatively a contact plug may extend directly down from interconnection ICL2 to gate electrode 23 in lieu of lower contact plug LCP3.

According to an embodiment illustrated in FIG. 5, a gate electrode 23 may be disposed on a semiconductor substrate 10 having an active region ACT defined by a device isolation layer 11. The gate electrodes 23 may extend in a first direction D1, and first to third interconnections ICL1 to ICL3 may be disposed over the gate electrode 23. The first to third interconnections ICL1 to ICL3 may extend in a second direction D2 and may be spaced apart from each other with the same interval. First to third lower contact plugs LCP1, LCP2 and LCP3, first to third contact pads CP1, CP2 and CP3 and first to third upper contact plugs UCP1, UCP2 and UCP3 may be disposed between a height of a top surface of the gate electrode 23 and a height of bottom surfaces of the first to third interconnections ICL1 to ICL3 when viewed from a vertical view.

The first lower contact plug LCP1 may be connected to a source dopant region (see 21 of FIG. 2) at a side of the gate electrode 23, and the second lower contact plug LCP2 may be connected to a drain dopant region (see 22 of FIG. 2) at another side of the gate electrode 23. The first and second lower contact plugs LCP1 and LCP2 may be spaced apart from the device isolation layer 11 and may be disposed in the active region ACT when viewed from a plan view. The third lower contact plug LCP3 may be connected to the gate electrode 23. The third lower contact plug LCP3 may overlap with the active region ACT when viewed from a plan view.

In the present embodiment, the active region ACT has a long axis extending in the second direction D2. The active region ACT may be disposed completely between the first and third interconnections ICL1 and ICL3 when viewed from a plan view. In other words, the first and third interconnections ICL1 and ICL3 may be disposed over the device isolation layer 11 outside the active region ACT.

A length in the first direction D1 of the first to third contact pads CP1, CP2 and CP3 may be greater than a width in the first direction D1 of the active region ACT. The length in the first direction D1 of the first to third contact pads CP1, CP2 and CP3 may be greater than twice a pitch of the first to third interconnections ICL1 to ICL3. In other words, the first to third contact pads CP1, CP2 and CP3 may overlap with portions of the first to third interconnections ICL1 to ICL3.

The first contact pad CP1 and the third interconnection ICL3 may be electrically connected to each other through the first upper contact plug UCP1. The first upper contact plug UCP1 may be disposed in an overlapping region of the first contact pad CP1 and the third interconnection ICL3 regardless of a position of the first lower contact plug LCP1. The second contact pad CP2 and the second interconnection ICL2 may be electrically connected to each other through the second upper contact plug UCP2. The second upper contact plug UCP2 may be disposed in an overlapping region of the second contact pad CP2 and the second interconnection ICL2 regardless of a position of the second lower contact plug LCP2. The third contact pad CP3 and the first interconnection ICL1 may be electrically connected to each other through the third upper contact plug UCP3 regardless of a position of the third lower contact plug LCP3.

According to the present embodiment, the third interconnection ICL3 not overlapping with the active region ACT may be electrically connected to the source dopant region (see 21 of FIG. 2) through the first contact pad CP1. In other words, since the first to third contact pads CP1, CP2 and CP3 having linear shapes are disposed between the active region ACT and the first to third interconnections ICL1 to ICL3, the first and third interconnections ICL1 and ICL3 not overlapping with the active region ACT may be easily connected to the MOS transistor including the gate electrode 23.

While FIG. 5 illustrates three contact pads CP1, CP2 and CP3 that overlap with ICL1, ICL2 and ICL3 when viewed from a plan view, in alternative embodiments having aspects from both the embodiment of FIG. 5 and FIG. 4, contact pad CP3 may be omitted and the contact pads CP1 and CP2 may extend for a length in direction D1 that is less than twice the pitch of the interconnections ICL1, ICL2 and ICL3 so that the contact plugs CP1 and CP2 overlap only two interconnections when viewed from a plan view. For example, in a variation of FIG. 5, with contact plugs CP1 and CP2 shortened to only overlap interconnections ICL2 and ICL3, upper contact plugs UCP1 and UCP2 and lower contact plugs LCP1 and LCP2 may still to connect interconnections ICL2 and ICL3 to the source and drain dopant regions 21 and 22. Interconnection ICL1 may be connected with one or more contact plugs to gate electrode 23 without a corresponding contact pad.

Figure 6:
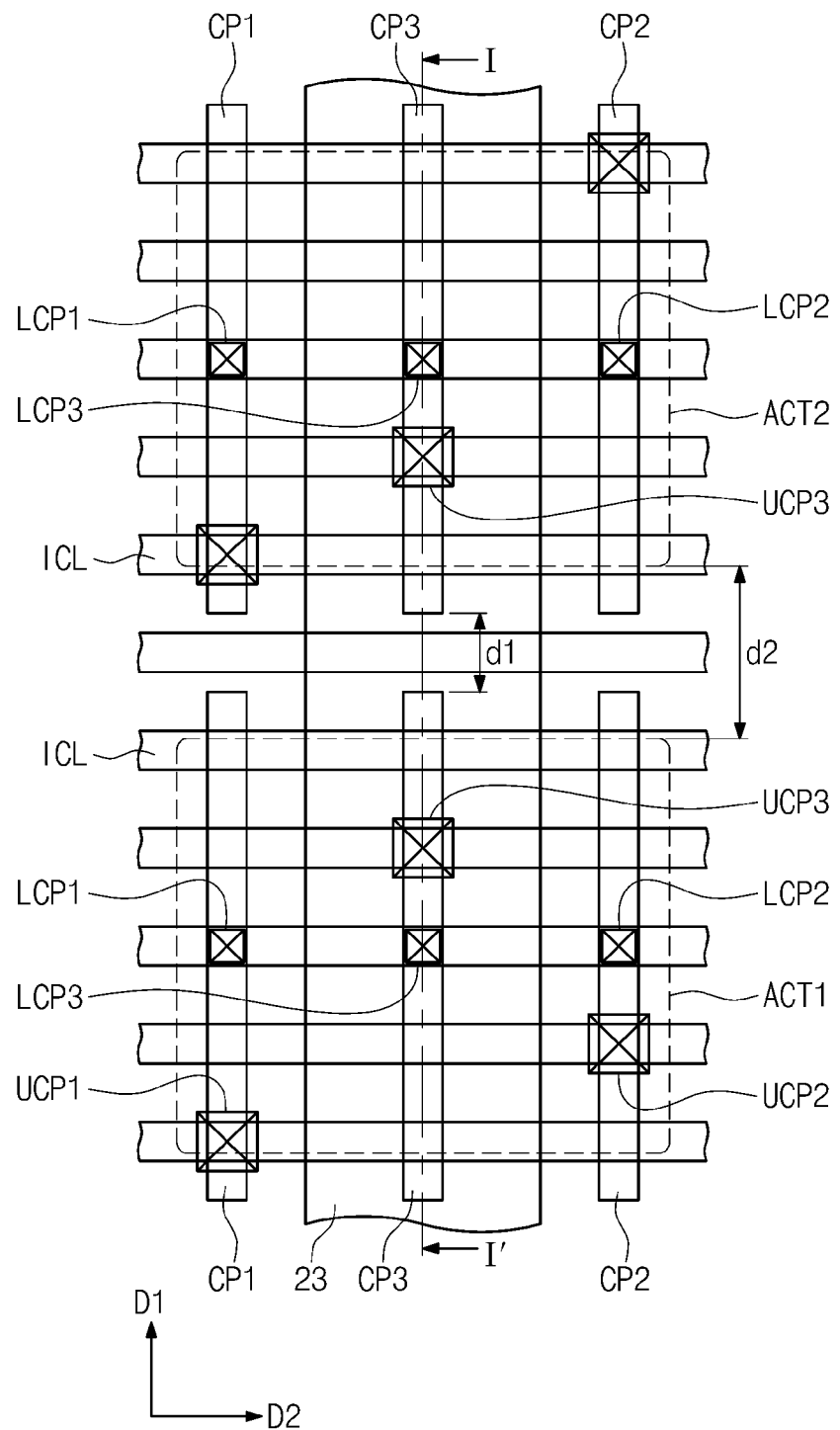
FIG. 6 is a plan view illustrating a portion of a semiconductor device according to still other embodiments.
Figure 7:
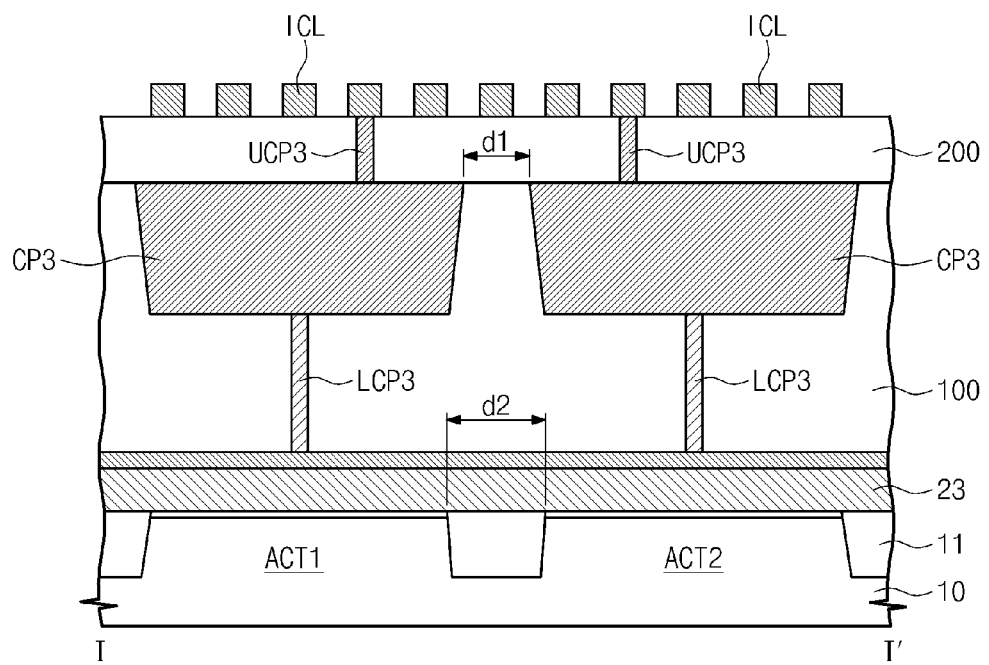
FIG. 7 is a cross-sectional view taken along a line I-I' of FIG. 6.

FIG. 6 is a plan view illustrating still other embodiments, and FIG. 7 is a cross-sectional view taken along a line I-I' of FIG. 6.

Referring to FIGS. 6 and 7, a semiconductor substrate 10 may include first and second active regions ACT1 and ACT2 defined by a device isolation layer 11. The first and second active regions ACT1 and ACT2 are adjacent to each other in a first direction D1.

According to some embodiments, a gate electrode 23 extending in the first direction D1 may cross over the first and second active regions ACT1 and ACT2. Source and drain dopant regions (see 21 and 22 of FIG. 2) may be formed in each of the first and second active regions ACT1 and ACT2 at sides of the gate electrode 23. First and second lower contact plugs LCP1 and LCP2 may be connected to the source and drain dopant regions (see 21 and 22 of FIG. 2), respectively. A third lower contact plug LCP3 may be connected to the gate electrode 23. As described with reference to FIGS. 1 to 3, first to third contact pads CP1, CP2 and CP3 may be disposed on each of the first and second active regions ACT1 and ACT2. A plurality of interconnections ICL extending in parallel along a second direction D2 may be disposed over the first active region ACT1, and another plurality of interconnections ICL extending in parallel along the second direction D2 may be disposed over the second active region ACT2.

According to some embodiments, the contact pads CP1, CP2 and CP3 make up an array of contact pads that are adjacent to each other in the first direction D1 and electrically insulated from each other. A distance d1 between adjacent arrays of contact pads CP1, CP2 or CP3 in the first direction may be smaller than a distance d2 between the first and second active regions ACT1 and ACT2 adjacent to each other in the first direction D1. As discussed above and illustrated in FIG. 7 for contact pads CP3, contact pads may be plate-like and may have sloped sidewalls, which may result in the distance d1 occurring at the top of the contact pads.

Figure 8:
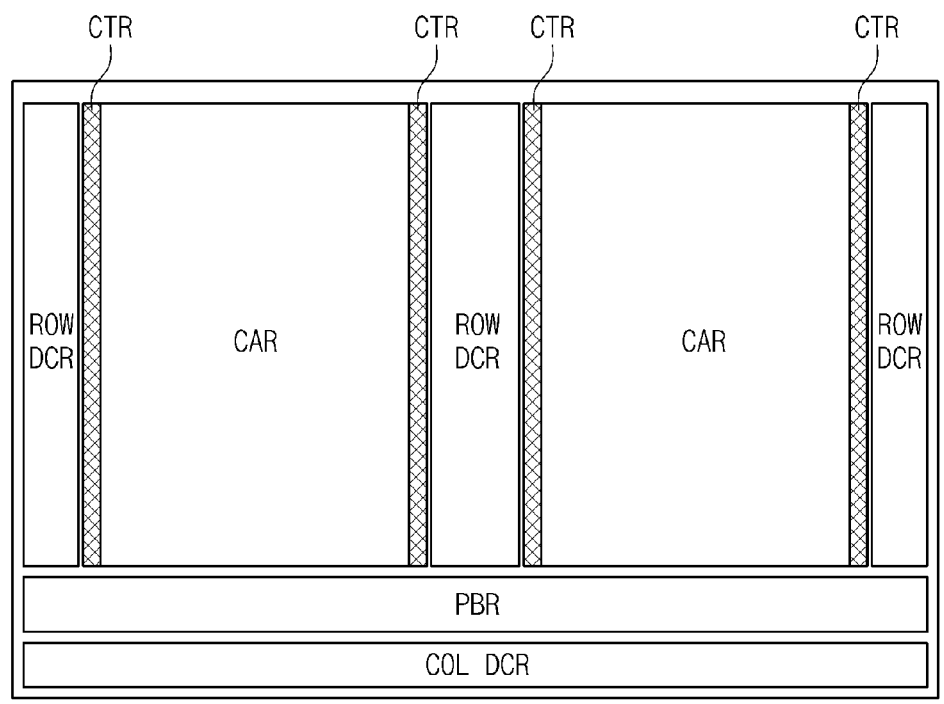
FIG. 8 is a schematic diagram illustrating components of a semiconductor memory device according to some embodiments.
Figure 9:
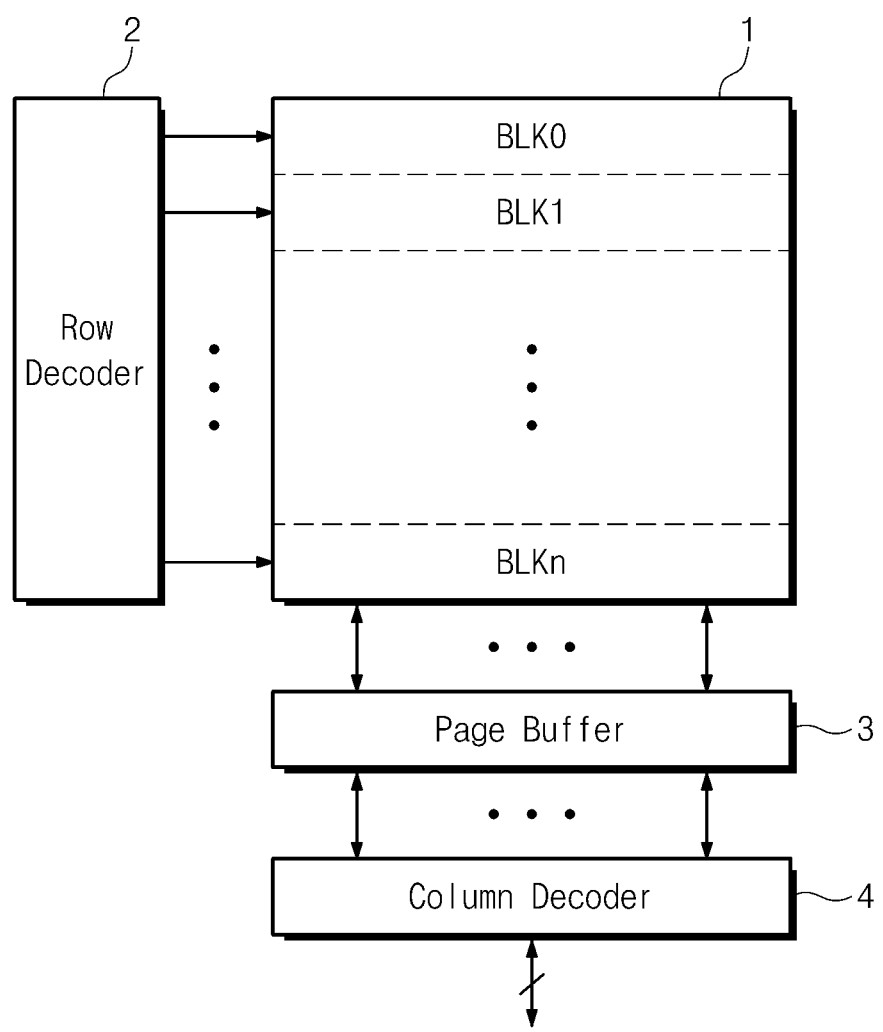
FIG. 9 is a schematic block diagram illustrating a memory cell array embodiment and associated circuitry for embodiments of FIG. 8.

FIG. 8 is a schematic diagram illustrating components of a semiconductor memory device according to some embodiments. FIG. 9 is a schematic block diagram illustrating a memory cell array embodiment and associated circuitry for embodiments of FIG. 8.

Referring to FIG. 8, a semiconductor memory device includes a cell array region CAR and a peripheral circuit region. The peripheral circuit region includes row decoder regions ROW DCR, a page buffer region PBR, and a column decoder region COL DCR. Additionally, a contact region CTR may be disposed between the cell array region CAR and the row decoder region ROW DCR.

Referring to FIGS. 8 and 9, a memory cell array 1 including a plurality of memory cells is disposed in the cell array region CAR. The memory cell array 1 includes the plurality of memory cells and a plurality of word lines and bit lines electrically connected to the memory cells. In some embodiments, the memory cell array 1 may include a plurality of memory blocks BLK0 to BLKn. Each of the memory blocks BLK0 to BLKn may correspond to a data erase unit. The memory cell array 1 will be described in more detail with reference to FIGS. 10A, 10B and 11A to 11D.

A row decoder 2 is disposed in the row decoder region ROW DCR. The row decoder 2 selects the word lines of the memory cell array 1. An interconnection structure may be disposed in the contact region CTR. The interconnection structure electrically connects the memory cell array 1 to the row decoder 2. The row decoder 2 may select one of the memory blocks BLK0 to BLKn of the memory cell array 1 in response to address data and may also select one of the word lines of the selected memory block. The row decoder 2 may respectively provide word line voltages generated from a voltage generating circuit (not shown) to the selected word line and unselected word lines in response to control signals of a control circuit (not shown).

A page buffer 3 for reading data stored in the memory cells may be disposed in the page buffer region PBR. Depending on an operation mode, the page buffer 3 may temporarily store data that will be stored in the memory cells, or may sense the data stored in the memory cells. The page buffer 3 may be operated as a write driver circuit in a program operation mode and may be operated as a sense amplifier in a read operation mode.

A column decoder 4 is disposed in the column decoder region COL DCR. The column decoder 4 is connected to the bit lines of the memory cell array 1. The column decoder 4 may provide a data transfer path between the page buffer 3 and an external device (e.g., a memory controller).

Figure 10A:
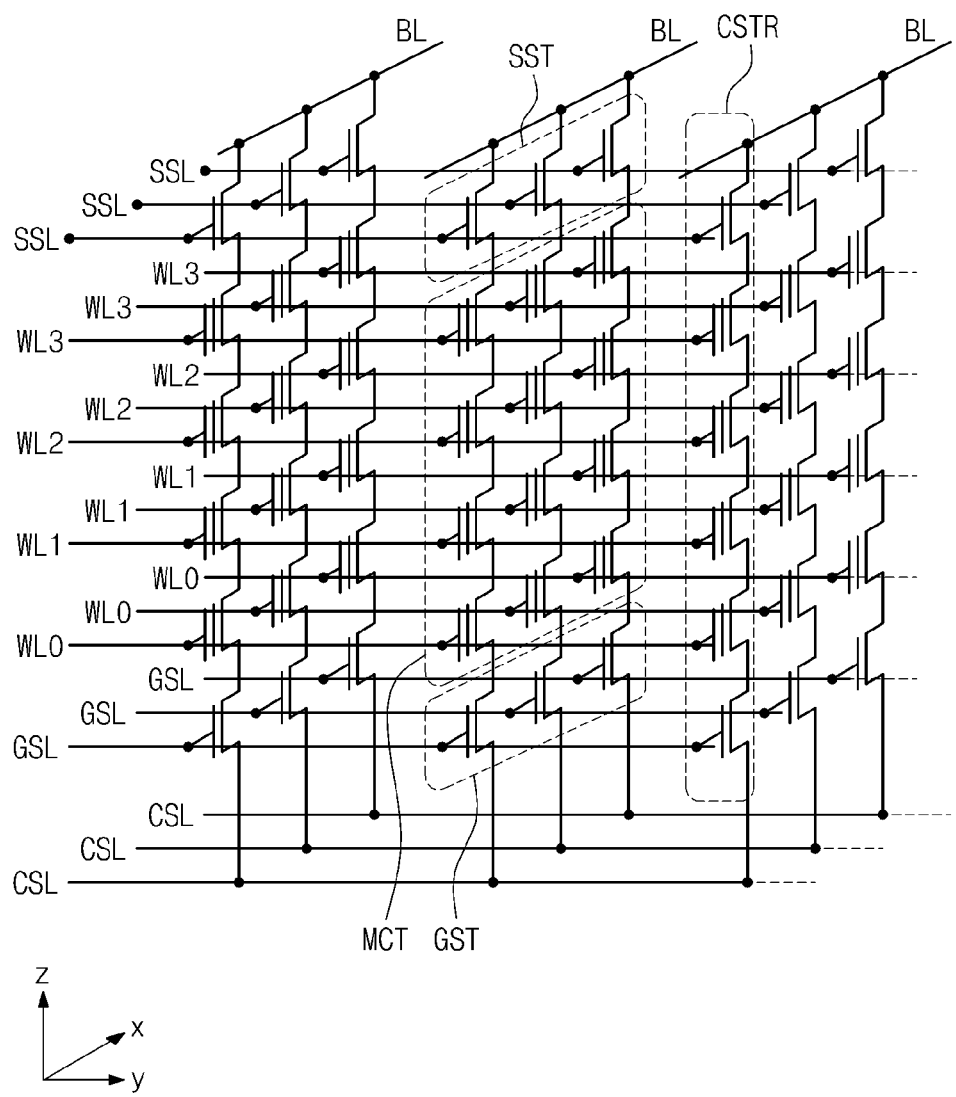
FIGS. 10A and 10B are circuit diagrams illustrating details of memory cell array embodiments suitable for use with embodiments of FIGS. 8 and 9.
Figure 10B:
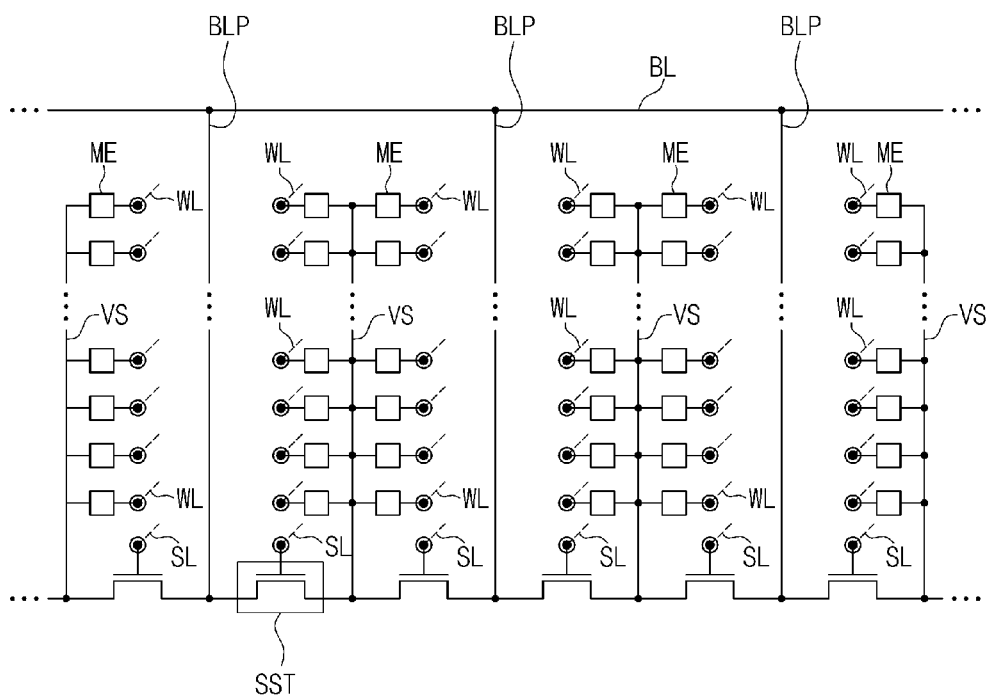

FIGS. 10A and 10B are circuit diagrams illustrating details of memory cell array embodiments suitable for use with embodiments of FIGS. 8 and 9.

Referring to FIG. 10A, a memory cell array of a semiconductor memory device according to some embodiments may include a common source line CSL, a plurality of bit lines BL, and a plurality of cell strings CSTR disposed between the common source line CSL and the bit lines BL.

The bit lines BL may be two-dimensionally arranged, and a plurality of the cell strings CSTR may be connected in parallel to each of the bit lines BL. The cell strings CSTR may be connected in common to the common source line CSL. In other words, the plurality of cell strings CSTR may be disposed between one common source line CSL and the plurality of bit lines BL. In some embodiments, the common source line CSL may be provided in plural and the common source lines CSL may be two-dimensionally arranged. The same voltage may be applied to the common source lines CSL. Alternatively, the common source lines CSL may be controlled independently of each other.

Each of the cell strings CSTR may include a ground selection transistor GST connected to the common source line CSL, a string selection transistor SST connected to the bit line BL, and a plurality of memory cell transistors MCT disposed between the ground and string selection transistors GST and SST. The ground selection transistor GST, the memory cell transistors MCT and the string selection transistor SST may be connected in series to each other.

The common source line CSL may be connected in common to sources of the ground selection transistors GST. A ground selection line GSL, a plurality of word lines WL0 to WL3 and a string selection line SSL that are disposed between the common source line CSL and the bit lines BL may be used as gate electrodes of the ground selection transistor GST, the memory cell transistors MCT and the string selection transistor SST. Each of the memory cell transistors MCT may include a data storage element.

Referring to FIG. 10B, a cell array of a semiconductor memory device according to various embodiments includes memory elements ME connected in parallel to vertical structures VS. Each of the memory elements ME may be connected to a corresponding word line WL. In other words, each of the word lines WL may be connected to corresponding one of the vertical structures VS through a corresponding memory element ME.

A plurality of selection transistors SST may be connected in parallel to a bit line through a plurality of bit line plugs BLP. Each of the bit line plugs BLP may be connected in common to a pair of adjacent selection transistors SST.

A plurality of word lines WL and a plurality of vertical structures VS are disposed between the bit line BL and the selection transistors SST. The vertical structures VS may be disposed between the bit line plugs BLP. For example, the vertical structures VS and the bit line contact plugs BLP may be alternately arranged along a direction parallel to the bit line BL. Each of the vertical structures VS is connected in common to a pair of selection transistors SST adjacent to each other.

Each of the selection transistors SST may include a selection line SL used as a gate electrode thereof. In some embodiments, the selection lines SL may be parallel to the word lines WL.

Semiconductor memory devices according to embodiments were illustrated with reference to FIGS. 10A and 10B. These are just exemplary and embodiments other than FIGS. 10A and 10B may employ various aspects of the inventions, and the embodiments in FIGS. 10A and 10B may be modified in various forms.

FIGS. 11A, 11B, 11C, and 11D are perspective views of embodiments of cell arrays of semiconductor memory devices.

According to the embodiment illustrated in FIG. 11A, a common source line CSL may be a conductive layer disposed on a semiconductor substrate 10 (hereinafter, referred to as 'a substrate') or a dopant region formed in the substrate 10. Bit lines BL may be conductive patterns (e.g., metal lines) disposed over the substrate 10. The bit lines BL may be two-dimensionally arranged and a plurality of cell strings CSTR may be connected in parallel to each of the bit lines BL. Thus, the cell strings CSTR may be two-dimensionally arranged on the common source line CSL or the substrate 10.

Each of the cell strings CSTR may include a plurality of ground selection lines GSL1 and GSL2, a plurality of word lines WL0 to WL3 and a plurality of string selection lines SSL1 and SSL2 that are disposed between the common source line CSL and the bit lines BL. In some embodiments, the plurality of string selection lines SSL1 and SSL2 may constitute the string selection lines SSL of FIG. 10A, and the plurality of ground selection lines GSL1 and GSL2 may constitute the ground selection lines GSL. The ground selection lines GSL1 and GSL2, the word lines WL0 to WL3 and the string selection lines SSL1 and SSL2 may be conductive patterns (e.g., gate electrodes) stacked on the substrate 10.

Additionally, each of the cell strings CSTR may include a vertical structure VS vertically extending from the common source line CSL and connected to the bit line BL. The vertical structure VS may penetrate the ground selection lines GSL1 and GSL2, the word lines WL0 to WL3 and the string selection lines SSL1 and SSL2. In other words, the vertical structures VS may penetrate a plurality of conductive patterns stacked on the substrate 10.

The vertical structures VS may include a semiconductor material or a conductive material. In some embodiments, the vertical structure VS may be formed of the semiconductor material and may include a semiconductor body portion SP1 connected to the substrate 10 and a semiconductor spacer SP2 between the semiconductor body portion SP1 and a data storage layer DS, as illustrated in FIG. 11A. Additionally, each of the vertical structures VS may include a dopant region D formed in a top end portion thereof. For example, dopant region D may be a drain region D formed in the top end portion of the vertical structure VS.

The data storage layer DS may be disposed between the vertical structures VS and the word lines WL0 to WL3. In some embodiments, the data storage layer DS may include a charge storage layer. For example, the data storage layer DS may include one of a trap insulating layer, a floating gate electrode, or an insulating layer including conductive nano dots. Data stored in the data storage layer DS may be changed using a Flower-Nordheim tunneling effect caused by a voltage difference between the vertical structure VS including the semiconductor material and each of the word lines WL0 to WL3. Alternatively, the data storage layer DS may include a thin layer capable of storing data based on another operation principle, for example, a thin layer for a phase change memory cell or a thin layer for a variable resistance memory cell.

In some embodiments, the data storage layer DS may include a vertical pattern VP penetrating the word lines WL0 to WL3 and a horizontal pattern HP extending from between the vertical pattern VP and the word lines WL0 to WL3 onto top surfaces and bottom surfaces of the word lines WL0 to WL3.

A dielectric layer used as an gate insulating layer may be disposed between each of the ground selection lines GSL1 and GSL2 and the vertical structure VS and/or between each of the string selection lines SSL1 and SSL2. Here, the dielectric layer may be formed of the same material as the data storage layer DS or may be a gate insulating layer (e.g., a silicon oxide layer) used in a general metal-oxide-semiconductor field effect transistor (MOSFET).

In the structure described above, the vertical structures VS and the lines GSL1, GSL2, WL0 to WL3, SSL1 and SSL2 may constitute metal-oxide-semiconductor field effect transistors (MOSFETs) using the vertical structures VS as channel regions. Alternatively, the vertical structures VS and the lines GSL1, GSL2, WL0 to WL3, SSL1 and SSL2 may constitute metal-oxide semiconductor (MOS) capacitors.

The ground selection lines GSL1 and GSL2, the word lines WL0 to WL3 and the string selection lines SSL1 and SSL2 may be used as gate electrodes of the ground selection transistors, the memory cell transistors and the string selection transistors, respectively. Additionally, inversion regions may be generated in the vertical structure VS by electric fields and fringe fields generated by voltages applied to the ground selection lines GSL1 and GSL2, the word lines WL0 to WL3 and the string selection lines SSL1 and SSL2. Here, a maximum length (or a maximum width) of each inversion region may be greater than a thickness of each line GSL1, GSL2, WL0 to WL3, SSL1 and SSL2 generating the each inversion region. Thus, the inversion regions formed in the vertical structure may vertically overlap with each other to generate a current path electrically connecting the common source line CSL to a selected bit line BL.

In other words, the ground and string selection transistors including the selection lines GSL1, GSL2, SSL1 and SSL2 and the memory cell transistors including the word lines WL0 to WL3 may be connected in series to each other in the cell string CSTR.

Figure 11A:
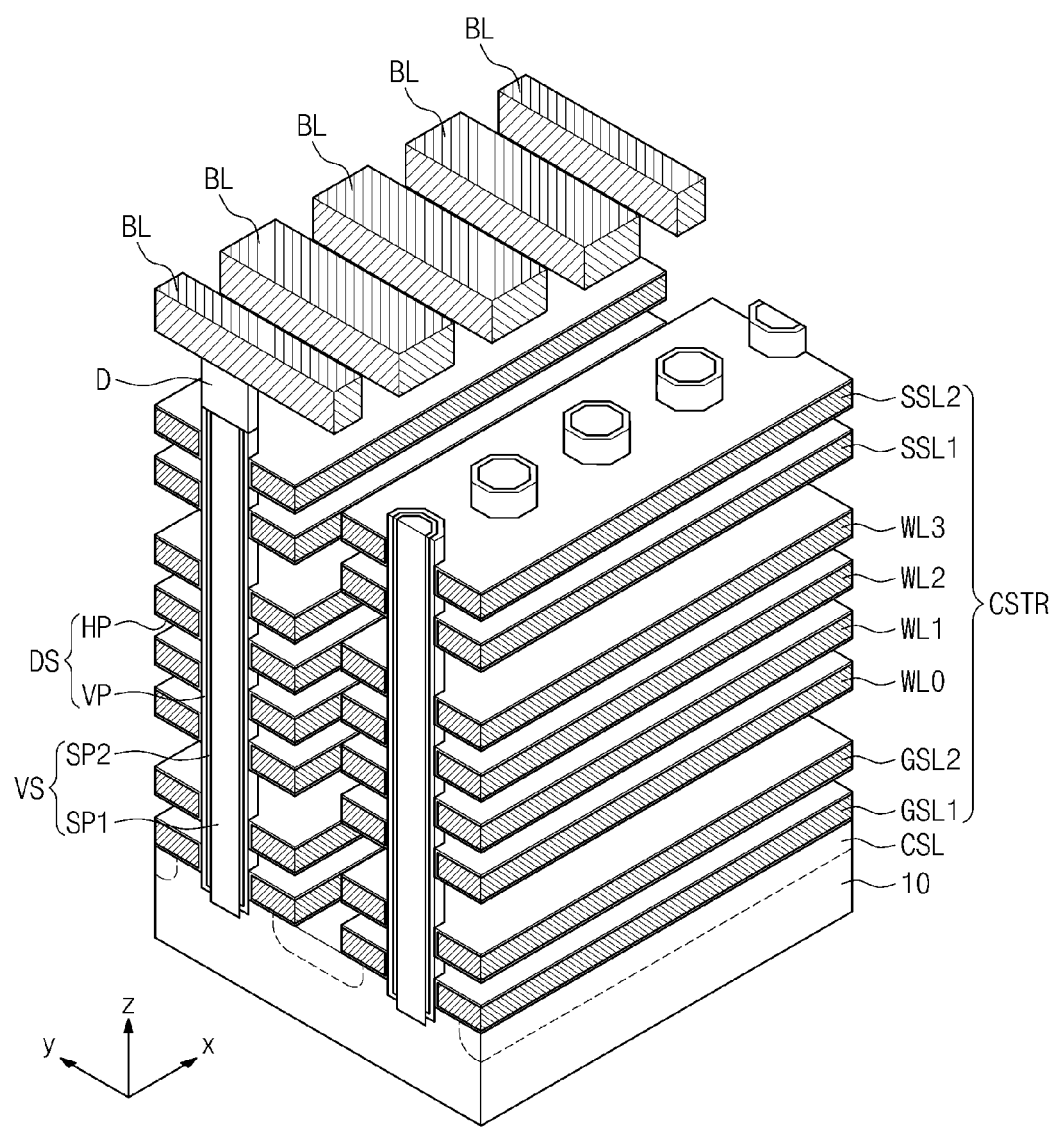
FIGS. 11A, 11B, 11C, and 11D are perspective views of cell arrays of semiconductor memory devices according to embodiments.
Figure 11B:
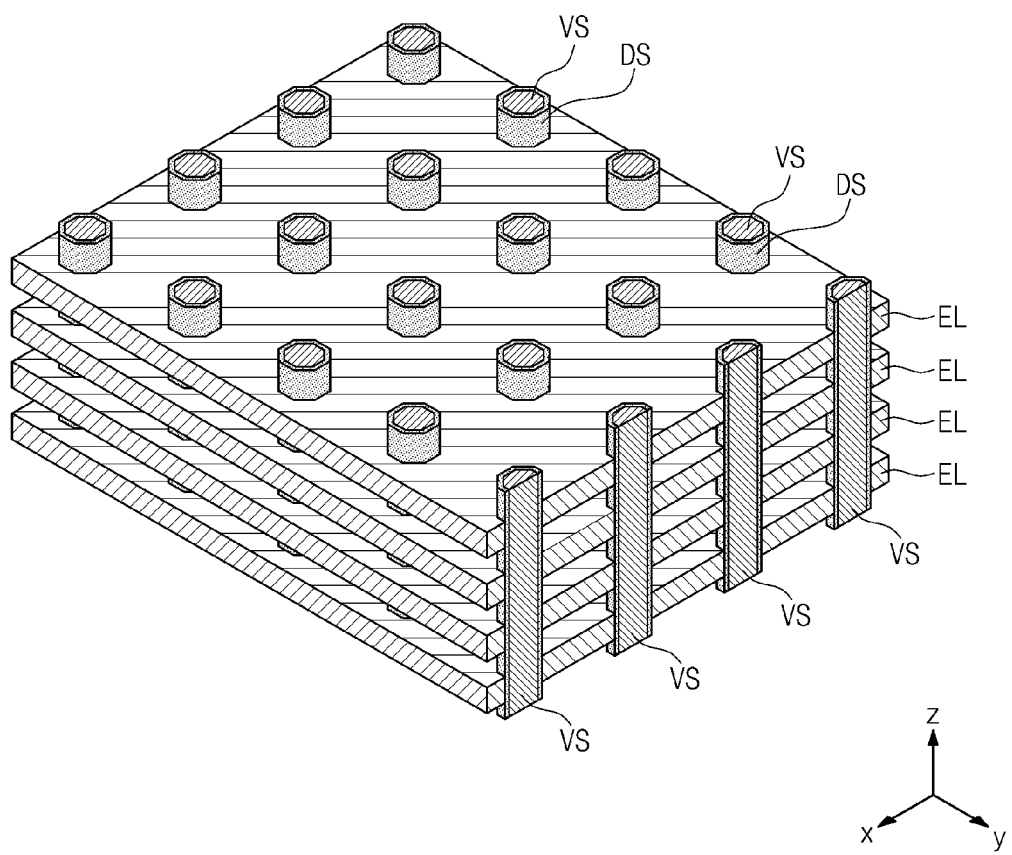
Figure 11C:
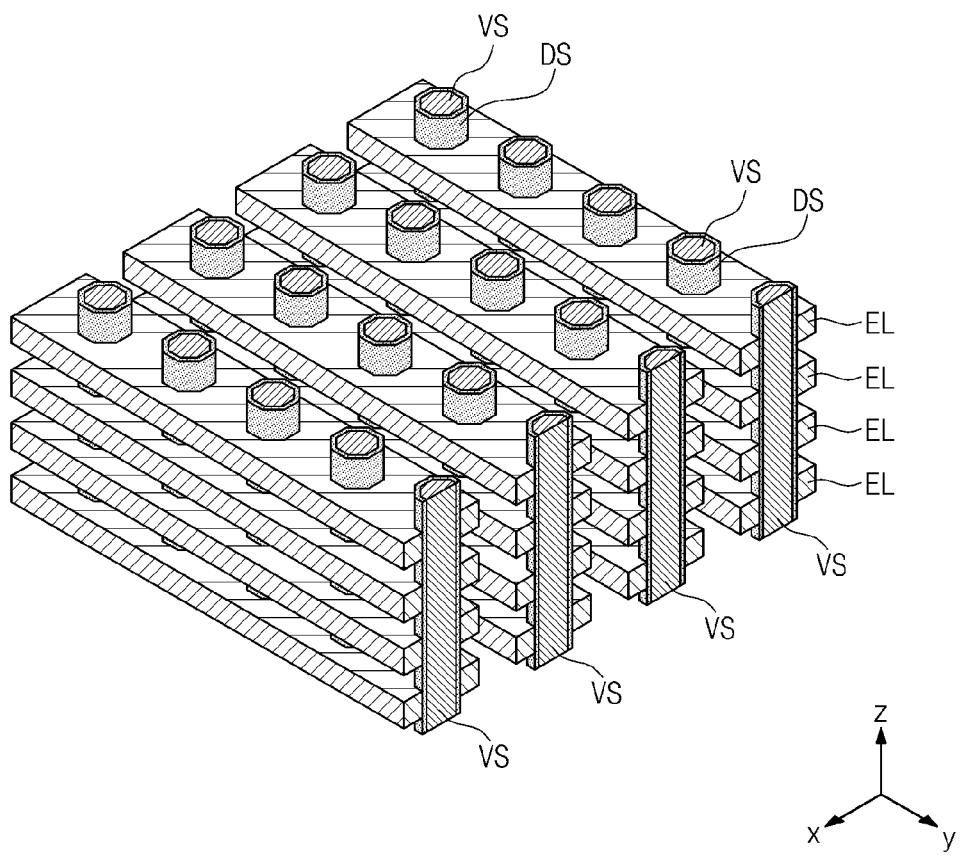
Figure 11D:
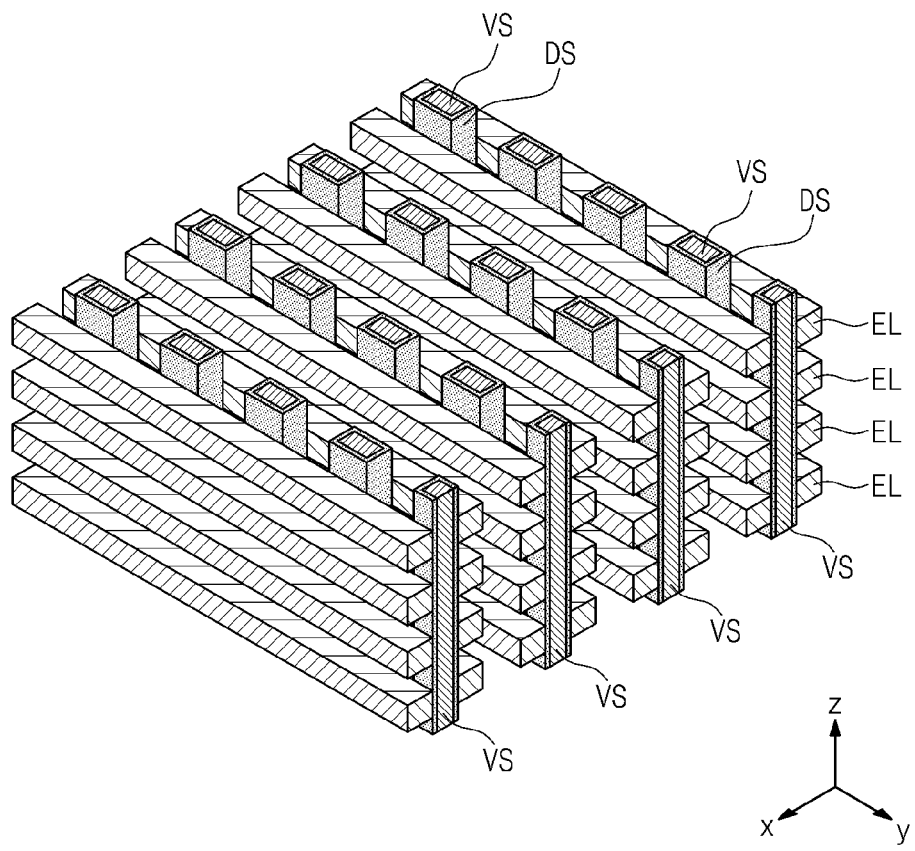

Referring to FIGS. 11B to 11D, a cell array of a semiconductor memory device according to embodiments may include a plurality of horizontal electrodes EL parallel to an xy-plane and disposed at different heights from each other, and a plurality of vertical structures VS perpendicular to the horizontal electrodes EL. Additionally, the cell array may further include data storage layers DS disposed between the horizontal electrodes EL and sidewalls of the vertical structures VS. The horizontal electrodes EL illustrated in FIGS. 11B to 11D may correspond to the word lines WL0 to WL3 or WL described with reference to FIGS. 10A and 10B.

According to an embodiment illustrated in FIG. 11B, each of horizontal electrodes EL may have a plate-shape. For example, lengths of each horizontal electrode EL in an x-direction and a y-direction may be significantly greater than the width in a z-direction, for example equal to or greater than ten times lengths of each vertical structure VS in the x-direction and the y-direction, respectively. Each horizontal electrode EL may include a plurality of holes penetrating each horizontal electrode EL. The plurality of holes penetrating each horizontal electrode EL may be two-dimensionally arranged. Each vertical structure VS may pass through the holes that are included in the horizontal electrodes EL disposed at different heights from each other and are vertically aligned with each other.

According to an embodiment illustrated in FIG. 11C, horizontal electrodes EL may be separated from each other in an x-direction and a z-direction to be three-dimensionally arranged. Each of the horizontal electrodes EL may have a linear shape crossing a plurality of vertical structures VS. For example, a length of each horizontal electrode EL may be equal to or greater than ten times a width of the vertical structure VS and a width of each horizontal electrode EL may be equal to or less than three times the width of the vertical structure VS. Each horizontal electrode EL may be one-dimensionally arranged to define a plurality of holes penetrating each horizontal electrode EL. Each vertical structure VS may pass through the holes that are included in the horizontal electrodes EL disposed at different heights from each other and are vertically aligned with each other.

According to an embodiment illustrated in FIG. 11D, horizontal electrodes EL may be separated from each other in an x-direction and a z-direction to be three-dimensionally arranged. Each of the horizontal electrodes EL may have a linear shape crossing a plurality of vertical structures VS. According to the present embodiment, the vertical structures VS may be laterally separated from each other in a region including a plurality of the vertical structures VS that are at least one-dimensionally arranged. In some embodiments, a pair of horizontal electrodes EL respectively disposed at both sides of each vertical structure VS may be laterally separated from each other and may have different potentials from each other. In some embodiments, even though not shown in the drawings, one of the pair of horizontal electrodes EL may be connected to an external circuit through its left end and the other of the pair of horizontal electrodes EL may be connected to another external circuit through its right end.

In other embodiments, the pair of horizontal electrodes EL disposed at both sides of each vertical structure VS may be electrically connected to each other and may be in an equipotential state. For example, each horizontal electrode EL may have at least one hole penetrating each horizontal electrode EL and a plurality of vertical structures VS may pass through one hole of each horizontal electrode EL, which in this respect is unlike the embodiments of FIGS. 11B and 11C.

Figure 12:
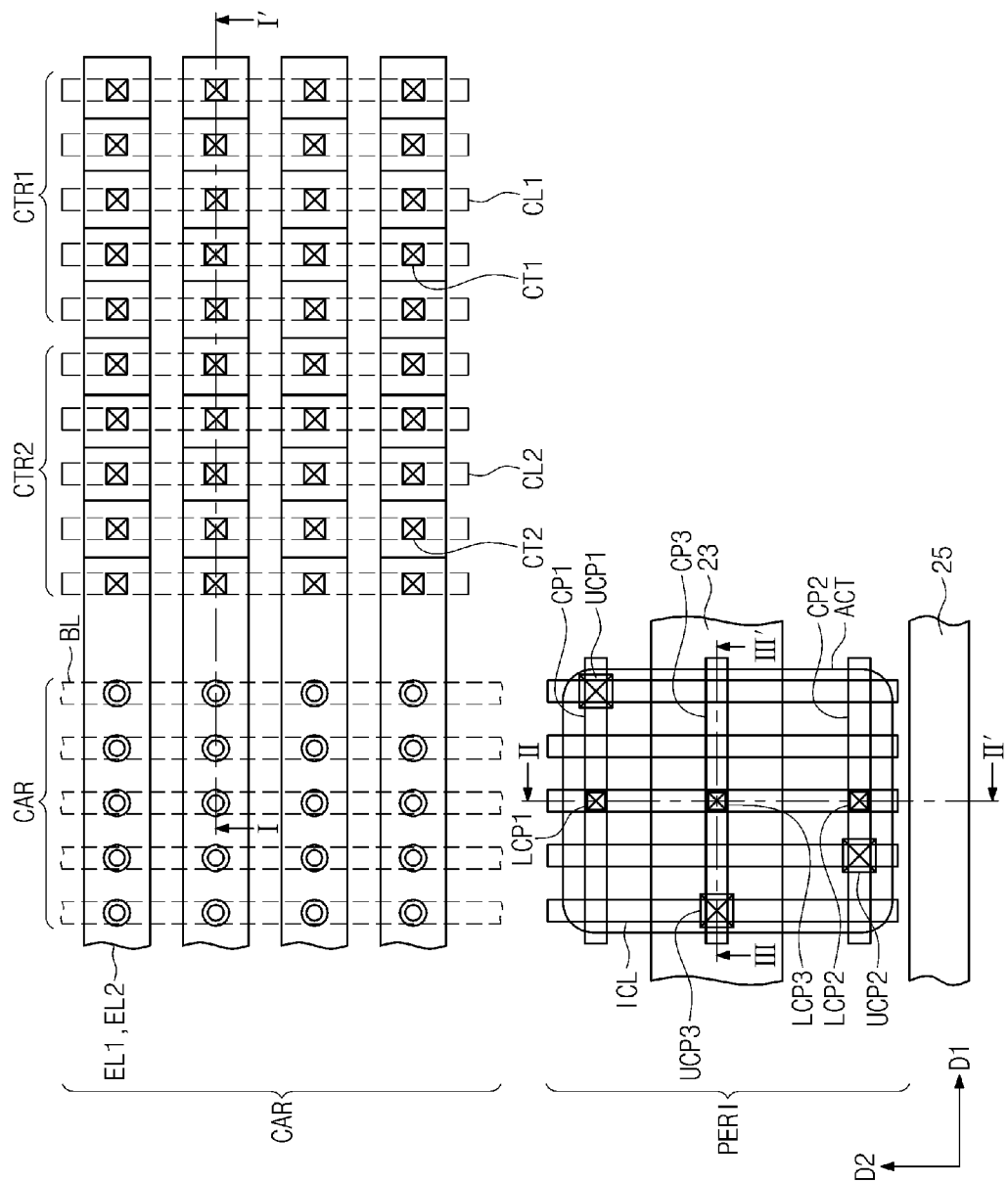
FIG. 12 is a plan view illustrating portions of a semiconductor memory device according to some embodiments.
Figure 13:
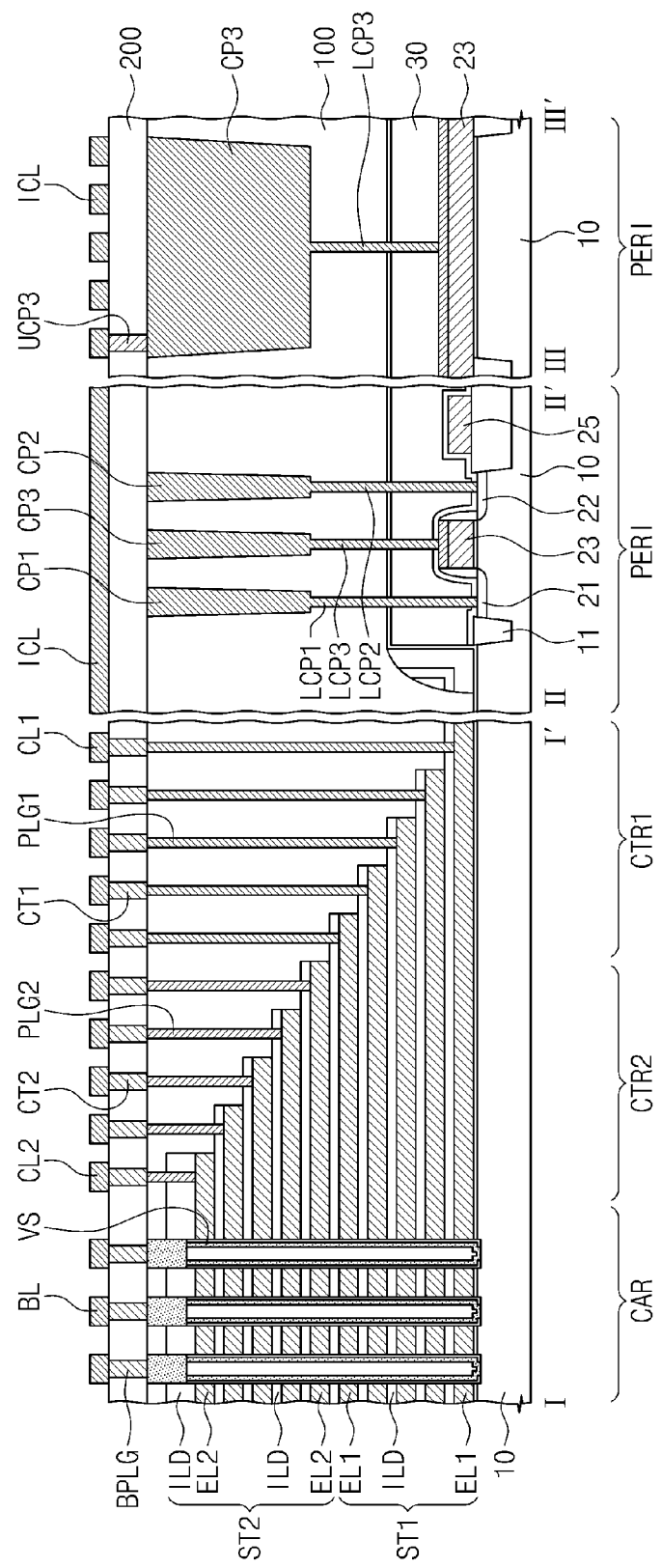
FIG. 13 is a cross-sectional view taken along lines I-I', II-II' and III-III' of FIG. 12 to illustrate an embodiment according of a semiconductor memory device.

FIG. 12 is a plan view illustrating a semiconductor memory device according to some embodiments. FIG. 13 is a cross-sectional view taken along lines I-I', II-II' and III-III' of FIG. 12.

Referring to FIGS. 12 and 13, a substrate 10 may include a cell array region CAR, a peripheral circuit region PERI, and a contact region therebetween. In some embodiments, the contact region may include a first contact region CTR1 adjacent to the peripheral circuit region PERI and a second contact region CTR2 adjacent to the cell array region CAR. The substrate 10 of the peripheral circuit region PERI may include an active region ACT defined by a device isolation layer 11.

The substrate 10 may be a substrate having a semiconductor property (e.g., a silicon wafer), an insulating substrate (e.g., a glass substrate), or a semiconductor or conductor covered by an insulating material. For example, the substrate 10 may be a silicon wafer having a first conductivity type.

In some embodiments, a cell array structure may be disposed on the substrate 10 of the cell array region CAR and a peripheral logic structure may be disposed on the substrate 10 of the peripheral circuit region PERI. The cell array structure may have a first height on a top surface of the substrate 10 and may extend from the cell array region CAR into the contact region. The peripheral logic structure may have a second height smaller than the first height.

The cell array structure may include a stack structure including vertically stacked electrodes EL1 and EL2 and vertical structures VS penetrating the stack structure. The stack structure may have a linear structure extending in a first direction D1, as illustrated in FIG. 12. Alternatively, the stack structure may have a plate-shaped structure covering an entire portion of the cell array region CAR. The stack structure may have a stepwise structure in the contact region in order to electrically connect the electrodes to the peripheral logic structure. In other words, a vertical height of the stack structure may increase stepwise in the contact region as a distance from the cell array region CAR decreases. In some embodiments, the stack structure may have a sloped profile in the contact region.

In some embodiments, the stack structure may include a first stack structure ST1 including a plurality of first electrodes EL1 vertically stacked on the substrate 10 and a second stack structure ST2 including a plurality of second electrodes EL2 vertically stacked on the first stack structure ST1.

The first stack structure ST1 may further include insulating layers ILD of which each is disposed between the first electrodes EL1 vertically adjacent to each other. Thicknesses of the insulating layers ILD of the first stack structure ST1 may be equal to each other. Alternatively, the thickness of at least one of the insulating layers ILD may be different from the thicknesses of others of the insulating layers ILD. End portions of the first electrodes EL1 may be disposed on the substrate 10 of the first contact region CTR1, and the first stack structure ST1 may have a stepwise structure in the first contact region CTR1. In more detail, areas of the first electrodes EL1 may become reduced as a distance from the top surface of the substrate 10 increases. Sidewalls of the first electrodes EL1 may be disposed at different horizontal positions from each other in the first contact region CTR1. Likewise, the second stack structure ST2 may further include insulating layers ILD of which each is disposed between the second electrodes EL2 vertically adjacent to each other. Thicknesses of the insulating layers ILD of the second stack structure ST2 may be equal to each other. Alternatively, the thickness of at least one of the insulating layers ILD of the second stack structure ST2 may be different from the thicknesses of others of the insulating layers ILD of the second stack structure ST2. End portions of the second electrodes EL2 may be disposed on the substrate 10 of the second contact region CTR2, and the second stack structure ST2 may have a stepwise structure in the second contact region CTR2. In more detail, areas of the second electrodes EL2 may become reduced as a distance from the top surface of the substrate 10 increases. Sidewalls of the second electrodes EL2 may be disposed at different horizontal positions from each other in the second contact region CTR2.

In some embodiments, the vertical structures VS may penetrate the second and first stack structures ST1 and ST2 and may be connected to the substrate 10. The vertical structures VS may include a semiconductor material or a conductive material. In some embodiments, the vertical structure VS may include the semiconductor body portion SP1 connected to the substrate 10 and the semiconductor spacer SP2 between the semiconductor body portion SP1 and the data storage layer DS, as described with reference to FIG. 11A. In some embodiments, the vertical structures VS may be arranged in one direction when viewed from a plan view. Alternatively, the vertical structures VS may be arranged in a zigzag form in one direction when viewed from a plan view.

Bit lines BL may be disposed over the cell array structure. The bit lines may extend in a second direction D2 to cross over the stack structure. The bit line BL may be electrically connected to the vertical structure VS through a bit line contact plug BPLG.

In some embodiments, a filling insulating layer 100 may be disposed on an entire top surface of the substrate 10. The filling insulating layer 100 may cover the stack structure and the peripheral logic structure. The filling insulating layer 100 may have a planarized top surface and may cover the end portions of the first and second stack structures ST1 and ST2.

An interconnection structure for electrical connection between the cell array structure and the peripheral logic structure may be disposed in the first and second contact regions CTR1 and CTR2. In some embodiments, first plugs PLG1 penetrating the filling insulating layer 100 may be disposed in the first contact region CTR1. The first plugs PLG1 may be connected to ends of the first electrodes EL1, respectively. Second plugs PLG2 penetrating the filling insulating layer 100 may be disposed in the second contact region CTR2. The second plugs PLG1 may be connected to ends of the second electrodes EL2, respectively. Vertical lengths of the first plugs PLG1 may become reduced as a distance from the cell array region CAR decreases. Vertical lengths of the second plugs PLG2 may also become reduced a distance from the cell array region CAR decreases. A minimum one of the vertical lengths of the first plugs PLG1 may be greater than a maximum one of the vertical lengths of the second plugs PLG2. Top surfaces of the first and second plugs PLG1 and PLG2 may be substantially coplanar with each other. In some embodiments, the top surfaces of the first and second plugs PLG1 and PLG2 may be substantially coplanar with top surfaces of the vertical structures VS.

Additionally, first connecting lines CL1 may be disposed on the filling insulating layer 100 of the first contact region CTR1. The first connecting lines CL1 may be electrically connected to the first plugs PLG1 through first contacts CT1. Second connecting lines CL2 may be disposed on the filling insulating layer 100 of the second contact region CTR2. The second connecting lines CL2 may be electrically connected to the second plugs PLG2 through second contacts CT2.

In some embodiments, the peripheral logic structure of the peripheral circuit region PERI may include the row and column decoders 2 and 4 of FIG. 9, the page buffer 3 of FIG. 9 and the control circuits, as described with reference to FIGS. 8 and 9. In other words, the peripheral logic structure may include NMOS and PMOS transistors, a resistor and a capacitor that are electrically connected to the cell array structure.

In more detail, the device isolation layer 11 may be formed in or on the substrate 10 of the peripheral circuit region PERI to define the active region ACT. The peripheral logic structure of the peripheral circuit region PERI may include a peripheral gate electrode 23 crossing over the active region ACT and extending in the first direction D1, source and drain dopant regions 21 and 22 formed in the active region ACT at sides of the peripheral gate electrode 23, and a peripheral insulating pattern 30 covering peripheral circuits. Additionally, the peripheral logic structure may further include a resistance pattern 25. The peripheral insulating pattern 30 may cover the peripheral gate electrode 23 and the resistance pattern 25. A top surface of the peripheral insulating pattern 30 may be lower than a top surface of the cell array structure.

In some embodiments, a plurality of interconnections ICL may be disposed above the filling insulating layer 100 of the peripheral circuit region PERI. The plurality of interconnections ICL may extend from the peripheral circuit region PERI to the cell array region CAR. In the illustrated embodiment, the plurality of interconnections ICL may be formed of the same material as the bit lines BL of the cell array region CAR.

The plurality of interconnections ICL may extend in parallel in the second direction D2 perpendicular to the first direction D1. Portions of the interconnections ICL may overlap with the active region ACT when viewed from a plan view. In other words, the plurality of interconnections ICL may be disposed over one active region ACT.

In some embodiments, an array of first to third contact pads CP1, CP2 and CP3 may be disposed between a height of a top surface of the peripheral gate electrode 23 and a height of bottom surfaces of the plurality of interconnections ICL in vertical view.

The first to third contact pads CP1, CP2 and CP3 may extend in the first direction D1. The first to third contact pads CP1, CP2 and CP3 may be laterally spaced apart from each other in the second direction D2. The first to third contact pads CP1, CP2 and CP3 may be disposed over the active region ACT. Lengths of the first to third contact pads CP1, CP2 and CP3 in the first direction D1 may be greater than a width of the active region ACT in the first direction D1.

In some embodiments, vertical heights of the first to third contact pads CP1, CP2 and CP3 may be less than the maximum one of the vertical lengths of the second plugs PLG2 and greater than the minimum one of the vertical lengths of the second plugs PLG2. In some embodiments, top surfaces of the first to third contact pads CP1, CP2 and CP3 may be substantially coplanar with the top surfaces of the first and second plugs PLG1 and PLG2 on the substrate 100 in the first and second contact regions CTR1 and CTR2. Additionally, the top surfaces of the first to third contact pads CP1, CP2 and CP3 may be substantially coplanar with the top surfaces of the vertical structures VS of the cell array region CAR. Furthermore, bottom surfaces of the first to third contact pads CP1, CP2 and CP3 may be lower than the top surfaces of the vertical structures VS and higher than the top surface of the peripheral logic structure.

A maximum width of first to third lower contact plugs LCP1, LCP2 and LCP3 disposed under the first to third contact pads CP1, CP2 and CP3 may be smaller than a maximum width of the first to third contact pads CP1, CP2 and CP3. Additionally, the maximum width of the first to third lower contact plugs LCP1, LCP2 and LCP3 may be smaller than a minimum width of the first to third contact pads CP1, CP2 and CP3.

In some embodiments, the first to third contact pads CP1, CP2 and CP3 are illustrated in the peripheral circuit region PERI. However, in other embodiments, contact pads may be in other regions of the substrate 10, and in various embodiments at least one of the first to third contact pads CP1, CP2 and CP3 may be omitted or the number of contact pads may be increased.

In some embodiments, the first contact pad CP1 may be electrically connected to the source dopant region 21 through the first lower contact plug LCP1. The second contact pad CP2 may be electrically connected to the drain dopant region 22 through the second lower contact plug LCP2. The third contact pad CP3 may be electrically connected to the peripheral gate electrode 23 through the third lower contact plug LCP3.

The first to third lower contact plugs LCP1, LCP2 and LCP3 may be disposed in the active region ACT regardless positions of the interconnections ICL on the filling insulating layer 100 when viewed from a plan view. Thus, a margin of a formation process of the first to third lower contact plugs LCP1, LCP2 and LCP3 may be improved. The first to third lower contact plugs LCP1, LCP2 and LCP3 may be arranged in one line in the second direction D2.

Each of the first to third contact pads CP1, CP2 and CP3 may be electrically connected to one of the plurality of interconnections ICL through an upper contact plug UCP1, UCP2 or UCP3. In some embodiments, first to third upper contact plugs UCP1, UCP2 and UCP3 may be disposed to correspond to the first to third contact pads CP1, CP2 and CP3, respectively. Positions of the first to third upper contact plugs UCP1, UCP2 and UCP3 may be changed depending on electrical connection relationship between the interconnections ICL and the peripheral logic circuits. In the present embodiment, top surfaces of the first to third upper contact plugs UCP1, UCP2 and UCP3 may be substantially coplanar with top surfaces of the first and second contacts CT1 and CT2 of the first and second contact regions CTR1 and CTR2.

According to some embodiments, even though the first to third upper contact plugs UCP1, UCP2 and UCP3 may be disposed above a boundary portion between the active region ACT and the device isolation layer 11 or above the device isolation layer 11, the first to third upper contact plugs UCP1, UCP2 and UCP3 may be electrically connected to the peripheral logic structure through the first to third contact pads CP1, CP2 and CP3 and lower contact plugs LCP1, LCP2 and LCP3.

FIGS. 14 to 18 are cross-sectional views illustrating semiconductor memory devices according to other embodiments. In embodiments illustrated in FIGS. 14 to 18, the descriptions to the same elements as described in the embodiment of FIGS. 12 and 13 will be omitted or mentioned briefly in order to avoid redundancy in explanation.

Figure 14:
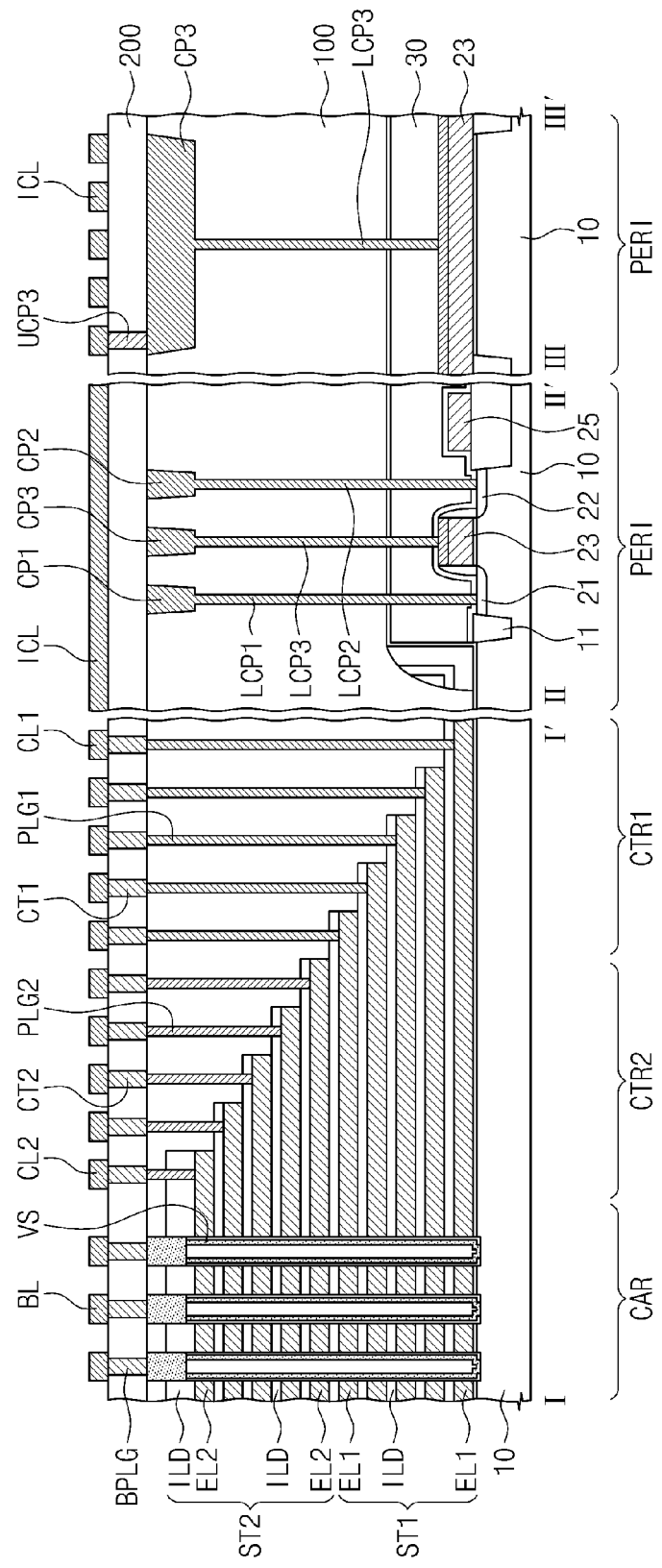
FIGS. 14 to 18 are cross-sectional views taken along lines I-I', II-II' and III-III' of FIG. 12 illustrating alternative embodiments of semiconductor memory devices.

Referring to FIG. 14, a vertical length of contact pads CP1, CP2 and CP3 may be substantially equal to the minimum one of the vertical lengths of the second plugs PLG2. In other words, bottom surfaces of the contact pads CP1, CP2 and CP3 may be substantially coplanar with a bottom surface of the second plug PLG2 connected to an uppermost second electrode EL2.

Figure 15:
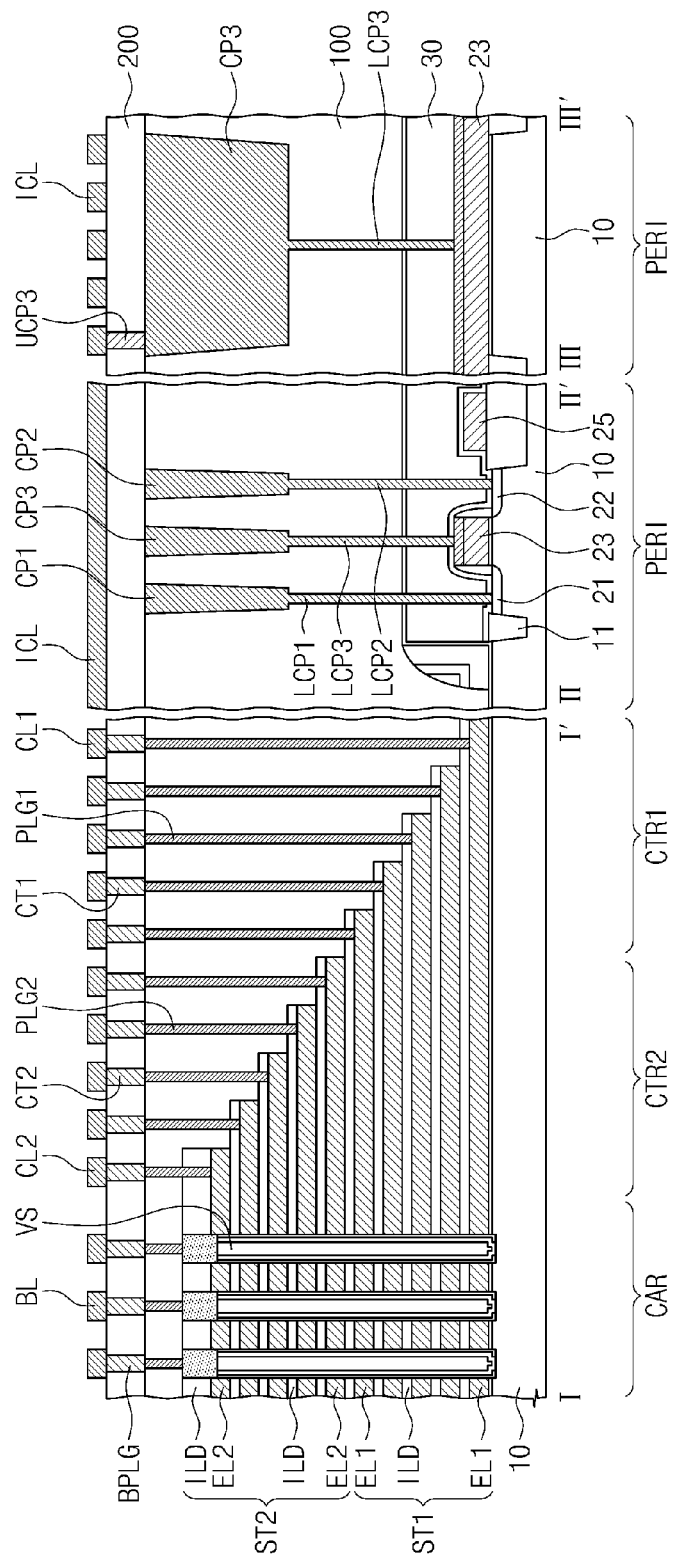

According to the embodiment illustrated in FIG. 15, top surfaces of contact pads CP1, CP2 and CP3 may be substantially coplanar with top surfaces of the first and second plugs PLG1 and PLG2 but may be higher than the top surface of the cell array structure.

According to the embodiment illustrated in FIG. 15, the cell array structure may include a stack structure including electrodes vertically stacked on the substrate, and vertical structures penetrating the stack structure. The stack structure 10 may include a first stack structure ST1 including first electrodes EL1 stacked on the substrate, and a second stack structure ST2 including second electrodes EL2 stacked on the first stack structure ST1.

Figure 16:
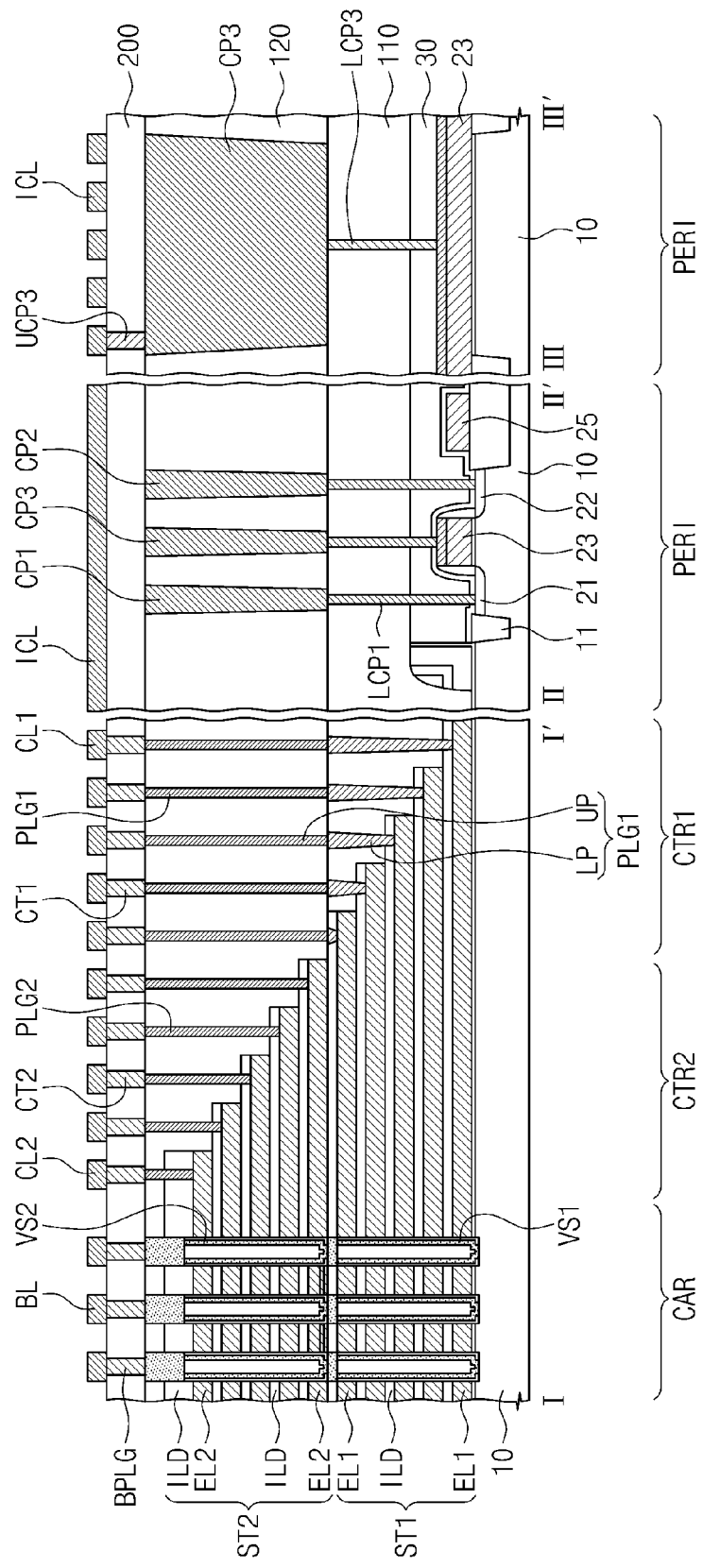

According to the embodiment illustrated in FIG. 16, the first stack structure ST1 may have a stepwise structure in the first contact region CTR1 and a first interlayer insulating layer 110 may cover the first stack structure ST1 in the first contact region CTR1. The second stack structure ST2 may have a stepwise structure in the second contact region CTR2 and a second interlayer insulating layer 120 may cover a top surface of the first interlayer insulating layer 110 and the second stack structure ST2 in the second contact region CTR2.

Each of the vertical structures may include a first vertical structure VS1 penetrating the first stack structure ST1 and a second vertical structure VS2 penetrating the second stack structure ST2. Each of the first and second vertical structures VS1 and VS2 may include a semiconductor pattern, as described above. A data storage layer may be disposed between the first and second vertical structures VS1 and VS2 and the first and second electrodes EL1 and EL2.

First plugs PLG1 connected to ends of the first electrodes EL1 may be disposed in the first contact region CTR1. Second plugs PLG2 connected to ends of the second electrodes EL2 may be disposed in the second contact region CTR2. In the present embodiment, each of the first plugs PLG1 may include a lower plug LP and an upper plug UP. The lower plugs LP of the first plugs PLG1 may be formed simultaneously with the lower contact plugs LCP1, LCP2 and LCP3 of the peripheral circuit region PERI. Thus, top surfaces of the lower plugs LP of the first plugs PLG1 may be substantially coplanar with the top surfaces of the lower contact plugs LCP1, LCP2 and LCP3. The upper plugs UP of the first plugs PLG1 may have a substantially same vertical length. Additionally, the upper plugs UP of the first plugs PLG1 may be formed simultaneously with the plugs PLG2 of the second stack structure ST2 and the contact pads CP1, CP2 and CP3 of the peripheral circuit region PERI. The bottom surfaces of the contact pads CP1, CP2 and CP3 may be substantially coplanar with bottom surfaces of the upper plugs UP.

Figure 17:
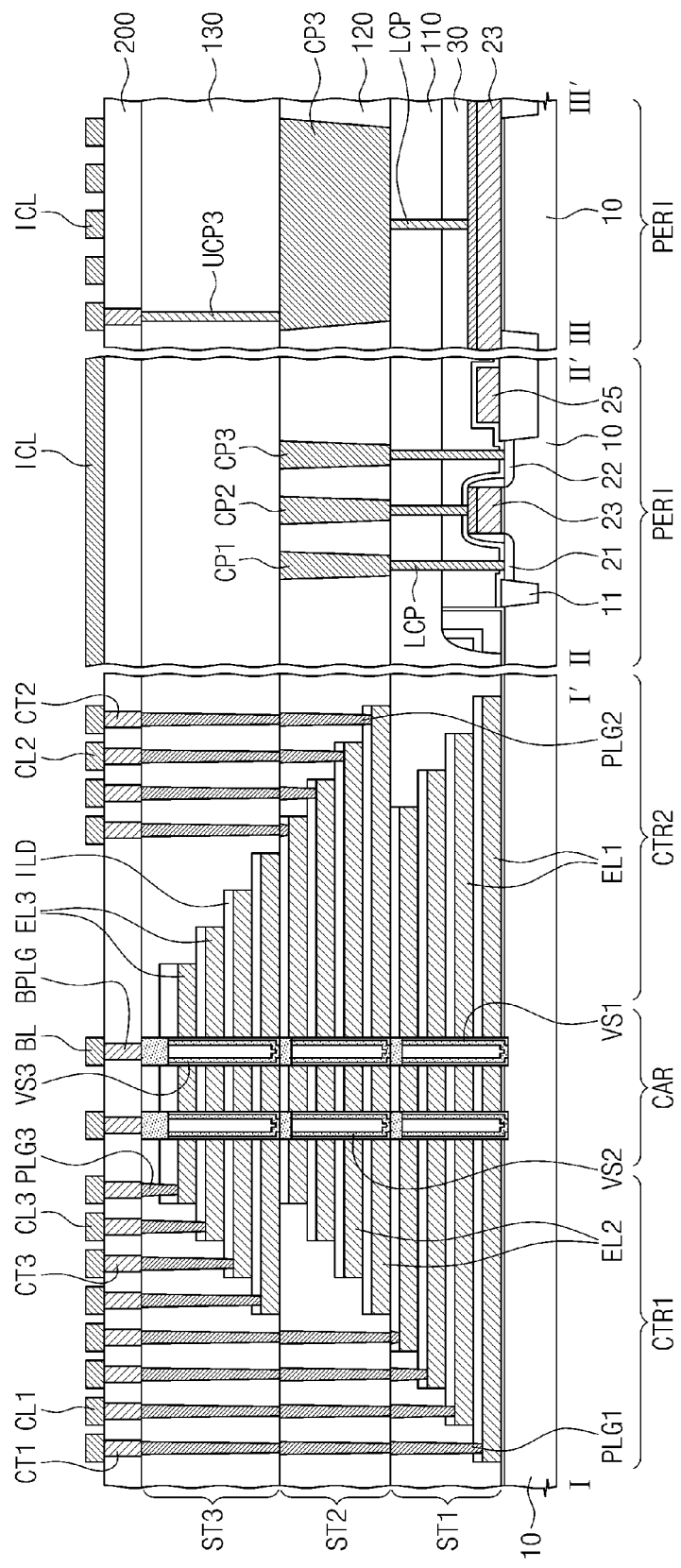

According to the embodiment illustrated in FIG. 17, a substrate 10 may include a cell array region CAR, a peripheral circuit region PERI, and a contact region between the cell array region CAR and the peripheral circuit region PERI. The contact region may surround the cell array region CAR. In some embodiments, the contact region may include a first contact region CTR1 at a side of the cell array region CAR and a second contact region CTR2 at another side of the cell array region CAR.

A cell array structure may include a stack structure including electrodes vertically stacked on the substrate 10 of the cell array region CAR and vertical structures penetrating the stack structure. The stack structure may include a first stack structure ST1, a second stack structure ST2 and a third stack structure ST3 that are sequentially stacked on the substrate 10 of the cell array region CAR. The first to third stack structures ST1, ST2 and ST3 may have line-shaped structures, as illustrated in FIG. 12. Alternatively, the first to third stack structures ST1, ST2 and ST3 may have plate-shaped structures covering an entire portion of the substrate 10 of the cell array region CAR.

The first stack structure ST1 may include a plurality of first electrodes EL1 vertically stacked on the substrate 10. The first stack structure ST1 may also include insulating layers, each of which is disposed between the first electrodes EL1 vertically adjacent to each other. The first stack structure ST1 may have stepwise structures in the first and second contact regions CTR1 and CTR2. A first interlayer insulating layer 110 covering end portions of the first electrodes EL1 may be disposed on the substrate 10 of the first and second contact regions CTR1 and CTR2. A top surface of the first interlayer insulating layer 110 may be substantially coplanar with a top surface of the first stack structure ST1.

The second stack structure ST2 may include a plurality of second electrodes EL2 vertically stacked on the first stack structure ST1. The second stack structure ST2 may also include insulating layers, each of which is disposed between the second electrodes EL2 vertically adjacent to each other. The second stack structure ST2 may have stepwise structures in the first and second contact regions CTR1 and CTR2. In a plan view, the second stack structure ST2 may leave exposed the end portions of the first electrodes EL1 in the first contact region CTR1 but may overlap with the end portions of the first electrodes EL1 in the second contact region CTR2. Additionally, a length of the longest one of the second electrodes EL2 in the second stack structure ST2 may be greater than a length of the shortest one of the first electrodes EL1 in the first stack structure ST1 in the first direction D1. In other words, a length of a lowermost second electrode EL2 of the second stack structure ST2 may be greater than a length of an uppermost first stack electrode EL1 of the first stack structure ST1.

A second interlayer insulating layer 120 may be disposed on the first interlayer insulating layer 110 to cover end portions of the second electrodes EL2. In other words, the second interlayer insulating layer 120 may cover the second stack structure ST2 in the first and second contact regions CTR1 and CTR2. A top surface of the second interlayer insulating layer 120 may be substantially coplanar with a top surface of the second stack structure ST2.

The third stack structure ST3 may include a plurality of third electrodes EL3 vertically stacked on the second stack structure ST2. The third stack structure ST3 may have stepwise structures in the first and second contact regions CTR1 and CTR2. In a plan view, the third stack structure ST3 may leave exposed the end portions of the second electrodes EL2 in the second contact region CTR2 but may overlap with the end portions of the second electrodes EL2 in the first contact region CTR1. Additionally, the third stack structure ST3 may leave exposed the end portions of the first electrodes EL1 in the first contact region CTR1. Moreover, a length of the longest one of the third electrodes EL3 in the third stack structure ST3 may be greater than a length of the shortest one of the second electrodes EL2 in the second stack structure ST2 in the first direction D1. In other words, a length of a lowermost third electrode EL3 of the third stack structure ST3 may be greater than a length of an uppermost second stack electrode EL2 of the second stack structure ST2.

A third interlayer insulating layer 130 covering end portions of the third electrodes EL3 may be disposed on the second interlayer insulating layer 120. In other words, the third interlayer insulating layer 130 may cover the third stack structure ST3 in the first and second contact regions CTR1 and CTR2. A top surface of the third interlayer insulating layer 130 may be substantially coplanar with a top surface of the third stack structure ST3.

In the present embodiment, the vertical structures may be disposed in the cell array region CAR to penetrate the first to third stack structures ST1, ST2 and ST3. In the present embodiment, each of the vertical structures may include a first vertical structure VS1 penetrating the first stack structure ST1, a second vertical structure VS2 penetrating the second stack structure ST2, and a third vertical structure VS3 penetrating the third stack structure ST3. Additionally, a bit line BL may be disposed over each vertical structure. The bit line BL may be electrically connected to the vertical structure through a bit line contact plug BPLG.

Additionally, an interconnection structure may be disposed in the first and second contact regions CTR1 and CTR2. The interconnection structure may include first plugs PLG1 connected to the first stack structure ST1, first connecting lines CL1 connected to the first plugs PLG1, second plugs PLG2 connected to the second stack structure ST2, second connecting lines CL2 connected to the second plugs PLG2, third plugs PLG3 connected to the third stack structure ST3, and third connecting lines CL3 connected to the third plugs PLG3.

In some embodiments, the first plugs PLG1 may penetrate the first to third interlayer insulating layers 110, 120 and 130 in in the first contact region CTR1. The first plugs PLG1 may be respectively connected to the end portions of the first electrodes EL1 disposed at different heights from each other. The first connecting lines CL1 may be connected to the first plugs PLG1, respectively. The first connecting lines CL1 may be disposed at the same distance from the top surface of the substrate 10 in the first contact region CTR1.

The second plugs PLG2 may penetrate the second and third interlayer insulating layers 120 and 130 in in the second contact region CTR2. The second plugs PLG2 may be respectively connected to the end portions of the second electrodes EL2 disposed at different heights from each other. The second connecting lines CL2 may be connected to the second plugs PLG2, respectively. The second connecting lines CL2 may be disposed at the same distance from the top surface of the substrate 10 in the second contact region CTR2.

The third plugs PLG3 may be disposed in the first contact region CTR1 to be adjacent to the cell array region CAR. The third plugs PLG3 may penetrate the third interlayer insulating layer 130 and may be connected to the end portions of the third electrodes EL3, respectively. The third connecting lines CL3 may be connected to the third plugs PLG3, respectively. The third connecting lines CL3 may be disposed at the same distance from the top surface of the substrate 10 in the first contact region CTR1.

In the event that the cell array structure including the first to third stack structures ST1, ST2 and ST3 is disposed on the substrate 10 of the cell array region CAR, the contact pads CP1, CP2 and CP3 in the peripheral circuit region PERI may be disposed at the same vertical level as the second stack structure ST2. In other words, the first interlayer insulating layer 110 may be disposed on the substrate 10 of the peripheral circuit region PERI to cover the peripheral logic structure, and the second and third interlayer insulating layers 120 and 130 may be sequentially stacked on the first interlayer insulating layer 110 in the peripheral circuit region PERI. Here, the first interlayer insulating layer 110 may include lower contact plugs LCP1, LCP2 and LCP3 electrically connected to the peripheral logic structure, and the second interlayer insulating layer 120 may include the contact pads CP1, CP2 and CP3 connected to the lower contact plugs LCP1, LCP2 and LCP3. The third interlayer insulating layer 130 may cover the top surfaces of the contact pads CP1, CP2 and CP3. The third interlayer insulating layer 130 may include upper contact plugs UCP1, UCP2 and UCP3 connected to the contact pads CP1, CP2 and CP3. In other words, the top surfaces of the contact pads CP1, CP2 and CP3 may be lower than a top surface of the stack structure of the cell array region CAR. Additionally, the top surfaces of the contact pads CP1, CP2 and CP3 may be lower than the top surfaces of the first to third plugs PLG1, PLG2 and PLG3 of the contact region.

Figure 18:
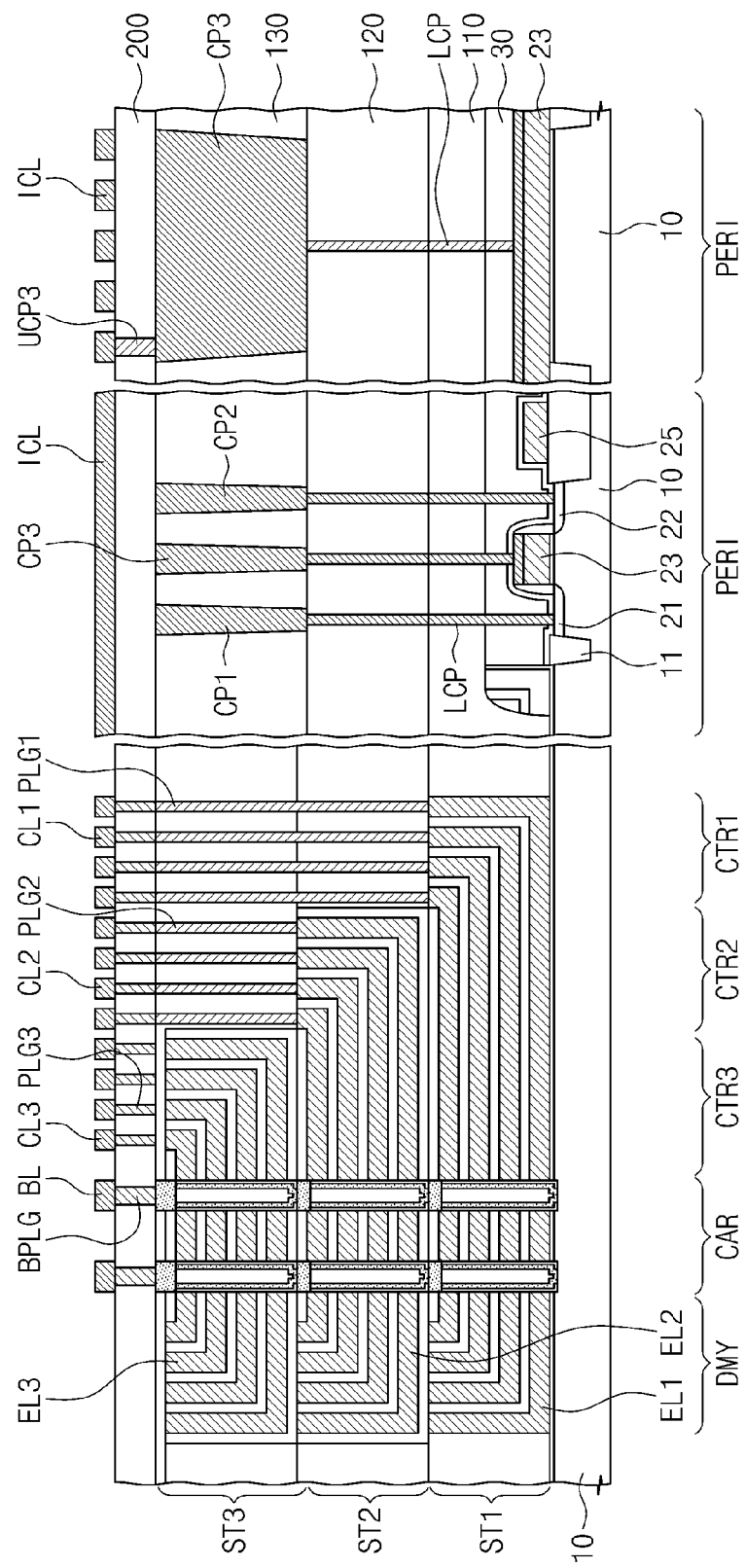

According to the embodiment illustrated in FIG. 18, a substrate 10 may include a cell array region CAR, a peripheral circuit region PERI, and a contact region surrounding the cell array region CAR between the cell array region CAR and the peripheral circuit region PERI. In some embodiments, the contact region may include a first contact region CTR1, a second contact region CTR2, and a third contact region CTR3. The first contact region CTR1 may be adjacent to the peripheral circuit region PERI, and the third contact region CTR3 may be adjacent to the cell array region CAR. The second contact region CTR2 may be disposed between the first and third contact regions CTR1 and CTR3. Additionally, the substrate 10 may further include a dummy region DMY adjacent to the cell array region CAR and opposite to the contact region.

A first stack structure ST1, a second stack structure ST2 and a third stack structure ST3 may be sequentially stacked on the substrate 10 of the cell array region CAR. As described with reference to FIG. 17, the first stack structure ST1 may include vertically stacked first electrodes EL1 and the second stack structure ST2 may include vertically stacked second electrodes EL2. The third stack structure ST3 may include vertically stacked third electrodes EL3.

In the present embodiment, each of the first to third electrodes EL1, EL2 and EL3 may have an interconnecting portion parallel to the top surface of the substrate 10 and a contact portion perpendicular to the top surface of the substrate 10. The contact portions of the first to third electrodes EL1, EL2 and EL3 may be disposed at different horizontal positions from each other in the contact region. The contact portions of the first electrodes EL1 may be disposed in the first contact region CTR1 and may have top surfaces exposed at a substantially same height. The contact portions of the second electrodes EL2 may be disposed in the second contact region CTR2 and may have top surfaces exposed at a substantially same height. The contact portions of the third electrodes EL3 may be disposed in the third contact region CTR3 and may have top surfaces exposed at a substantially same height.

First plugs PLG1 may be connected to the contact portions of the first electrodes EL1 in the first contact region CTR1. Vertical lengths of the first plugs PLG1 may be substantially equal to each other. Second plugs PLG2 may be connected to the contact portions of the second electrodes EL2 in the second contact region CTR2. Vertical lengths of the second plugs PLG2 may be substantially equal to each other. Third plugs PLG3 may be connected to the contact portions of the third electrodes EL3 in the third contact region CTR3. Vertical lengths of the third plugs PLG3 may be substantially equal to each other.

Additionally, top surfaces of the first and second plugs PLG1 and PLG2 may be substantially coplanar with each other. When the second plugs PLG2 of the cell array region CAR are formed in the above cell array structure, the contact pads CP1, CP2 and CP3 of the peripheral circuit region PERI may be formed. Thus, the top surfaces of the contact pads CP1, CP2 and CP3 may be substantially coplanar with the top surfaces of the first and second plugs PLG1 and PLG2. The top surface of the upper contact plug UCP3 of the peripheral circuit region PERI may be substantially coplanar with top surfaces of the third plugs PLG3.

FIGS. 19 to 29 are cross-sectional views taken along lines I-I', II-II' and III-III' of FIG. 14 to illustrate a method for fabricating a semiconductor memory device according to some embodiments.

Figure 19:
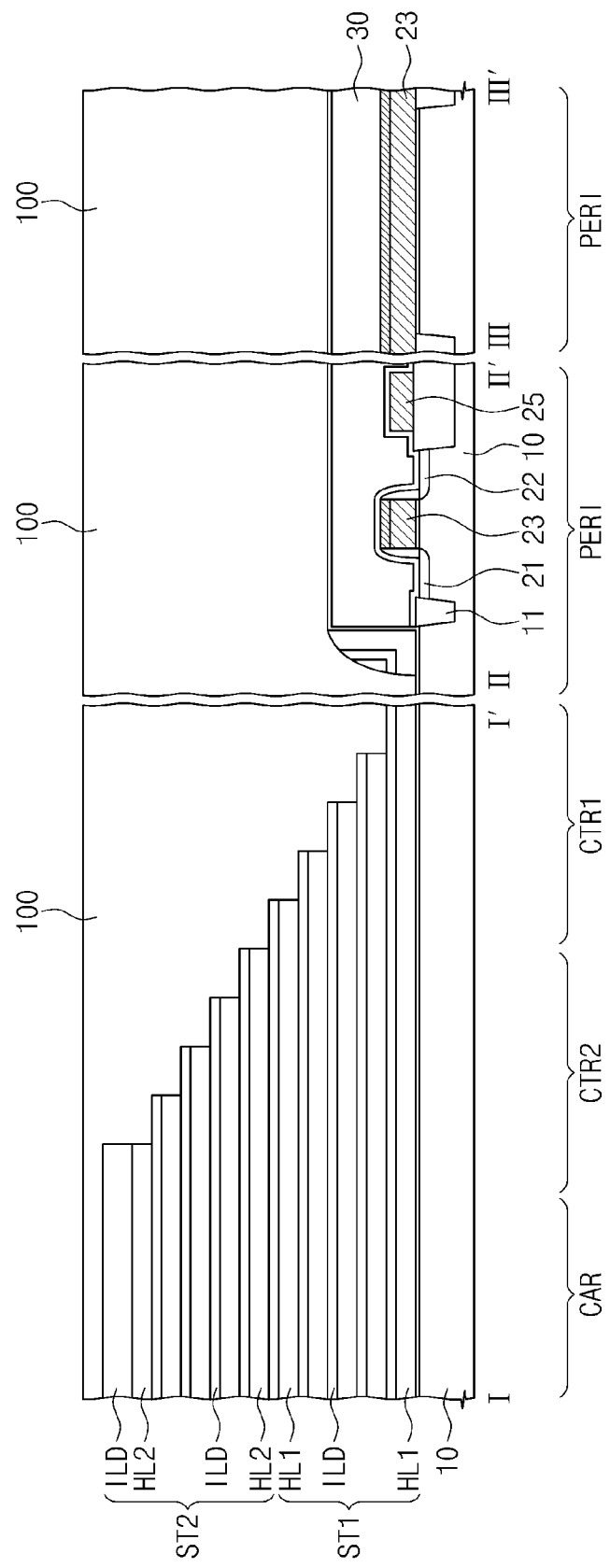
FIGS. 19 to 29 are cross-sectional views taken along lines I-I', II-II' and III-III' of FIG. 12 to illustrate methods for fabricating semiconductor memory devices according to some embodiments.

Referring to FIG. 19, a substrate 10 may include a cell array region CAR, a peripheral circuit region PERI, and a contact region therebetween. In some embodiments, the contact region may include a first contact region CTR1 adjacent to the peripheral circuit region PERI and a second contact region CTR2 adjacent to the cell array region CAR. The substrate 10 of the peripheral circuit region PERI may include an active region ACT of FIG. 12 defined by a device isolation layer 11.

The substrate 10 may be a substrate having a semiconductor property (e.g., a silicon wafer), an insulating substrate (e.g., a glass substrate), or a semiconductor or conductor covered by an insulating material. For example, the substrate 10 may be a silicon wafer having a first conductivity type.

In some embodiments, a peripheral logic structure including peripheral circuits may be formed on the substrate 10 of the peripheral circuit region PERI. Forming the peripheral logic structure may include forming the lower and column decoders, the page buffer and the control circuits that are described with reference to FIG. 9. In some embodiments, peripheral transistors and a resistance pattern 25 constituting peripheral circuits may be formed on the substrate 10 of the peripheral circuit region PERI.

Forming the peripheral transistor may include forming a peripheral gate electrode 23 on the substrate 10 with a gate insulating layer therebetween, and forming source and drain dopant regions 21 and 22 in the active region at both sides of the peripheral gate electrode 23. Here, the peripheral gate electrode 23 may cross over the active region and may extend in a first direction. Additionally, when the peripheral gate electrode 23 is formed, the resistance pattern 25 may also be formed on the substrate 10 of the peripheral circuit region PERI. The resistance pattern 25 may be formed of the same material as the peripheral gate electrode 23. Here, the peripheral gate electrode 23 may be used as a gate control signal for gate electrodes of a MOS transistor in the peripheral circuit, and the source and drain dopant regions 21 and 22 may be used as source and drain electrodes of the MOS transistor. The peripheral gate electrode 23 may include poly-silicon doped with dopants and/or a metal material. The gate insulating layer may include a silicon oxide layer formed by a thermal oxidation process.

Next, a peripheral insulating pattern 30 may be formed on the substrate 10 having the peripheral transistors and the resistance pattern 25 in the peripheral circuit region PERI. A peripheral insulating layer may be formed on an entire top surface of the substrate 10 having the peripheral transistors and the resistance pattern 25. Subsequently, the peripheral insulating layer may be patterned to form the peripheral insulating pattern 30. At this time, the insulating layer in the cell array region CAR and the first and second contact regions CTR1 and CTR2 may be removed to expose the substrate 10 of the cell array region CAR and the first and second contact regions CTR1 and CTR2. Before the peripheral insulating layer is formed, an etch stop layer may be formed to conformally cover the peripheral gate electrode 23, the resistance pattern 25 and a top surface of the substrate 10. The peripheral insulating pattern 30 may be formed of at least one of silicon oxide, silicon nitride, silicon oxynitride, silicon carbide and silicon oxycarbide. The etch stop layer may be formed of an insulating material having an etch selectivity with respect to the peripheral insulating pattern 30.

Referring continuously to FIG. 19, a stack structure may be formed on the substrate 10 of the cell array region CAR.

In some embodiments, the stack structure may include a first stack structure ST1 including a plurality of first horizontal layers HL1 stacked on the substrate 10, and a second stack structure ST2 including a plurality of second horizontal layers HL2 stacked on the first stack structure ST1. Insulating layers ILD may be disposed between the first horizontal layers HL1 and between the second horizontal layers HL2. In some embodiments, a height of the stack structure may be greater than a height of the peripheral logic structure. For example, the height of the stack structure may be equal to or greater than about twice the height of the peripheral logic structure. In other words, a top surface of the peripheral logic structure may be lower than a top surface of the stack structure.

In some embodiments, the stack structure may have a step-wise structure in the contact region. In other words, the stack structure may have a sloped profile in the contact region. That is, areas of the insulating layers ILD and first and second horizontal layers HL1 and HL2 may become reduced as a distance from the top surface of the substrate 10 increases. In other words, distances between the peripheral circuit region PERI and sidewalls of the first and second horizontal layers HL1 and HL2 may increase as heights of the horizontal layers HL1 and HL2 increase from the top surface of the substrate 10.

In more detail, end portions of the first horizontal layers HL1 and the insulating layers ILD of the first stack structure ST1 may be disposed in the first contact region CTR1. The end-sidewalls of the first horizontal layers HL1 may be disposed at different horizontal positions from each other in the first contact region CTR1. End portions of the second horizontal layers HL2 and the insulating layers ILD of the second stack structure ST2 may be disposed in the second contact region CTR2. The end-sidewalls of the second horizontal layers HL2 may be disposed at different horizontal positions from each other in the second contact region CTR2. Horizontal distances between the end-sidewalls of the first horizontal layers HL1 may be substantially uniform. Likewise, horizontal distances between the end-sidewalls of the second horizontal layers HL2 may be substantially uniform.

Forming the stack structure may include forming a thin layer-structure including horizontal layers and insulating layers alternately stacked on the substrate 10, and patterning the thin layer-structure. Patterning the thin layer-structure may include alternately and repeatedly performing a process of reducing a horizontal area of a mask pattern (not shown) and a process of anisotropically etching the thin layer-structure. Since the processes are alternately and repeatedly performed, end portions of the insulating layer ILD may be sequentially exposed in the contact region from a lowermost one thereof. Alternatively, end portions of the first and second horizontal layers HL1 and HL2 may be sequentially exposed in the contact region from a lowermost one thereof.

When the stack structure is formed, portions of the insulating layers ILD and the first horizontal layers HL1 may remain on the sidewall of the peripheral insulating pattern 30. In other words, a portion of the thin layer-structure may not be etched in the anisotropic etching processes but may remain in a spacer-shape on the sidewall of the peripheral insulating pattern 30.

In some embodiments, thicknesses of the first and second horizontal layers HL1 and HL2 may be equal to each other. Alternatively, some of the thicknesses of the first and second horizontal layers HL1 and HL2 may be different from those of others of the first and second horizontal layers HL1 and HL2. Additionally, thicknesses of the insulating layers ILD may be equal to or each other. Alternatively, some of the thicknesses of the insulating layers ILD may be different from those of others of the insulating layers ILD.

In some embodiments, the first and second horizontal layers HL1 and HL2 of the stack structure may be used as the electrodes EL1, EL2 and EL3 described with reference to FIGS. 12 to 18. In other embodiments, the horizontal layers HL1 and HL2 may be used as sacrificial layers defining spaces in which the electrodes EL1, EL2 and EL3 of FIGS. 12 to 18 will be disposed. If the first and second horizontal layers HL1 and HL2 are used as the sacrificial layers, the first and second horizontal layers HL1 and HL2 may be formed of a material having an etch selectivity with respect to the insulating layers ILD in a wet etching process. For example, the insulating layers ILD may include at least one of silicon oxide and silicon nitride. The first and second horizontal layers HL1 and HL2 may be formed of the same material. For example, the first and second horizontal layers HL1 and HL2 may include a material that is different from the insulating layers ILD and is selected from a group consisting of silicon, silicon oxide, silicon carbide and silicon nitride.

In some embodiments, the insulating layers ILD may be formed of silicon oxide layers. Each of the insulating layers ILD may further include a high-k dielectric layer in order to easily generate the inversion region described with reference to FIG. 11A. Here, the high-k dielectric layer may include at least one of high-dielectric materials (e.g., silicon nitride and silicon oxynitride) having a dielectric constant higher than that of silicon oxide.

After the peripheral logic structure and the stack structure are formed as described above, a filling insulating layer 100 may be formed on the substrate 10 of the peripheral circuit region PERI and the contact region. The filling insulating layer 100 may be deposited on the structures in the cell array regions CAR and the peripheral circuit region PERI by a deposition technique. The filling insulating layer 100 may be deposited to have a thickness greater than a vertical distance between the top surface of the peripheral logic structure and the top surface of the stack structure. The filling insulating layer 100 formed by the deposition technique may have a height difference between the cell array region CAR and the peripheral circuit region PERI. Thus, after the filling insulating layer 100 is deposited, a planarization process may be performed on the filling insulating layer 100 in order to remove the height difference between the cell array region CAR and the peripheral circuit region PERI. In other words, the filling insulating layer 100 may have a planarized top surface.

For example, the filling insulating layer 100 may include a high density plasma (HDP) oxide layer, a tetra ethyl ortho silicate (TEOS) layer, a plasma enhanced tetra ethyl ortho silicate (PE-TEOS) layer, a $O_3$-tetra ethyl ortho silicate ($O_3$-TEOS) layer, an undoped silicate glass (USG) layer, a phosphor silicate glass (PSG) layer, a borosilicate glass (BSG) layer, a borophosphosilicate glass (BPSG) layer, a fluoride silicate glass (FSG) layer, a spin-on-glass (SOG) layer, Tonen SilaZene (TOSZ) layer, or any combination thereof. In other embodiments, the filling insulating layer 100 may include silicon nitride, silicon oxynitride, or a low-k dielectric material having a low dielectric constant.

Figure 20:
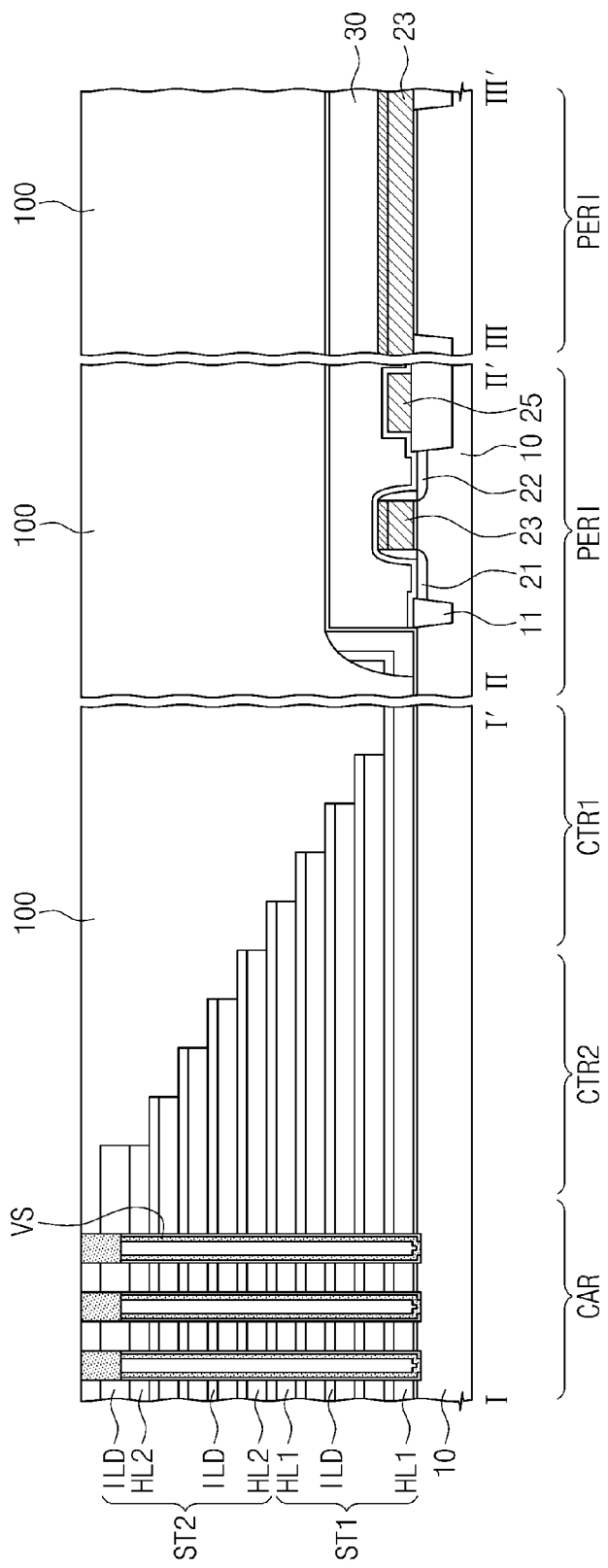

Referring to FIG. 20, vertical structures VS and a data storage layer may be formed on the substrate 10 of the cell array region CAR. The vertical structures VS may penetrate the stack structure. The vertical structures VS may include a semiconductor material or a conductive material.

In some embodiments, forming the vertical structures VS may include forming openings penetrating the stack structure and forming semiconductor patterns in the openings, respectively.

A mask pattern (not shown) may be formed on the stack structure and then the stack structure may be anisotropically etched using the mask pattern (not shown) as an etch mask to form the openings. In the anisotropic etching process, the top surface of the substrate 10 under the openings may be over-etched. Thus, the top surface of the substrate 10 exposed by the openings may be recessed by a predetermined depth. Additionally, a lower width of the opening may be smaller than an upper width of the opening due to the anisotropic etching process. The openings may be arranged in a line or in a zigzag form along one direction.

In some embodiments, forming the semiconductor patterns in the openings may include forming semiconductor spacers SP2 exposing the substrate 10 and covering sidewalls of the openings, and forming semiconductor body portions SP1 connected to the substrate 10 in the openings, as illustrated in FIG. 11A. The semiconductor patterns may include silicon, germanium, or any mixture thereof. The semiconductor patterns may be doped. Alternatively, the semiconductor patterns may be intrinsic semiconductor patterns that are not doped. The semiconductor patterns may have a crystal structure including at least one of a single-crystalline structure, an amorphous structure, and a poly-crystalline structure. Each of the semiconductor patterns may include a hollow pipe-shape or a hollow macaroni-shape. In this case, a bottom end of the semiconductor pattern may be closed. The vertical structure VS may have a conductive pad disposed in a top end of the vertical structure VS. The conductive pad may be a dopant region doped with dopants or a conductive material.

A portion of the data storage layer may be formed before the formation of the vertical structures VS. In other words, the vertical pattern VP of the data storage layer in FIG. 11A may be formed before the formation of the vertical structures VS. The vertical pattern VP may consist of one thin layer or a plurality of thin layers. In some embodiments, the vertical pattern VP may include a tunnel insulating layer of a charge trap-type flash memory transistor. The tunnel insulating layer may include at least one of materials having an energy band gap greater than that of a charge storage layer. For example, the tunnel insulating layer may include a silicon oxide layer. Additionally, the vertical pattern VP may include the charge storage layer of the charge trap-type flash memory transistor. The charge storage layer may include at least one of trap site-rich insulating layer (e.g., a silicon nitride layer), a floating gate electrode, or an insulating layer including conductive nano dots.

Figure 21:
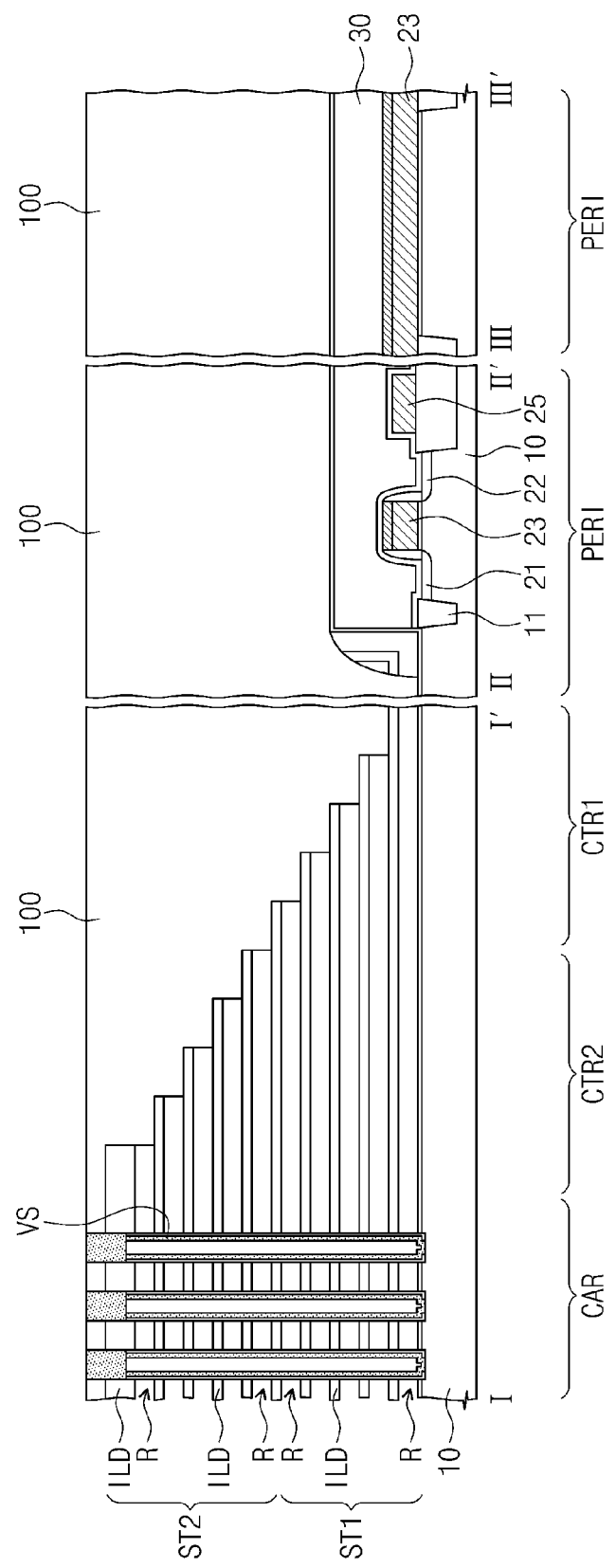
Figure 22:
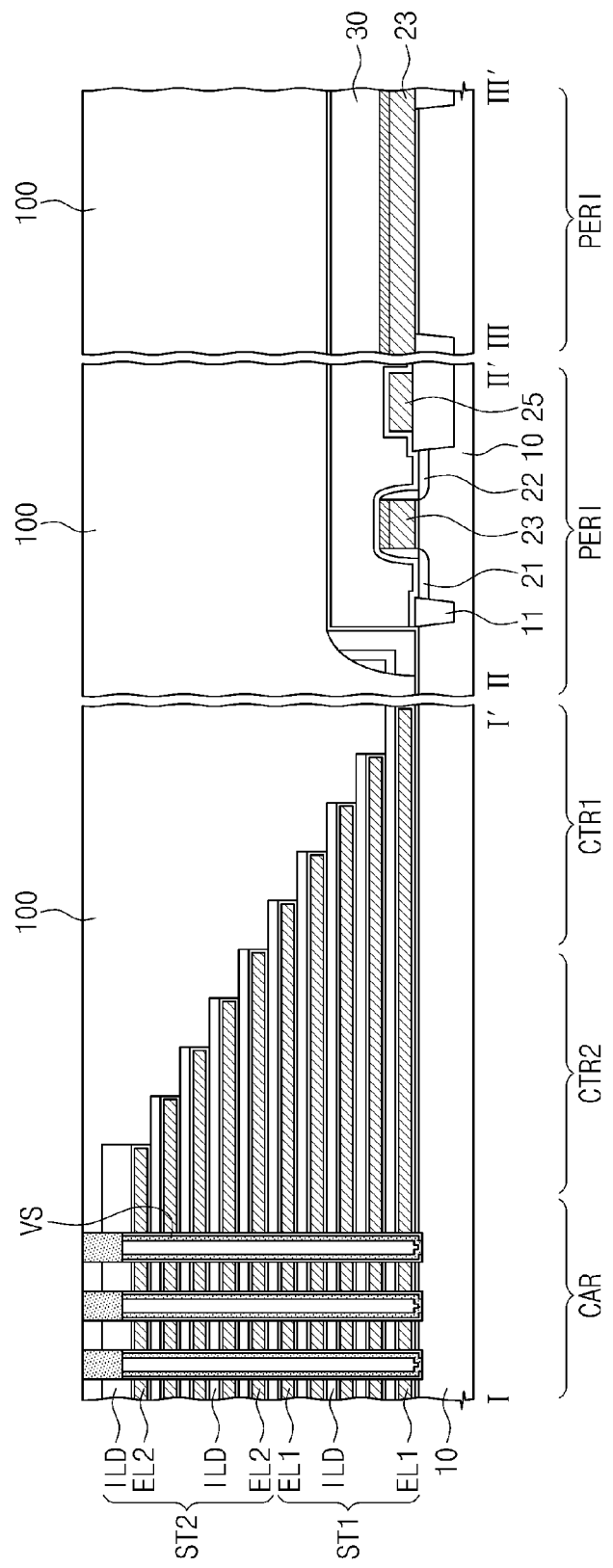

If the first and second horizontal layers HL1 and HL2 are formed of an insulating material, a process of replacing the first and second horizontal layers HL1 and HL2 with conductive patterns may be performed after the formation of the vertical structures VS, as illustrated in FIGS. 21 and 22.

Referring to FIG. 21, the first and second horizontal layers HL1 and HL2 may be removed to form recess regions R between the insulating layers ILD. The first and second horizontal layers HL1 and HL2 may be isotropically etched using an etch recipe having an etch selectivity with respect to the insulating layers ILD and the vertical structures VS to form the recess regions R. Here, the first and second horizontal layers HL1 and HL2 may be completely removed by the isotropic etching process. For example, if the first and second horizontal layers HL1 and HL2 are silicon nitride layers and the insulating layers ILD are silicon oxide layers, the first and second horizontal layers HL1 and HL2 may be isotropically etched using an etching solution including phosphoric acid.

Referring to FIG. 22, an insulating pattern and conductive patterns may be formed. The insulating pattern may cover inner surfaces of the recess regions R and the conductive patterns may be formed to fill the recess regions R. The insulating pattern covering the inner surfaces of the recess regions R may correspond to the horizontal pattern HP of the data storage layer described with reference to FIG. 11A. In some embodiments, the horizontal pattern HP may consist of one thin layer or a plurality of thin layers. In some embodiments, the horizontal pattern HP may include a blocking insulating layer of the charge trap-type flash memory transistor. The blocking insulating layer may include at least one of materials having an energy band gap smaller than that of the tunnel insulating layer and greater than that of the charge storage layer. For example, the blocking insulating layer may include at least one of high-k dielectric layers such has an aluminum oxide layer and a hafnium oxide layer.

In the present embodiment, forming the conductive patterns may include forming first electrodes EL1 constituting a stack structure ST1 in the recess regions formed by the removal of the first horizontal layers, and forming second electrodes EL2 constituting a second structure ST2 in the recess regions formed by the removal of the second horizontal layers.

Figure 23:
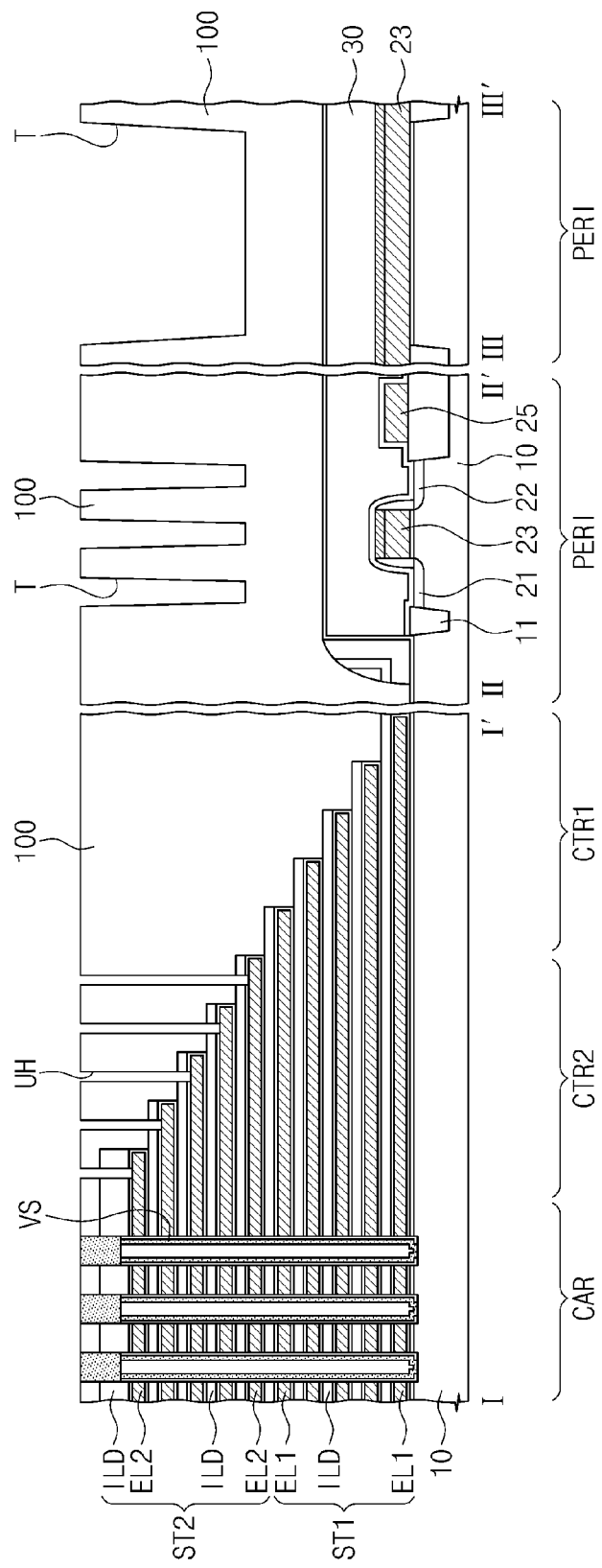

Referring to FIG. 23, a first patterning process may be performed on the filling insulating layer 100 to form upper contact holes UH of the second contact region CTR2 and peripheral trenches T of the peripheral circuit region PERI. In the first patterning process, an etch mask pattern (not shown) may be formed on the filling insulating layer 100 and then the filling insulating layer 100 may be anisotropically etched.

Since the second stack structures ST2 has the stepwise structure in the second contact region CTR2 when the upper contact holes UH are formed, the upper contact holes UH may locally expose the second electrodes EL2 disposed at different levels from each other. In other words, etch-depths of the upper contact holes UH may be different from each other.

In some embodiments, the peripheral trenches T may include a first peripheral trench over the source dopant region 21, a second peripheral trench over the drain dopant region 22, and a third peripheral trench over the peripheral gate electrode 23.

The peripheral trenches T of the peripheral circuit region PERI may extend in parallel to the peripheral gate electrode 23 along the first direction and generally define a plate-like opening having a width notably less than the length and depth. A length of the peripheral trenches T in the first direction may be greater than a width of the active region in the first direction. Since the peripheral trenches T are formed along with the upper contact holes UH, an etch-depth of the peripheral trenches T may be greater than a minimum one of the etch-depths of the upper contact holes UH and smaller than a maximum one of the etch-depths of the upper contact holes UH. Additionally, a width of the peripheral trenches T may be greater than a width of the upper contact holes UH in the second direction.

Figure 24:
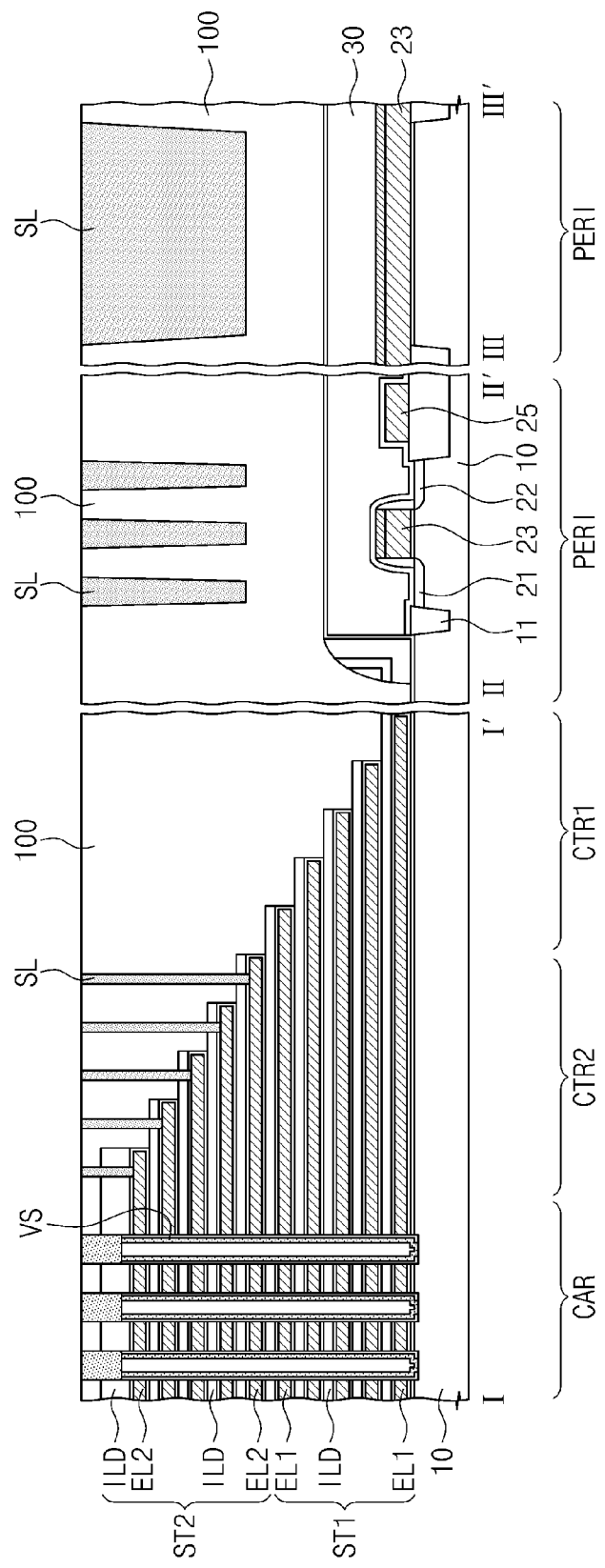

Referring to FIG. 24, a sacrificial layer SL may be formed to fill the upper contact holes UH and the peripheral trenches T. The sacrificial layer SL may be formed of a material that has an etch selectivity with respect to the filling insulating layer 100 and includes carbon as its main ingredient. For example, the sacrificial layer SL may be formed of a layer consisting of carbon and hydrogen, or a layer consisting of carbon, hydrogen and oxygen. In some embodiments, the sacrificial layer SL may be formed of a spin-on-hardmask (SOH) layer or an amorphous carbon layer (ACL). The SOH layer may include a carbon-based SOH layer or a silicon-based SOH layer. In other embodiments, the sacrificial layer SL may be formed of photoresist or amorphous silicon. The sacrificial layer SL may be formed using a spin coating method. An etch-back process may be performed on the sacrificial layer SL until the top surface of the filling insulating layer 100 is exposed.

Figure 25:
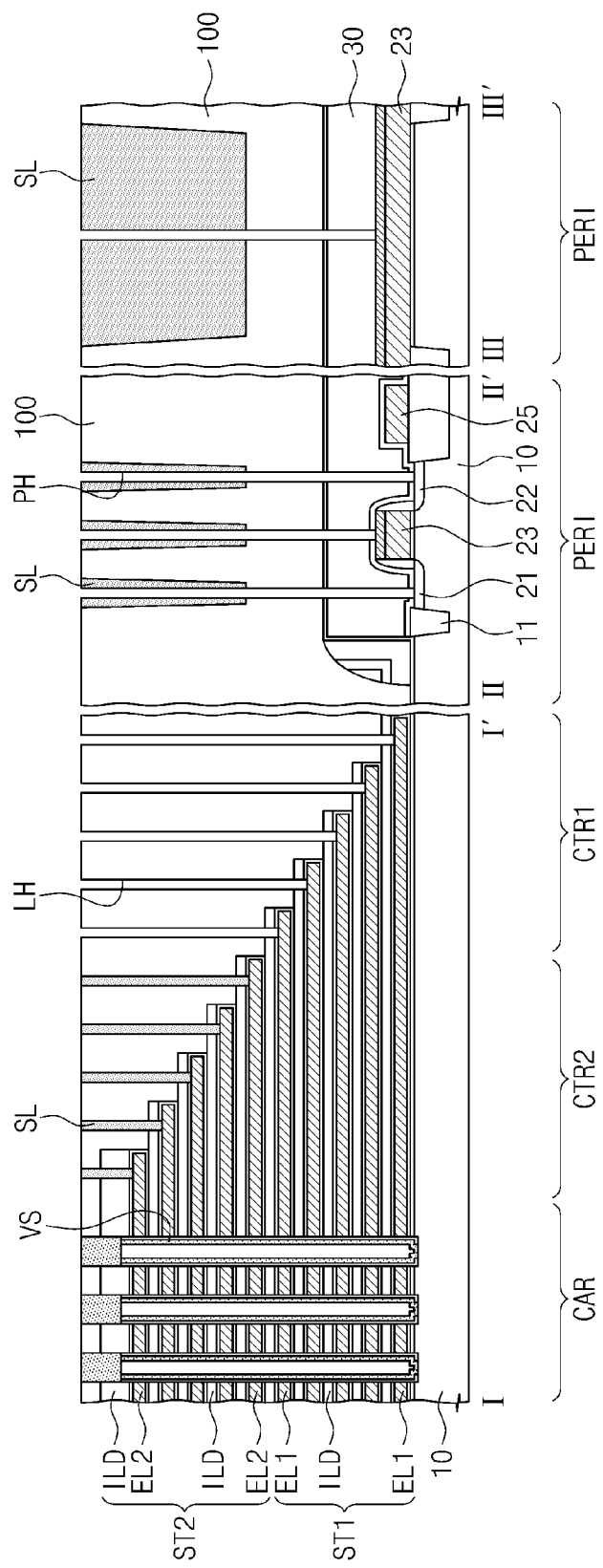

Referring to FIG. 25, a second patterning process may be performed on the filling insulating layer 100 to form lower contact holes LH of the first contact region CTR1 and peripheral contact holes PH of the peripheral circuit region PERI. In the second patterning process, an etch mask pattern (not shown) may be formed on the filling insulating layer 100 and then the filling insulating layer 100 may be anisotropically etched.

In the present embodiment, since the first stack structure ST1 has the stepwise structure in the first contact region CTR1 when the lower contact holes LH are formed, the lower contact holes LH may locally expose the first electrodes EL1 disposed at different levels from each other. In other words, etch-depths of the lower contact holes LH may be different from each other in the second patterning process.

In the second patterning process, the sacrificial layer SL and the filling insulating layer 100 may be sequentially anisotropically etched to form the peripheral contact holes PH in the peripheral circuit region PERI. In other words, the peripheral contact holes PH may penetrate the sacrificial layer SL filling the peripheral trenches T and the filling insulating layer 100 to expose portions of the peripheral logic structure. The peripheral contact holes PH may be connected to bottom surfaces of the peripheral trenches. The peripheral contact holes PH may be spaced apart from the device isolation layer 11 and may be disposed in the active region when viewed from a plan view. In some embodiments, the peripheral contact holes PH may include first, second and third peripheral contact holes. The first peripheral contact hole may penetrate the sacrificial layer SL disposed in the first peripheral trench and the filling insulating layer 100 to locally expose the source dopant region 21. The second peripheral contact hole may penetrate the sacrificial layer SL disposed in the second peripheral trench and the filling insulating layer 100 to locally expose the drain dopant region 22. The third peripheral contact hole may penetrate the sacrificial layer SL disposed in the third peripheral trench and the filling insulating layer 100 to locally expose the peripheral gate electrode 23. According to the embodiment illustrated in FIGS. 24 and 25, the lower contact holes LH and the peripheral contact holes PH may be formed after the formation of the upper contact holes UH and the peripheral trenches T. Alternatively, according to an embodiment illustrated in FIGS. 28 and 29, a first patterning process may be first performed to form the lower contact holes LH and the peripheral contact holes PH. Thereafter, the lower contact holes LH and the peripheral contact holes PH may be filled with a sacrificial layer SL and then a second patterning process may be performed to form the upper contact holes UH and the peripheral trenches T.

In some embodiments, the peripheral trenches T of the peripheral circuit region PERI may be formed simultaneously with the upper contact holes UH of the second contact region CTR2, so that bottom surfaces of the peripheral trenches T may be spaced apart from the peripheral logic structure. The etch-depth of the peripheral trenches T may be controlled between the minimum one and the maximum one of the etch-depths of the upper contact holes UH by a patterning technique.

Figure 26:
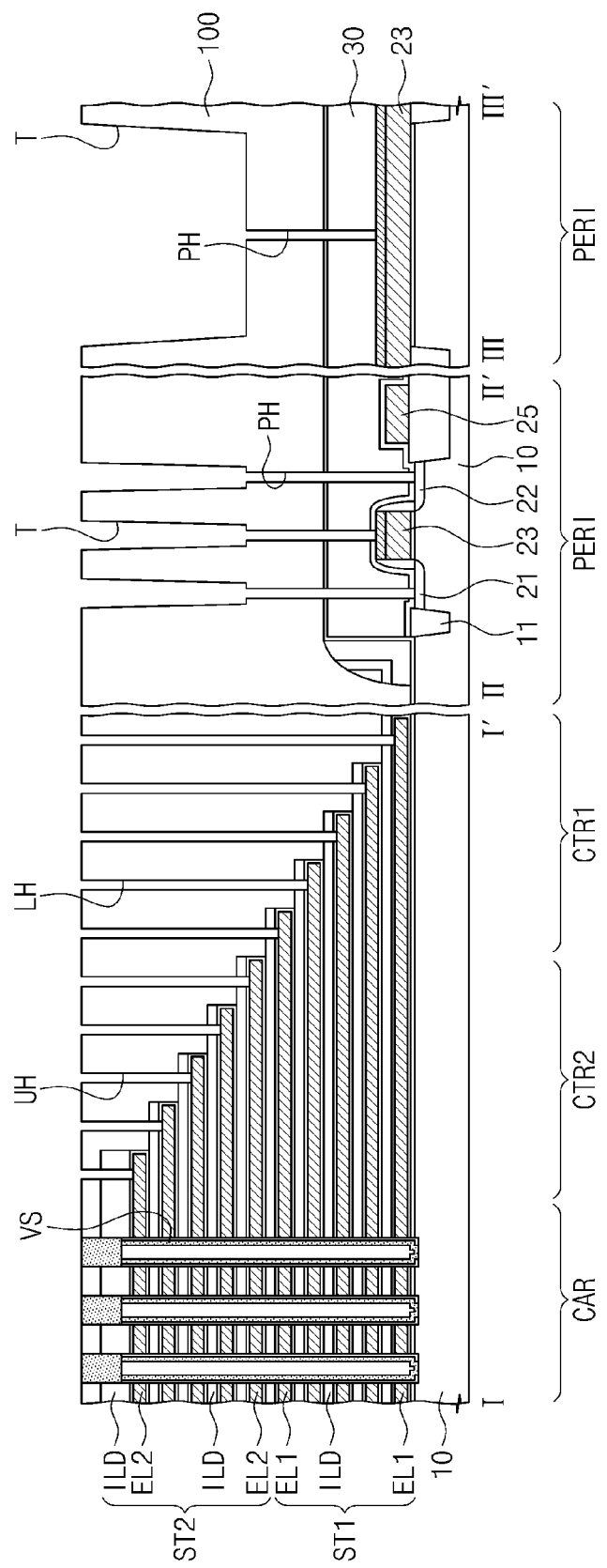

Referring to FIG. 26, the sacrificial layer SL may be removed from the upper contact holes UH and the peripheral trenches T. Thus, end portions of the second electrodes EL2 may be exposed by the upper contact holes UH and end portions of the first electrodes EL1 may be exposed by the lower contact holes LH in the contact region. At the same time, inner sidewalls of the first to third peripheral trenches may be exposed in the peripheral circuit region PERI. The first to third peripheral contact holes may be connected to the bottom surfaces of the first to third peripheral trenches T, respectively.

Figure 27:
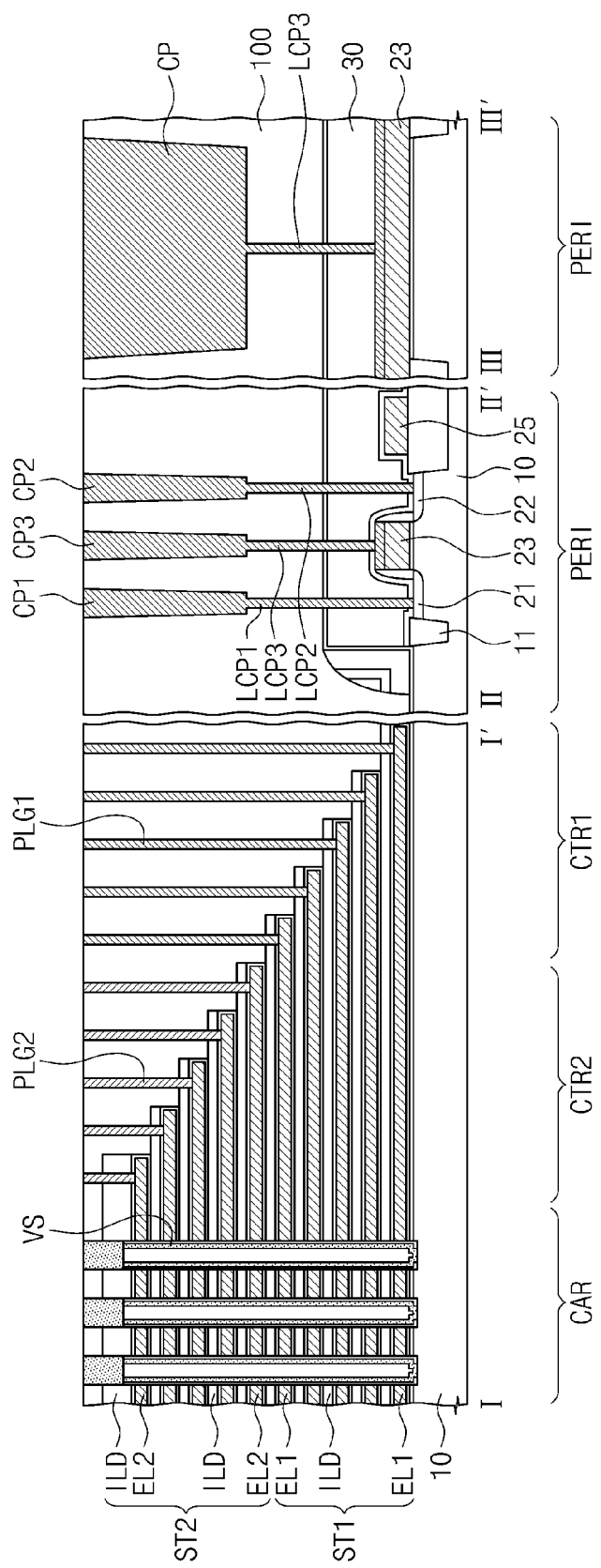
Figure 28:
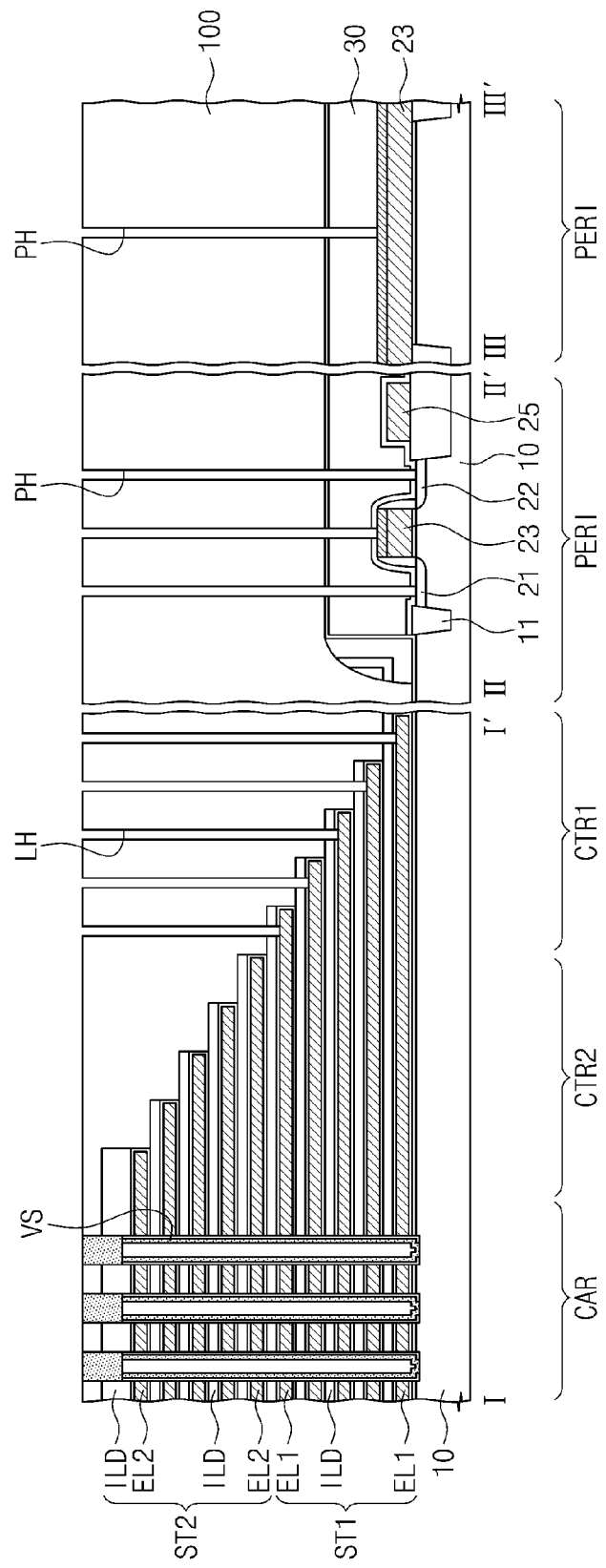
Figure 29:
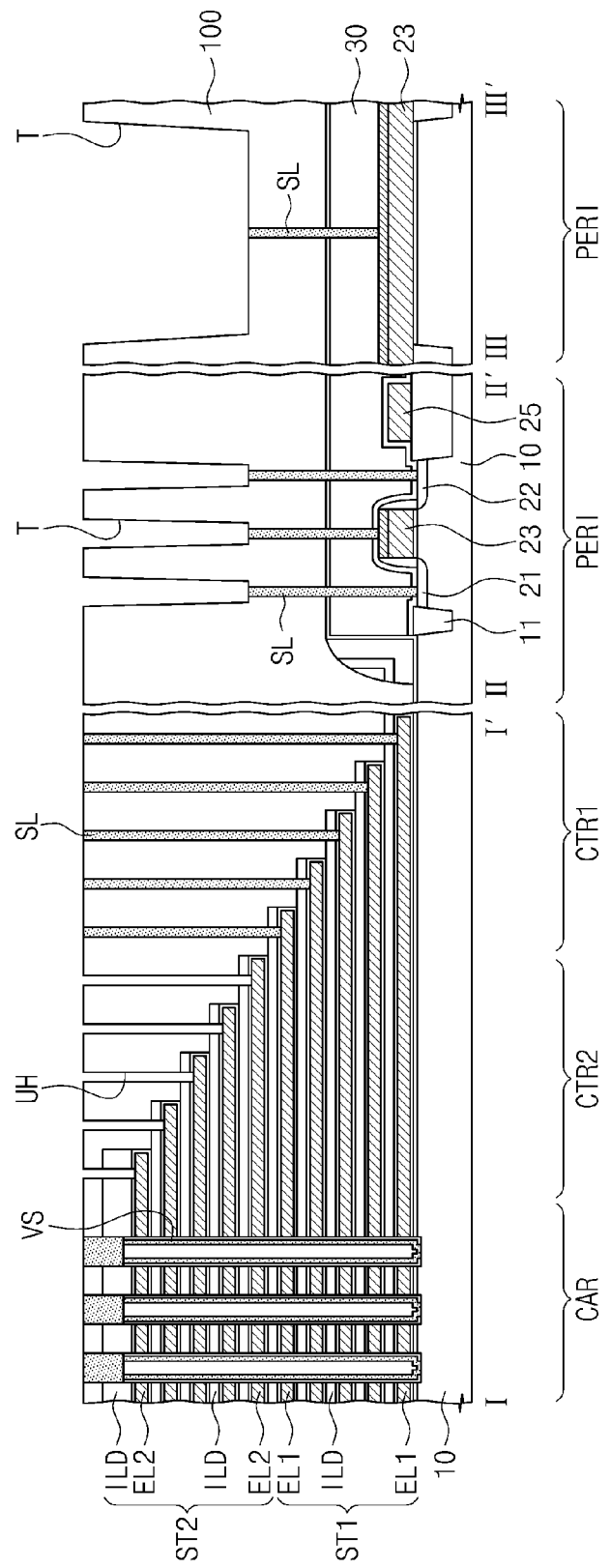

Referring to FIG. 27, first plugs PLG1 may be formed in the lower contact holes LH and second plugs PLG2 may be formed in the upper contact holes UH. At the same time, lower contact plugs LCP1, LCP2 and LCP3 may be formed on the peripheral contact holes PH and contact pads CP1, CP2 and CP3 may be formed in the peripheral trenches T.

A conductive material may be deposited to fill the upper and lower contact holes UH and LH of the cell array region CAR and the peripheral contact holes PH and the peripheral trenches T of the peripheral circuit region PERI and then a planarization process may be performed on the conductive material until the top surface of the filling insulating layer 100 is exposed, thereby forming the first and second plugs PLG1 and PLG2, the lower contact plugs LCP1, LCP2 and LCP3 and the contact pads CP1, CP2 and CP3. Thus, top surfaces of the first and second plugs PLG1 and PLG2 may be substantially coplanar with top surfaces of the contact pads CP1, CP2 and CP3. The contact pads CP1, CP2 and CP3 may include first, second and third contact pads CP1, CP2 and CP3, as described above.

In some embodiments, the first and second plugs PLG1 and PLG2, the lower contact plugs LCP1, LCP2 and LCP3 and the contact pads CP1, CP2 and CP3 may be formed to include a metallic material (e.g., tungsten). In this case, forming the first and second plugs PLG1 and PLG2, the lower contact plugs LCP1, LCP2 and LCP3 and the contact pads CP1, CP2 and CP3 may include sequentially forming a barrier metal layer (e.g., a metal nitride layer) and a metal layer (e.g., a tungsten layer).

As illustrated in FIG. 13, after an upper insulating layer 200 is formed on the filling insulating layer 100, bit line plugs BPLG may be formed to be connected to the vertical structures VS of the cell array region CAR. At the same time, first contacts CT1 may be formed to be connected to the first plugs PLG1 in the first contact region CTRL and second contacts CT2 may be formed to be connected to the second plugs PLG2 in the second contact region CTR2. Additionally, upper contact plugs UCP1, UCP2 and UCP3 may be formed to be connected to the first to third contact pads CP1, CP2 and CP3 in the peripheral circuit region PERI.

In some embodiments, since the first and second plugs PLG1 and PLG2 are formed simultaneously with the upper contact plugs UCP1, UCP2 and UCP3, top surfaces of the upper contact plugs UCP1, UCP2 and UCP3 may be substantially coplanar with the top surfaces of the first and second contacts CT1 and CT2.

The upper contact plugs UCP1, UCP2 and UCP3 may be connected to the contact pads CP1, CP2 and CP3 regardless of positions of the lower contact plugs LCP1, LCP2 and LCP3. In the present embodiment, forming the upper contact plugs UCP1, UCP2 and UCP3 may include forming a first upper contact plug UCP1 connected to the first contact pad CP1, forming a second upper contact plug UCP2 connected to the second contact pad CP2, and forming a third upper contact plug UCP3 connected to the third contact pad CP3.

Subsequently, a plurality of interconnections ICL may be formed on the upper insulating layer 200 of the peripheral circuit region PERI. The interconnections ICL may extend in the second direction crossing the peripheral gate electrode 23. The interconnections ICL may extend from the cell array region CAR into the peripheral circuit region PERI. In some embodiments, the plurality of interconnections ICL may electrically connect memory cells of the cell array region CAR to the peripheral logic structure of the peripheral circuit region PERI. Each of the interconnections ICL may be electrically connected to one of the first to third upper contact plugs UCP1, UCP2 and UCP3.

In some embodiments, bit lines BL of the cell array region CAR and first and second connecting lines CL1 and CL2 of the first and second contact regions CTR1 and CTR2 may be formed simultaneously with the plurality of interconnections ICL. A conductive layer may be deposited on the upper insulating layer 200 and then the deposited conductive layer may be patterned to form the bit lines BL, the first and second connecting lines CL1 and CL2 and the interconnections ICL of the peripheral circuit region PERI.

Figure 30:
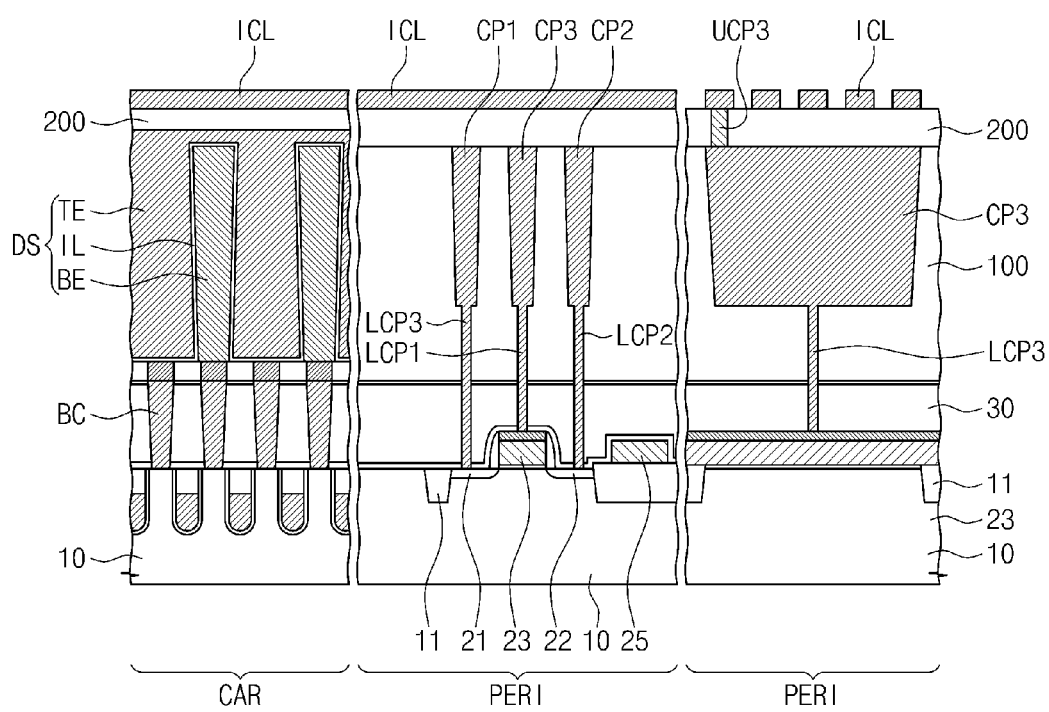
FIGS. 30 and 31 are cross-sectional views illustrating semiconductor memory devices according to still other embodiments.
Figure 31:
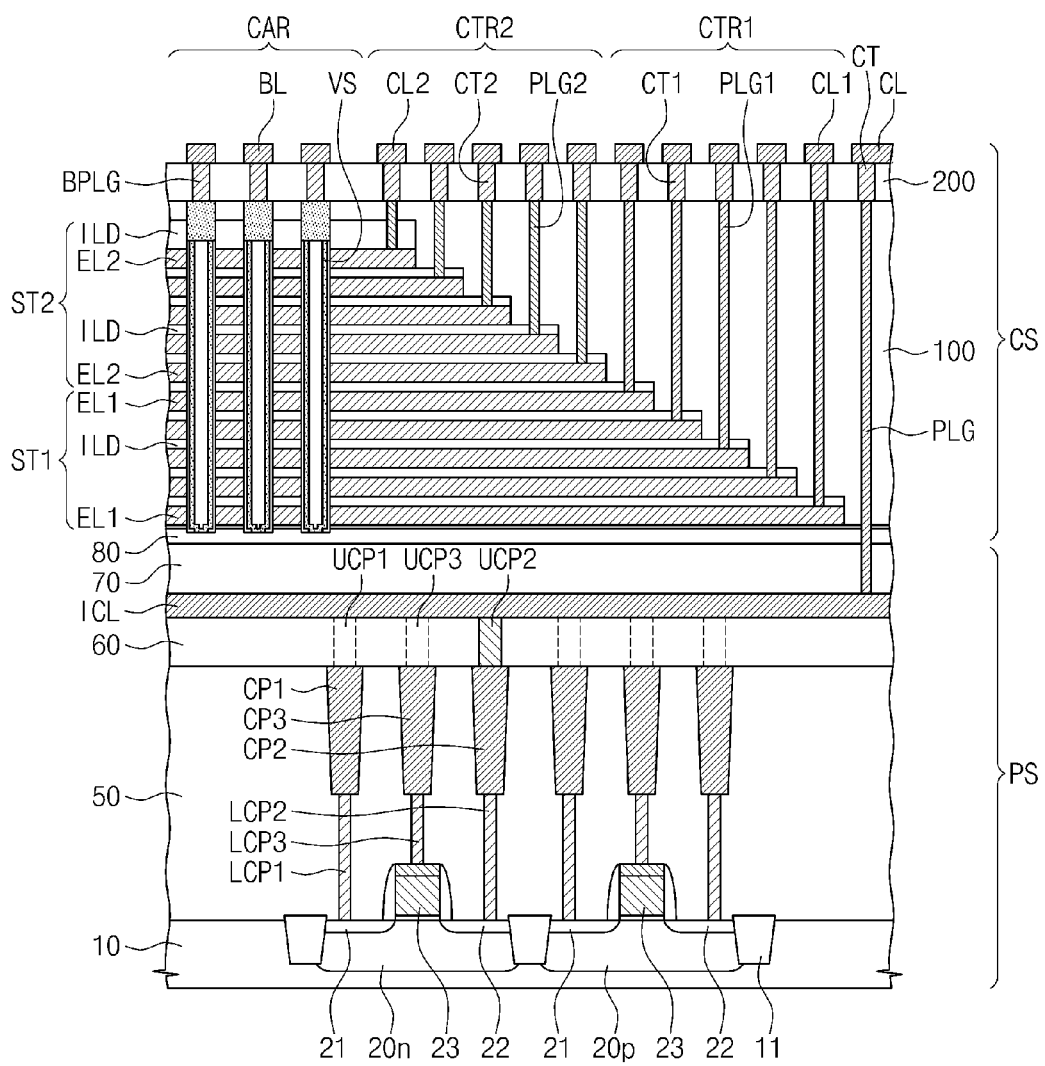

FIGS. 30 and 31 are cross-sectional views illustrating semiconductor memory devices according to still other embodiments.

According to the embodiment illustrated in FIG. 30, a substrate 10 may include a cell array region CAR and a peripheral circuit region PERI.

A cell array structure may be disposed on the substrate 10 of the cell array region CAR. The cell array structure may include a selection element and a data storage element DS. For example, the selection element may be a MOS transistor or a diode. The data storage element DS may be a capacitor or a variable resistor. Peripheral logic circuits controlling memory cells may be formed on the substrate of the peripheral circuit region PERI. For example, the peripheral logic circuits may include NMOS and PMOS transistors, diodes and resistors.

In some embodiments, word lines and bit lines for selecting the memory cells may be disposed on the substrate 10 of the cell array region CAR. The data storage elements DS may be formed at crossing points of the word lines and the bit lines, respectively. In some embodiments, the data storage element DS may be a capacitor including a lower electrode BE, an upper electrode TE, and a dielectric layer IL between the lower and upper electrodes BE and TE. The capacitor lower electrode BE may be electrically connected to the selection element through a contact plug BC. In some embodiments, the lower electrode BE of the capacitor may have a cylindrical shape or a pillar-shape. A width of the lower electrode BE may be progressively less from a bottom end toward a top end of the lower electrode BE.

A peripheral logic structure may be disposed on the substrate 10 of the peripheral circuit region PERI. The peripheral logic structure may include a peripheral gate electrode 23 extending in a first direction to cross an active region defined by a device isolation layer 11, source and drain dopant regions 21 and 22 formed in the active region ACT at both sides of the peripheral gate electrode 23, and a peripheral insulating pattern 30 covering the peripheral gate electrode 23 and the source and drain dopant regions 21 and 22, as described above. Additionally, the peripheral logic structure may further include a resistance pattern 25. The peripheral insulating pattern 30 may cover the peripheral gate electrode 23 and the resistance pattern 25. In the present embodiment, a top surface of the peripheral insulating pattern 30 may be lower than a top surface of the upper electrode TE disposed in the cell array region CAR.

A filling insulating layer covering the cell array structure and the peripheral logic structure may be formed on an entire top surface of the substrate 10, which in some embodiments such as FIG. 13 may be formed of multiple layers such as first interlayer insulating layer 100 and second insulating interlayer 200. A plurality of interconnections ICL may be disposed on the filling insulating layer 100 and 200 of the peripheral circuit region PERI. The plurality of interconnections ICL may extend from the peripheral circuit region PERI into the cell array region CAR.

As described with reference to FIGS. 1 to 7, the plurality of interconnections ICL may extend in parallel along a second direction perpendicular to the first direction and portions of the interconnections ICL may overlap with the active region when viewed from a plan view. In other words, the plurality of interconnections ICL may be disposed over one active region.

As described with reference to FIGS. 1 to 3, first to third contact pads CP1, CP2 and CP3 may be disposed between a height of a top surface of the peripheral gate electrode 23 and a height of bottom surfaces of the interconnections ICL in a vertical view. The first to third contact pads CP1, CP2 and CP3 may extend in the first direction and may be laterally spaced apart from each other in the second direction. The first to third contact pads CP1, CP2 and CP3 may be disposed over the active region. A length of the first to third contact pads CP1, CP2 and CP3 in the first direction may be greater than a width of the active region in the first direction. In the present embodiment, bottom surfaces of the first to third contact pads CP1, CP2 and CP3 may be disposed between a height of a top surface of the lower electrode BE and a height of a bottom surface of the lower electrode BE in a vertical view. Top surfaces of the first to third contact pads CP1, CP2 and CP3 may be substantially coplanar with the top surface of the lower electrode BE.

In some embodiments, the first contact pad CP1 may be electrically connected to the source dopant region 21 through a first lower contact plug LCP1. The second contact pad CP2 may be electrically connected to the drain dopant region 22 through a second lower contact plug LCP2. The third contact pad CP3 may be electrically connected to the peripheral gate electrode 23 through a third lower contact plug LCP3.

The first to third lower contact plugs LCP1, LCP2 and LCP3 may be disposed in the active region in a plan view regardless of positions of the interconnections ICL on the filling insulating layer 100 and 200. This can improve a margin of a formation process of the first to third lower contact plugs LCP1, LCP2 and LCP3 and provide for a more reliable, denser, and cost-effective design.

As described with reference to FIG. 1, each of the first to third contact pads CP1, CP2 and CP3 may be electrically connected to one of the interconnections ICL through an upper contact plug UCP1, UCP2 or UCP3. In some embodiments, first to third upper contact plugs UCP1, UCP2 and UCP3 may be disposed to correspond to the first to third contact pads CP1, CP2 and CP3, respectively. Positions of the first to third upper contact plugs UCP1, UCP2 and UCP3 may be changed depending on electrical connection relationship between the interconnections ICL and peripheral logic circuits.

According to an embodiment illustrated in FIG. 31, a peripheral circuit region may overlap with a cell array region when viewed from a plan view. In more detail, peripheral logic structures PS and a cell array structure CS may be sequentially stacked on a substrate 10. In other words, the peripheral logic structures PS may be disposed between the substrate 10 and the cell array structure CS in a vertical view.

In the present embodiment, the peripheral logic structures PS may include the row and column decoders 2 and 4 of FIG. 9, the page buffer 3 of FIG. 9 and control circuits, as described with reference to FIGS. 8 and 9. These peripheral circuits may be disposed on the substrate 10. Additionally, the substrate 10 may include an n-well region 20n doped with n-type dopants and a p-well region 20p doped with p-type dopants. Active regions may be defined in the n-well region 20n and the p-well region 20p by a device isolation layer 11.

The peripheral logic structures PS may include a peripheral gate electrode 23 extending in a first direction to cross over the active region, source and drain dopant regions 21 and 22 formed in the active region at both sides of the peripheral gate electrode 23, and a first interlayer insulating layer 50 covering the peripheral circuits. Additionally, the peripheral logic structures PS may include first to third lower contact plugs LCP1, LCP2 and LCP3, first to third contact pads CP1, CP2 and CP3, and a plurality of interconnections ICL disposed on a second interlayer insulating layer 60.

The plurality of interconnections ICL may extend in parallel along a second direction perpendicular to the first direction and portions of the interconnections ICL may overlap with the active region, as described above. In other words, the plurality of interconnections ICL may be disposed over one active region.

The first to third contact pads CP1, CP2 and CP3 may be disposed between a height of a top surface of the peripheral gate electrode 23 and a height of bottom surfaces of the interconnections ICL in a vertical view. The first to third contact pads CP1, CP2 and CP3 may extend in the first direction and may be spaced apart from each other in the second direction. The first to third contact pads CP1, CP2 and CP3 may be disposed over the active region. A length of the first to third contact pads CP1, CP2 and CP3 in the first direction may be greater than a width of the active region in the first direction.

The first contact pad CP1 may be electrically connected to the source dopant region 21 through the first lower contact plug LCP1. The second contact pad CP2 may be electrically connected to the drain dopant region 22 through the second lower contact plug LCP2. The third contact pad CP3 may be electrically connected to the peripheral gate electrode 23 through the third lower contact plug LCP3. The first to third lower contact plugs LCP1, LCP2 and LCP3 may be disposed in the active region in a plan view regardless of positions of the interconnections ICL on the second interlayer insulating layer 60. A lower filling insulating layer 70 may be disposed on the interconnections ICL. The lower filling insulating layer 70 may cover an entire surface of the peripheral logic structure PS.

As described with reference to FIGS. 1 to 7, each of the first to third contact pads CP1, CP2 and CP3 may be electrically connected to one of the interconnections ICL through the upper contact plug UCP1, UCP2 or UCP3. In some embodiments, the first to third upper contact plugs UCP1, UCP2 and UCP3 may be disposed to correspond to the first to third contact pads CP1, CP2 and CP3, respectively. Positions of the first to third upper contact plugs UCP1, UCP2 and UCP3 may be changed depending on electrical connection relationship between the interconnections ICL and peripheral logic circuits.

In the present embodiment, the cell array structure CS may include a semiconductor layer 80 disposed on the lower filling insulating layer 70. Additionally, the cell array structure CS may further include a stack structure including electrodes vertically stacked on the semiconductor layer 80, and vertical structures VS penetrating the stack structure. In the present embodiment, the semiconductor layer 80 may include silicon (Si), germanium (Ge), or any mixture thereof. The semiconductor layer 80 may be doped with dopants. Alternatively, the semiconductor layer 80 may include an undoped intrinsic semiconductor. The semiconductor layer 80 may have a crystal structure including at least one of a single-crystalline structure, an amorphous structure, and a poly-crystalline structure.

The stack structure may include a first stack structure ST1 including a plurality of first electrodes EL1 vertically stacked on the semiconductor layer 80, and a second stack structure ST2 including a plurality of second electrodes EL2 vertically stacked on the first stack structure ST1.

The stack structure may have a stepwise structure for electrical interconnection between the peripheral logic structure PS and the first and second electrodes EL1 and EL2. In other words, a vertical height of the stack structure may increase in a contact region as a distance from a cell array region CAR decreases. That is, the stack structure may have a sloped profile in the contact region.

In the present embodiment, the vertical structures VS may penetrate the first and second stack structures ST1 and ST2 and may be connected to the semiconductor layer 80. The vertical structures VS may include a semiconductor material or a conductive material.

An interconnection-structure for electrically connecting the cell array structure CS to the peripheral logic structure PS may be disposed in first and second contact regions CTR1 and CTR2. In the present embodiment, an upper filling insulating layer 100 may cover the stack structure on the semiconductor layer 80. First plugs PLG1 may penetrate the upper filling insulating layer 100 in the first contact region CTR1. The first plugs PLG1 may be connected to end portions of the first electrodes EL1, respectively. Second plugs PLG2 may penetrate the upper filling insulating layer 100 in the second contact region CTR2. The second plugs PLG2 may be connected to end portions of the second electrodes EL1, respectively. Additionally, an interconnecting plug PLG may be disposed in the contact region. The interconnecting plug PLG may penetrate the upper filling insulating layer 100 to be connected to the interconnection ICL of the peripheral logic structure PS.

Moreover, first connecting lines CL1 may be disposed on the upper filling insulating layer 100 of the first contact region CTR1. The first connecting lines CL1 may be electrically connected to the first plugs PLG1 through first contacts CT1. Second connecting lines CL2 may be disposed on the upper filling insulating layer 100 of the second contact region CTR2. The second connecting lines CL2 may be electrically connected to the second plugs PLG2 through second contacts CT2. Additionally, a contact CT and an interconnecting line CL may be disposed in the contact region. The contact CT and the interconnecting line CL may be electrically connected to the interconnecting plug PLG.

Figure 32:
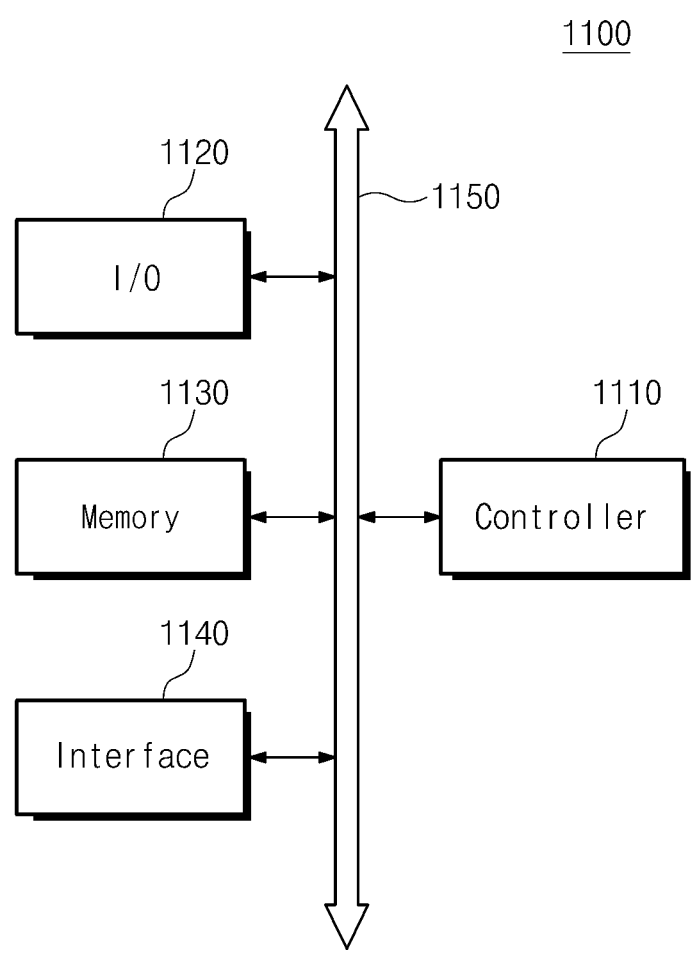
FIG. 32 is a schematic block diagram illustrating an example of a memory system according to embodiments.

FIG. 32 is a schematic block diagram illustrating an example of memory systems including semiconductor memory devices according to embodiments.

Referring to FIG. 32, a memory system 1100 may be applied to a personal digital assistant (PDA), a portable computer, a web tablet, a wireless phone, a mobile phone, a digital music player, a memory card, or other electronic products receiving or transmitting information data by wireless.

The memory system 1100 may include a controller 1110, an input/output (I/O) unit 1120 (e.g., a keypad, keyboard and/or a display device), a memory device 1130, an interface unit 1140, and a data bus 1150. At least two of the controller 1110, the I/O unit 1120, the memory device 1130 and the interface unit 1140 may communicate with each other through the data bus 1150.

The controller 1110 may include at least one of a microprocessor, a digital signal processor, a microcontroller, or another logic device having a similar function to any one thereof. The memory device 1130 may store commands executed through the controller 1110. The I/O unit 1120 may receive data or signals from the outside of the system 1100 or may transmit data or signals to the outside of the system 1100.

The memory device 1130 may include at least one of the non-volatile memory devices according to the embodiments described above. Additionally, the memory device 1130 may further include a random access volatile memory device and/or at least one of various kinds of other memory devices.

The interface unit 1140 may transmit data to a communication network or may receive data from a communication network.

Figure 33:
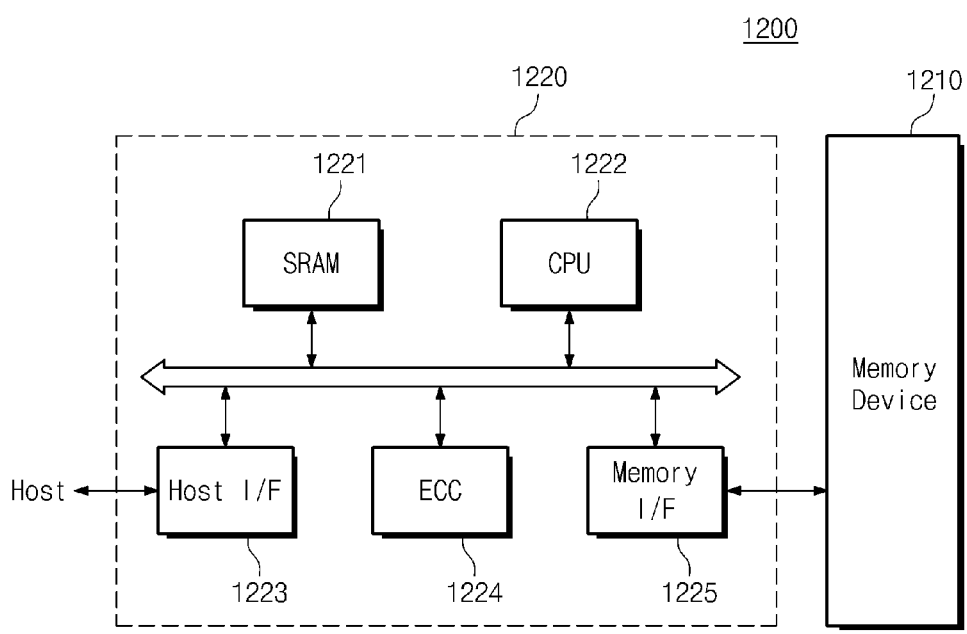
FIG. 33 is a schematic block diagram illustrating an example of a memory card according to embodiments.

FIG. 33 is a schematic block diagram illustrating an example of memory cards including semiconductor memory devices according to embodiments of the inventive concepts.

Referring to FIG. 33, a memory card 1200 for storing massive data may include a flash memory device 1210 implemented with embodiments of the inventions. The memory card 1200 according to the invention may include a memory controller 1220 that controls data communication between a host and the memory device 1210.

A static random access memory (SRAM) device 1221 is used as an operating memory of a central processing unit (CPU) 1222. A host interface unit 1223 may be configured to include a data communication protocol between the memory card 1200 and the host. An error check and correction (ECC) block 1224 may detect and correct errors of data which are read out from the flash memory device 1210. A memory interface unit 1225 may interface with the flash memory device 1210. The CPU 1222 may control overall operations for data exchange of the memory controller 1220. Even though not shown in the drawings, the memory card 1200 may further include a read only memory (ROM) device that stores code data to interface with the host.

Figure 34:
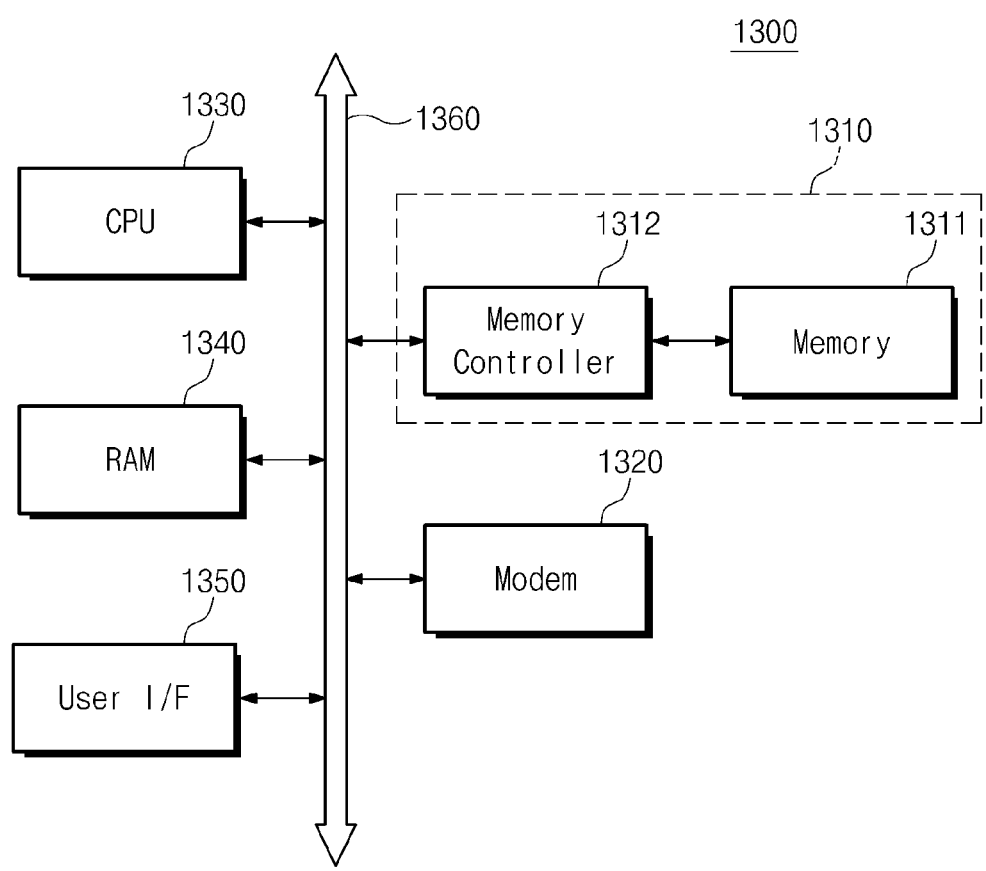
FIG. 34 is a schematic block diagram illustrating an example of an information processing system according to embodiments.

FIG. 34 is a schematic block diagram illustrating an example of information processing systems including semiconductor memory devices according to embodiments.

Referring to FIG. 34, a memory system 1310 embodying aspects of the inventions is installed in an information processing system 1300 such as a mobile device or a desk top computer. The information processing system 1300 may include a modem 1320, a central processing unit (CPU) 1330, a random access memory (RAM) device 1340, and a user interface unit 1350 that are electrically connected to the flash memory system 1310 through a system bus 1360. The memory system 1310 may implement embodiments as described previously. The memory system 1310 may store data processed by the CPU 1330 or data inputted from an external system. The memory system 1310 may be realized as a solid state disk (SSD). In this case, the information processing system 1300 may stably and reliably store massive data in the flash memory system 1310. The increase in reliability provided by embodiments of the inventions enables the memory system 1310 to conserve resources for error correction, such that a high speed data exchange function may be provided to the information processing system 1300. Although not shown in the drawings, the information processing system 1300 may further include an application chipset, a camera image processor (CIS), and/or an input/output device.

Additionally, embodiments of semiconductor memory devices and memory systems may be encapsulated using various packaging techniques. For example, the semiconductor memory devices and the memory system according to the inventions may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

According to embodiments, the lower contact plugs connected to the MOS transistor may be spaced apart from the device isolation layer and may be freely disposed in the active region in a plan view regardless of the electrical connection relationship between the MOS transistor and the interconnections. Thus, process margins may be increased when the lower contact plugs are formed.

The contact pad may be disposed on the lower contact plug and under the plurality of interconnections. The contact pad may cross the interconnections. Thus, the position of the upper contact plug may be freely changed according to the electrical connection between the MOS transistor and the interconnections.

As a result, even though an area of the active regions is reduced, a process margin may be improved during the formation of the contact plugs electrically connecting the interconnections to the MOS transistor. There are corresponding improvements in reliability, density, performance and cost.

While aspects of the inventions have been described with reference to example embodiments, it will be apparent to those skilled in the art that various changes and modifications may be made without departing from the spirit and scope of the disclosure. Therefore, it should be understood that the above embodiments and description are not limiting, but illustrative. Thus, the scope of the inventions are to be determined by the broadest permissible interpretation of the following claims and their equivalents, and shall not be restricted or limited by the foregoing description.

What is claimed is:

1. A semiconductor device comprising:
   a substrate including an active region defined by a device isolation layer;
   a word line extending over the active region in a first direction;
   a plurality of interconnections extending over the word line in a second direction perpendicular to the first direction;
   a contact pad disposed between and spaced apart from the word line and the plurality of interconnections, the contact pad extending in the first direction to overlap the plurality of interconnections and the active region when viewed from a plan view;
   a lower contact plug electrically connecting the contact pad to the active region; and
   an upper contact plug electrically connecting the contact pad to one of the plurality of interconnections.

2. The semiconductor device of claim 1, wherein a length of the contact pad in the first direction is greater than a width of the active region in the first direction.

3. The semiconductor device of claim 1, wherein the upper contact plug is laterally spaced apart from the lower contact plug in the first direction.

4. The semiconductor device of claim 1, wherein a width of the contact pad in the second direction is greater than a width of the lower contact plug in the second direction.

5. The semiconductor device of claim 1, wherein each of the plurality of interconnections overlaps the device isolation layer when viewed from a plan view.

6. The semiconductor device of claim 1, wherein one of the plurality of interconnections overlaps an edge of the active region extending in the second direction when viewed from a plan view.

7. A semiconductor device comprising:
   a substrate including a cell array region and a peripheral circuit region;
   a cell array structure extending to a first height above the substrate over the cell array region;
   a peripheral logic structure extending to a second height smaller than the first height above the substrate over the peripheral circuit region;
   a plurality of parallel interconnections extending over the peripheral logic structure and the cell array structure;
   a contact pad disposed between a top surface of the peripheral logic structure and bottom surfaces of the plurality of interconnections, the contact pad overlapping with portions of the peripheral logic structure and portions of the plurality of interconnections when viewed from a plan view;
   a lower contact plug electrically connecting the peripheral logic structure to the contact pad; and
   an upper contact plug electrically connecting the contact pad to one of the plurality of interconnections,
   wherein the upper contact plug is laterally spaced apart from the lower contact plug in the first direction.

8. The semiconductor device of claim 7, wherein the cell array structure includes a plurality of stacked electrodes and a vertical structure penetrating the plurality of stacked electrodes.

9. The semiconductor device of claim 8, wherein a bottom surface of the contact pad is disposed between a height of a top surface of the vertical structure and a height of a top surface of the peripheral logic structure.

10. The semiconductor device of claim 8, wherein a top surface of the contact pad is coplanar with a top surface of the vertical structure.

11. The semiconductor device of claim 7, wherein the substrate includes a device isolation layer defining an active region in the peripheral circuit region, and
   wherein the peripheral circuit region comprises:
   a transistor gate signal line extending in a first direction over the active region; and
   a source region and a drain region formed in the active region on opposite sides of the word line,
   wherein the lower contact plug is connected to either the source region or the drain region.

12. The semiconductor device of claim 11, wherein the plurality of interconnections extends in a second direction perpendicular to the first direction,
   wherein the contact pad extends in the first direction, and
   wherein a length of the contact pad in the first direction is greater than a width of the active region in the first direction.

13. The semiconductor device of claim 11, wherein the plurality of interconnections overlaps the active region when viewed from a plan view.

14. The semiconductor device of claim 7, wherein the cell array structure comprises:
   a first stack structure including a plurality of first electrodes vertically stacked on the substrate;
   a second stack structure including a plurality of second electrodes vertically stacked on the first stack structure; and
   a vertical structure penetrating the first and second stack structures.

15. The semiconductor device of claim 14, further comprising:
   a plurality of first plugs disposed in a first contact region between the cell array region and the peripheral circuit region, the plurality of first plugs connected to the first electrodes and extending vertically away from the substrate; and
   a plurality of second plugs disposed in a second contact region between the cell array region and the first contact region, the plurality of second plugs connected to the second electrodes and extending vertically away from the substrate,
   wherein a vertical height of the contact pad is smaller than a vertical height of at least one of the plurality of second plugs and greater than a vertical height of at least one other of the plurality of second plugs.

16. The semiconductor device of claim 15, wherein a top surface of the contact pad is coplanar with top surfaces of the plurality of first plugs and top surfaces of the plurality of second plugs.

17. A semiconductor device comprising:
   a substrate having a top surface;
   a transistor structure formed on the substrate including source and drain regions on opposite sides of a transistor gate control signal line, the transistor gate control signal line extending in a first direction parallel to the top surface of the substrate;
   an insulating layer formed above the transistor structure;
   a first array of parallel contact pads formed above the insulating layer, each contact pad in the first array having a length in the first direction, a width in a second direction perpendicular to the first direction, and a height in a vertical direction perpendicular to the first and second directions, wherein the length is greater than the width and the height is greater than a vertical thickness of the transistor gate control signal line; and
   a lower contact plug electrically connecting one of the contact pads of the first array to the source region, the drain region or the transistor gate control signal line.

18. The semiconductor device of claim 17, wherein the transistor structure is formed in a first active region in the substrate defined by a device isolation layer, the first active region having a width in the first direction, and
   wherein the length of each of the contact pads in the first array is greater than the width of the first active region.

19. The semiconductor device of claim 18, further comprising:
   a second active region in the substrate spaced apart from the first active region in the first direction by a first distance; and
   a second array of parallel contact pads formed above the second active region, the second array being spaced apart from the first array in the first direction by a second distance that is less than the first distance and otherwise being the same as the first array.

* * * * *